US006872973B1

(12) United States Patent
Koyama et al.

(10) Patent No.: US 6,872,973 B1
(45) Date of Patent: Mar. 29, 2005

(54) ELECTRO-OPTICAL DEVICE

(75) Inventors: Jun Koyama, Kanagawa (JP);
Kazutaka Inukai, Kanagawa (JP);
Shunpei Yamazaki, Tokyo (JP); Mai Osada, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 513 days.

(21) Appl. No.: 09/692,753

(22) Filed: Oct. 19, 2000

(30) Foreign Application Priority Data

Oct. 21, 1999 (JP) .......................................... 11-299210
Nov. 29, 1999 (JP) .......................................... 11-336995

(51) Int. Cl.⁷ .............................................. H01L 29/04
(52) U.S. Cl. ......................... 257/59; 257/72; 257/291; 257/359; 257/258
(58) Field of Search ........................ 257/59, 72, 291, 257/258, 359; 345/103

(56) References Cited

U.S. PATENT DOCUMENTS

| 4,523,189 A | * | 6/1985 | Takahara et al. ............... 345/80 |
| 4,951,041 A | | 8/1990 | Inada et al. |
| 5,414,443 A | | 5/1995 | Kanatani et al. |
| 5,552,678 A | | 9/1996 | Tang et al. ............... 315/169.3 |
| 5,641,991 A | | 6/1997 | Sakoh ....................... 257/755 |
| 5,847,516 A | | 12/1998 | Kishita et al. ........... 315/169.3 |
| 5,882,761 A | | 3/1999 | Kawami et al. ............... 428/69 |
| 5,990,629 A | | 11/1999 | Yamada et al. .......... 315/169.3 |
| 6,064,158 A | | 5/2000 | Kishita et al. ........... 315/169.3 |
| 6,087,245 A | | 7/2000 | Yamazaki et al. .......... 438/486 |
| 6,121,943 A | | 9/2000 | Nishioka et al. ............... 345/76 |
| 6,151,006 A | | 11/2000 | Yanagi et al. |
| 6,380,689 B1 | | 4/2002 | Okuda |
| 6,452,341 B1 | | 9/2002 | Yamauchi et al. |
| 6,522,319 B1 | * | 2/2003 | Yamazaki .................... 345/103 |
| 6,529,178 B1 | * | 3/2003 | Kimura ........................ 345/76 |
| 2001/0054991 A1 | * | 12/2001 | Kimura et al. ................ 345/55 |
| 2002/0000613 A1 | * | 1/2002 | Ohtani et al. ............... 257/347 |

FOREIGN PATENT DOCUMENTS

| EP | 0694900 A2 | 1/1996 |
| EP | 0 704 912 | 4/1996 |
| EP | 776 147 A1 | 5/1997 |
| JP | 01-031197 | 2/1989 |
| JP | 8-078519 | 3/1996 |
| JP | 8-180972 | 7/1996 |
| JP | 09-054566 | 2/1997 |
| JP | 9-148066 | 6/1997 |
| JP | 10-041068 | 2/1998 |
| JP | 10-312173 | 11/1998 |
| TW | 278173 | 6/1996 |
| WO | WO-98-33165 | 7/1998 |

OTHER PUBLICATIONS

Zou, D. et al, "Spontaneous and Reverse–Bias Induced Recovery Behavior in Organic Electroluminescent Diodes," Applied Physics Letters, vol. 72, No. 19, pp. 2484–2486, May 11, (1998).

(Continued)

*Primary Examiner*—Minhloan Tran
*Assistant Examiner*—Tan Tran
(74) *Attorney, Agent, or Firm*—Cook, Alex, McFarron, Manzo, Cummings & Mehler, Ltd.

(57) ABSTRACT

An electro-optical device having a plurality of pixels including a plurality of EL elements, wherein the electro-optical device provides a gray scale display by controlling a period of time at which the plurality of the EL elements emit light in one frame period; the plurality of the EL elements have a first electrode and a second electrode; the first electrode is held at a constant potential; and a potential of the second electrode changes in such a manner that a polarity of an EL driving voltage, which is a difference between the potentials applied to the first and second electrodes, is inverted for each one frame period.

32 Claims, 21 Drawing Sheets

OTHER PUBLICATIONS

JP–10–041068 English Abstract.
JP–01–031197 English Abstract.
European Search Report re application No. EP 00 12 2880 dated May 27, 2002.
Van Slyke, S.A. et al, "Organic Electroluminescent Devices with Improved Stability," Appl. Phys. Lett., vol. 69, No. 15, pp. 2160–2162, Oct. 7, 1996.
English abstract of Japanese Patent Application No. JP 8–180972, published Jul. 12, 1996.
English abstract re Japanese Patent Application No. JP 10–214060, published Aug. 11, 1998.
English abstract re Japanese Patent Application No. JP 10–232649, published Sep. 2, 1998.

Full English translation re Japanese Patent Application No. JP 10–312173, published Nov. 24, 1998.
Zou, D. et al, "Improvement of Current–Voltage Characteristics in Organic Light Emitting Diodes by Application of Reversed–Bias Voltage," *Japanese Journal of Applied Physics*, vol. 37, part 2, No. 11B, pp. L–1406–L–1408, Nov. 15, 1998.
English abstract re Japanese Patent Application No. JP 8–078519, published Mar. 22, 1996.
English abstract re Japanese Patent Application No. JP 9–148066, published Jun. 6, 1997.

* cited by examiner

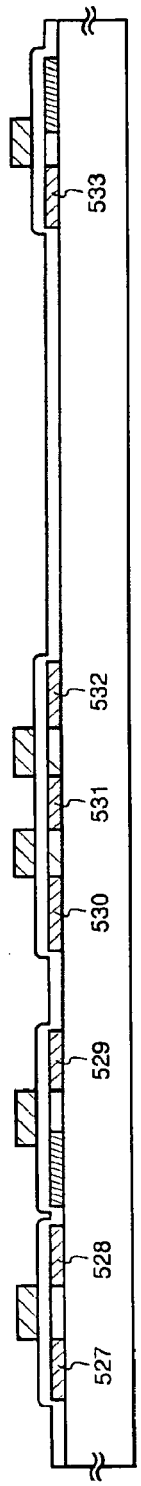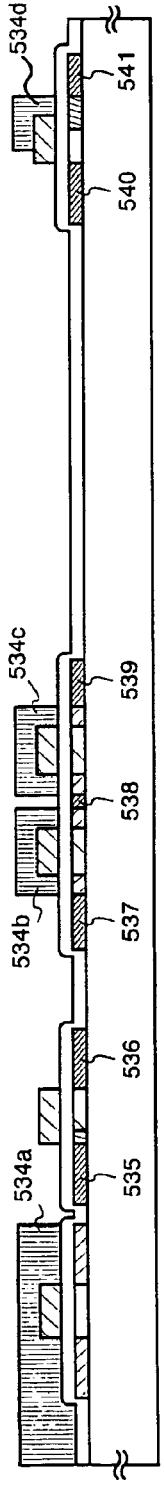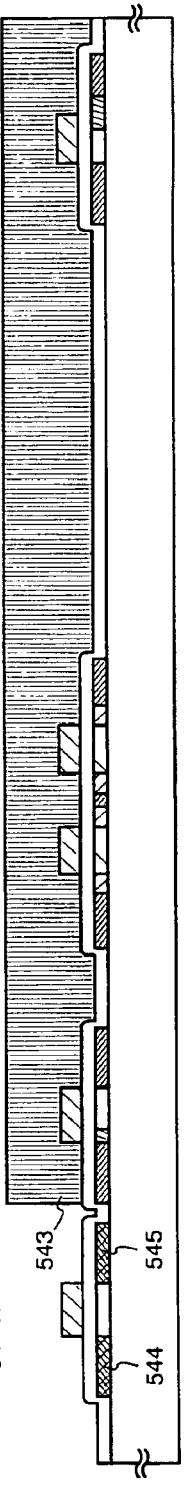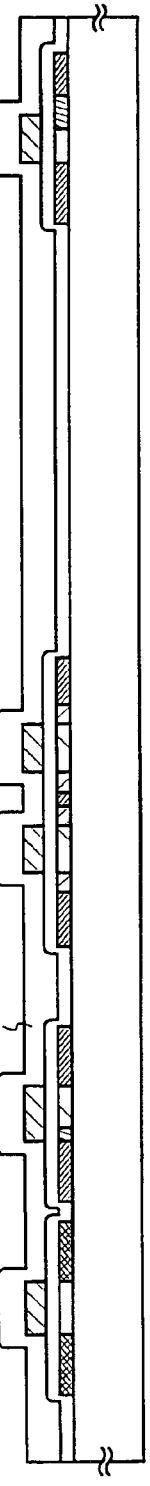

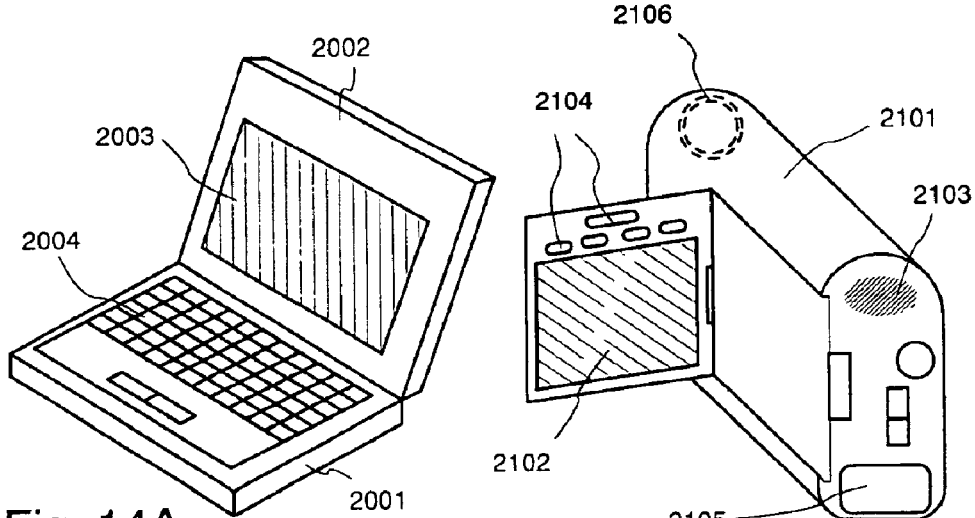
Fig. 14A
Fig. 14B
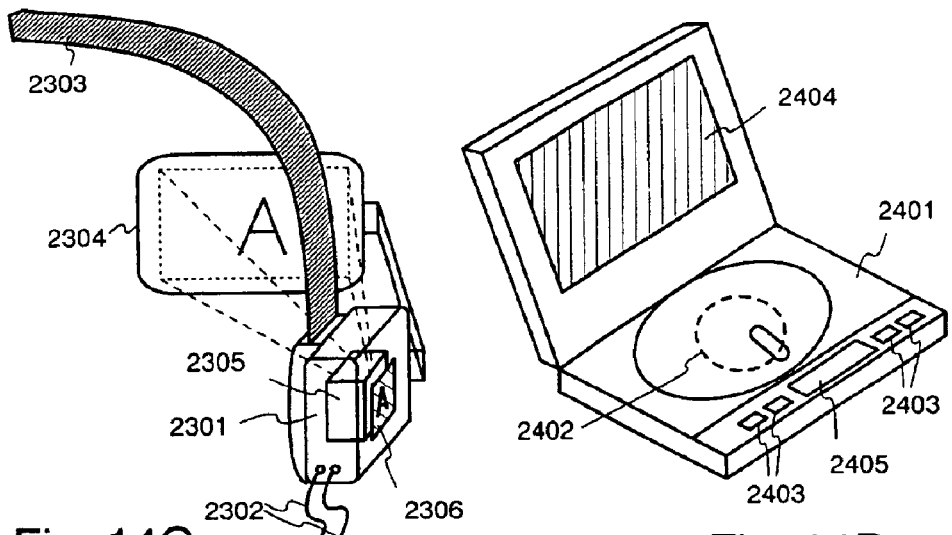
Fig. 14C
Fig. 14D
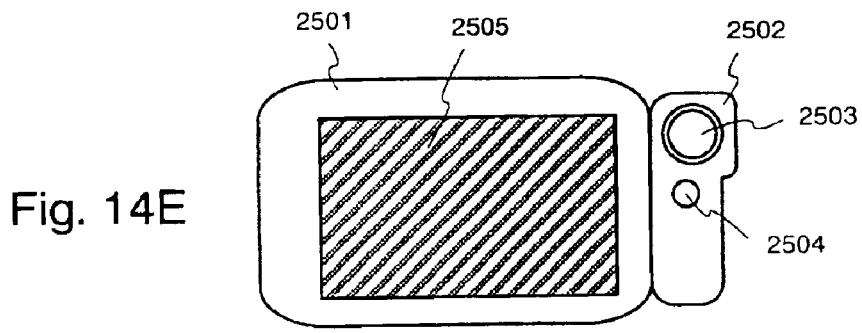
Fig. 14E

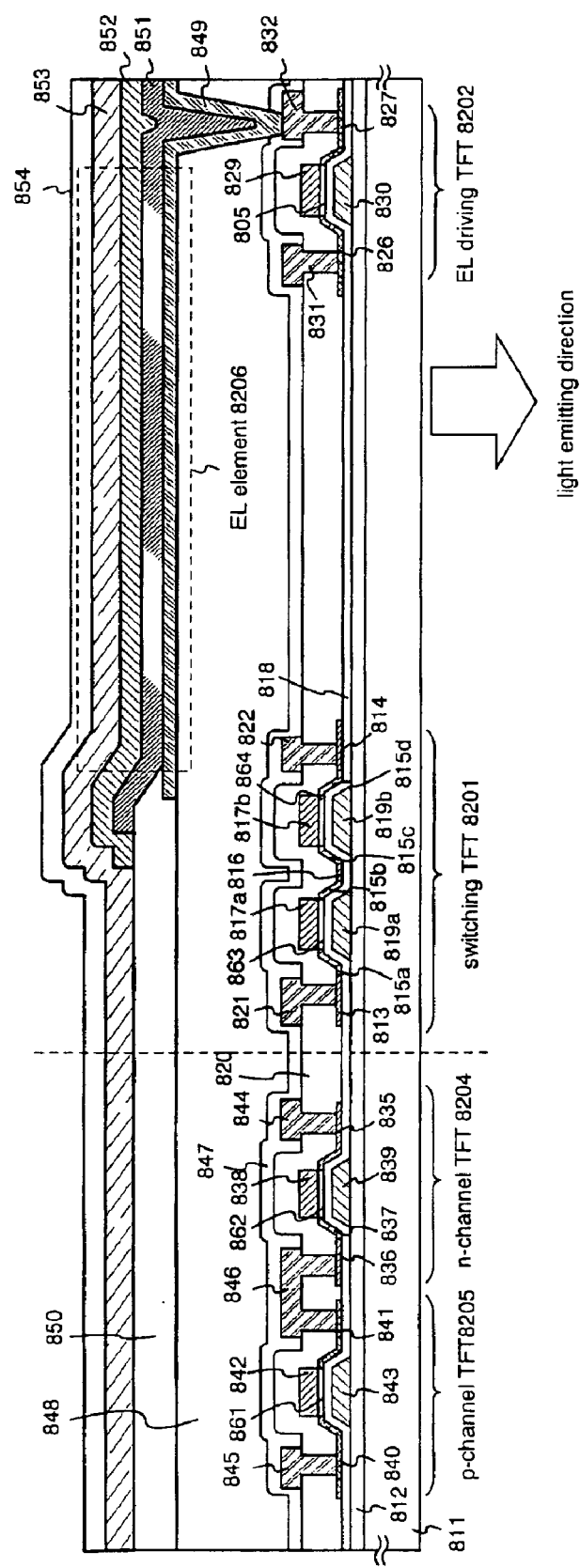

ELECTRO-OPTICAL DEVICE

BACKGROUND OF THE INVENTION

1. Field of the Invention

The present invention relates to an EL (electroluminescence) display (an electro-optical device) formed by preparing an EL element on a substrate. More particularly, the invention relates to an EL display using a semiconductor element (an element using a semiconductor thin film). Furthermore, the present invention relates to an electronic device in which the EL display is used in a display portion thereof.

2. Description of the Related Art

In recent years, technology for forming a TFT on a substrate has been largely improved, and an application development of the TFT to an active matrix-type display device has been carried out. In particular, the TFT using a polysilicon film has a higher electric field effect mobility than the TFT using a conventional amorphous silicon film thereby the TFT may be moved at a high speed. Therefore, the pixel control which has been conducted at a driver circuit outside of the substrate may be conducted at the driver circuit which is formed on the same substrate as the pixel.

Such an active matrix-type display device can, by preparing various circuits and elements on the same substrate, obtain various advantages such as a decrease in the manufacturing cost, a decrease in the size of the display device, an increase in the yield ratio, and a decrease in the throughput.

Further, research on the active matrix-type EL display having an EL element as a self-light-emitting device is becoming more and more active. The EL display is referred to as an organic EL display (OELD) or an organic light-emitting diode (OLED).

The EL display is a self-light-emitting type diode unlike a liquid crystal display device. The EL element is constituted in such a manner that an EL layer is sandwiched between a pair of electrodes. However, the EL layer normally has a lamination structure. Typically, the lamination structure of a "positive hole transport layer/a luminous layer/an electron transport layer" proposed by Tang et al. of the Eastman Kodak Company can be cited. This structure has a very high light-emitting efficiency, and this structure is adopted in almost all the EL displays which are currently subjected to research and development.

In addition, the structure may be such that on the pixel electrode, a positive hole injection layer/a positive hole transport layer/a luminous layer/an electron transport layer, or a positive hole injection layer/a positive hole transport layer/a luminous layer/an electron transport layer/an electron injection layer may be laminated in order. Phosphorescent dye or the like may be doped into the luminous layer.

In this specification, all the layers provided between the pair of electrodes are generally referred to as EL layers. Consequently, the positive hole injection layer, the positive hole transport layer, the luminous layer, the electron transport layer, the electron injection layer or the like are all included in the EL layers.

Then, a predetermined voltage is applied to the EL layer having the above structure from the pair of the electrodes, so that a recombination of carriers is generated in the luminous layer and light is emitted. Incidentally, in this specification, the fact that the EL element is emitted is described as the fact that the EL element is driven. Furthermore, in this specification, the anode, the light-emitting element formed of the EL layer and the cathode is referred to as an EL element.

A problem in the practical application of the EL display is the short life of the EL element resulting from the deterioration of the EL layer. As factors which affect the length of the life of the EL layer, the structure of a device which drives the EL display, the characteristic of the organic EL material which constitutes the EL layer, the material of the electrode, and the conditions in the manufacture process or the like can be cited.

Then, in addition to the factors described above, what is recently noted as a factor which affects the length of life of the EL layer is a method for driving the EL display.

Conventionally, in order to emit light from the EL element, a method for applying a direct current to two electrodes, an anode and a cathode sandwiching the EL element has been used. The conventional digital style time division gray scale display will be explained by referring to FIG. 16. Here, the case of providing a $2^n$ gray scale full color display with an n-bit digital drive system will be explained.

FIG. 15 shows a structure of the EL display pixel portion. A gate signal lines (G1 through Gn) to which a gate signal is inputted are connected to the gate electrode of the switching TFT 1501 incorporated in each of the pixels. Furthermore, one of the source region or the drain region of the switching TFT 1501 incorporated in each of the pixels is connected to source signal lines (which are referred to also as data signal lines) (S1 through Sn), while the other is connected to a gate electrode of the EL driving TFT 1504 incorporated in each of the pixels and a capacitor 1508 incorporated in each of the pixels, respectively.

One of the source region and the drain region of the EL driving TFT 1504 incorporated in each of the pixels is connected to the power source supply lines (V1 through Vn) while the other is connected to the EL element 1506. The potential of the power source supply lines (V1 through Vn) is referred to as the potential of the power source. Note that, the power source supply lines (V1 through Vn) is connected to a capacitor 1508 incorporated in each of the pixels. Note that, the digital data signal refers to a digital video signal.

The EL element 1506 comprises an anode and a cathode and an EL layer provided between the anode and the cathode. In the case where the anode is connected to the source region and the drain region of the EL driving TFT 1504, namely, in the case where the anode is the pixel electrode, the cathode which is the opposite electrode is held at a constant potential. On the contrary, in the case where the cathode is connected to the source region or the drain region of the EL driving TFT 1504, that is, in the case the cathode is the pixel electrode, the anode, which is an opposite electrode is held at a constant potential.

Furthermore, in this specification, the potential of the opposite electrode is referred to as a stationary potential. Note that, the power source for giving the stationary potential to the opposite electrode is referred to as a stationary power source. It is desirable that the potential of the anode is higher than the potential applied to the cathode. Therefore, the stationary potential changes in accordance with the fact that the opposite electrode is the anode or the cathode. For example, in the case where the opposite electrode is the anode, it is desirable that the stationary potential is set to be higher than the power source potential. On the contrary, in the case where the opposite electrode is the cathode, it is desirable that the stationary potential is set to be higher than the power source potential.

A difference in the potential between the stationary potential of the opposite electrode and the power source potential of the pixel electrode is the EL driving voltage, and this EL driving voltage is applied to the EL layer.

FIG. 16 shows a timing chart in a digital style driving with a direct current in the conventional EL display. In the beginning, one frame period is divided into n sub-frame periods (SF1 through SFn). Note that, a period in which all the pixels in the pixel portion display one image is referred to as one frame period (F). In a normal EL display, a frame period is provided in which the oscillation frequency is 60 Hz or more, that is, 60 or more frame period per one second is provided, so that 60 or more images are displayed in one second. When the number of images displayed in one second becomes 60 or less, flickering of images such as a flicker or the like becomes visually conspicuous. Note that, the period into which one frame period is further divided into a plurality of periods is referred to as a sub-frame period. With an increase in the number of gray scale levels, the division number of one frame period also increases, and the driver circuit must be driven at a high frequency.

One sub-frame period is divided into an address period (Ta) and a sustain period (Ts). The address period is time required for inputting data to all the pixels during one sub-frame period, while the sustain period (which is also referred to as a lighting period) is the period in which the EL element is lit.

The length of the address periods incorporated in each of the n sub-frame periods (SF1 through SFn) are the same. The sustain periods (Ts) incorporated in sub-frame periods SF1 through SFn respectively are set to Ts1 through Tsn, respectively.

The length of the sustain periods is set to be Ts1: Ts2: Ts3: . . . : Ts(n-1): Tsn=$2^0$: $2^{-1}$: $2^{-2}$: . . . $2^{-(n-2)}$: $2^{-n(-1)}$. However, the order in which the sustain periods SF1 through SFn are allowed to appear may be any. With the combination of this sustain periods, a desired gray scale display can be provided out of $2^n$ gray scale levels.

In the beginning, in the address period, the power source supply lines (V1 through Vn) can be held at the same height with the stationary potential. In this specification, the power source potential in the digital driving address period is referred to as an off power source potential. Note that, the height of the off power source potential should be on the same level with the stationary potential within the scope in which the EL element 1506 does not emit light. Note that, the EL driving voltage at this time is referred to as an off EL driving voltage. It is desired that the EL driving voltage at the OFF time is 0 V, but the voltage may be on the order of not allowing the EL element 1506 to emit light.

Then, the gate signal is inputted to the gate signal line G1, so that the switching TFTs 1501 having the gate electrode connected to the gate signal line G1, are all turned on.

Then, in the state in which the switching TFTs 1501 having the gate electrode connected to the gate signal line G1 is on, the digital data signal is inputted to the source signal lines (S1 through Sn) in order. The digital data signal have information of "0" or "1", and the digital data signal of "0" and "1" refers to a signal which has either Hi voltage or Lo voltage. Then, the digital data signal inputted to the source signal lines (S1 through Sn) is inputted to the gate electrode of the EL driving TFTs 1504 via the switching TFTs 1501 in the ON state. Furthermore, the digital data signal is inputted to the capacitor 1508 to be held.

Next, the gate signal is inputted to the gate signal line G2, and all the switching TFTs 1501 having the gate electrode connected to the gate signal line G2 are turned on. Then, in the state in which the switching TFT 1501 having the gate electrode connected to the gate signal line G2 is turned on, the digital data signal is inputted to the source signal lines (S1 through Sn) in order. The digital signal inputted to the source signal lines (S1 through Sn) is inputted to the gate electrode of the EL driving TFTs 1504 via the switching TFT 1501. Furthermore, the digital data signal is also inputted to the capacitor 1508 to be held.

The above operation is repeated, and the digital data signal is inputted to all the pixels. The period in which the digital data signal is inputted to all the pixels is an address period.

When the address period is completed, simultaneously the sustain period begins. When the sustain period begins, the potential of the power source supply lines (V1 through Vn) changes from the OFF power source potential to the ON power source potential. In this specification, in the case of the digital driving, the power source potential in the sustain period is referred to as the on power source potential. The difference in potential of the on power source potential and the stationary potential should be such that the EL element emits light. Note that this potential difference is referred to as on EL driving potential. The off power source potential and the on power source potential are generally referred to as the power source potential. Furthermore, the on EL driving voltage and off EL driving voltage are generally referred to as EL driving voltage.

In the sustain period, the switching TFTs 1501 are turned off. Then, the digital data signal held in the capacitor 1508 is inputted to the gate electrode of the EL driving TFTs 1504.

In the case where the digital data has information of "0", the EL driving TFT 1504 is turned off, so that the pixel electrode of the EL element 1506 is held at the off power potential. As a consequence, the EL element 1506 incorporated in the pixel to which digital data signal having information of "0" is applied, does not emit light.

On the other hand, in the case where the digital data has information of "1", the EL driving TFT 1504 is turned on, so that the pixel electrode of the EL element 1506 becomes the on power source potential. As a consequence, the EL element 1506 incorporated in the pixel to which digital data signal having information of "1" is applied, emits light.

The period in which all the switching TFTs 1501 are turned off is the sustain period.

The EL element emits light in any of the periods Ts1 through Tsn. In the period of Tsn, a predetermined EL element is allowed to emit light (a predetermined pixel is lit).

Next, the address period appears again. After the digital data signal is inputted to all the pixels, the sustain period appears. At this time, any of the sustain periods Ts1 through Tsn(n-1) appears. Here, Ts(n-1) appears, and a predetermined pixel is allowed to be lit in the Ts(n-1) period.

Thereafter, the similar operation in the remaining n-2 sub-frames is repeated, and the sustain periods Ts(n-2), Ts(n-3). . Ts1 appear one after another, and the predetermined pixel is allowed to be lit in the sub-frame.

When n sub-frame periods appear, one frame period is completed. At this time, the gray scale level of the pixel can be determined by summing up the sustain period in which the pixel is lit in one frame period, namely the length of the sustain period immediately after the address period in which the digital data signal having the information of "1" is applied to the pixel.

For example, in case of n=8, when the luminance of the pixel which emits light in all the sustain periods is set to 100%, the luminance of 75% can be represented in the case where the pixel emits light in Ts1 and Ts2. In the case where Ts3, Ts5 and Ts8 are selected, the luminance of 16% can be represented.

In this manner, the conventional EL display is driven with direct current, and the EL driving voltage applied to the EL layer always has the same polarity.

However, as has been introduced in "TSUTSUI. T, Jpn. J. Appl. Phys. Part 2 VOL. 37, NO. 11B, p. L1406–L1408, 1998", it has been found that the deterioration of the current-voltage characteristic of the EL element has been improved by applying the EL driving voltage having the opposite polarity to the EL element for each period.

However, no concrete proposal has been made with respect to a method for driving an EL display which utilizes the fact that the deterioration of the current-voltage characteristic of the EL element is improved by applying an EL driving voltage having the opposite polarity to the EL element for each period, and with respect to the EL display using the driving method.

Then, in order to prolong the life of the EL element, a proposal on the method for driving the EL display for providing a display (hereinafter referred to as an alternate current driving in this specification) by applying the EL driving voltage having the opposite polarity to the EL element for each of the definite period, and manufacture of the EL display using the driving method has been expected. In particular, manufacture of an active matrix-type EL display for providing a display with the alternate current drive has been expected.

SUMMARY OF THE INVENTION

The present invention holds a first electrode incorporated in the EL element at a constant potential (stationary potential) and holds the second polarity at a potential (a power source potential) of the power source supply line in the driving of the EL display. Then, for each of the definite periods, the stationary voltage is fixed and the height of the power source potential is changed so that the polarity of the EL driving voltage, which is a difference between the stationary potential and the power source potential becomes opposite. For example, when stationary potential is set to $V_T$, the power source potential is set to $V_D$, and the EL driving voltage is set to $V_T-V_D=\Delta V$ in a certain period, the stationary potential is set to $V_T$, the power source potential is set to $V_D'$ and EL driving voltage is set to $V_T-V_D'=-\Delta V$ In the case of the time division gray scale display by the digital style driver circuit, the polarity of the EL driving voltage may be changed to the opposite for each frame period while the polarity of the EL driving voltage may be changed to the opposite for each sub-frame period.

In the case of the analog style driver circuit, the EL driving voltage is changed to the opposite polarity for each frame period.

Note that, because the EL element is a diode in the case where the EL element emits light by the application of the EL driving voltage having a certain polarity, the EL element does not emit light by the application of the EL driving voltage having the opposite polarity.

With such a structure, the EL driving voltage having the opposite polarity is applied to the EL element for each definite period. Consequently, the deterioration of the current-voltage characteristic of the EL element is improved, so that the life of the EL element may be prolonged as compared with the conventional driving method.

Furthermore, as has been described above, flickering is generated as a flicker to the eyes of observers in the case where the image is displayed for each one frame period.

As a consequence, it is preferable in the present invention that the EL display is driven with the alternate current at a frequency which is two times larger than the frequency at which no flickering is generated to the eyes of observers in the direct current driving. In other words, it is preferable that 120 or more frame periods are provided in one second, and 60 or more images are displayed. In the above structure, flickering by the alternate current is prevented.

Furthermore, the alternate current driving of the present invention may be applied not only to the active matrix-type EL display device but also to a passive-type EL display device.

A structure of the present invention will be shown hereinbelow.

According to the present invention, there is provided an electro-optical device having a plurality of pixels including a plurality of EL elements, characterized in that:

the electro-optical device provides a gray scale display by controlling a period of time at which the plurality of the EL elements emit light in one frame period, the plurality of the EL elements have a first electrode and a second EL element, the first electrode is held at a constant potential, and a potential of a second electrode changes in such a manner that a polarity of an EL driving voltage, which is a difference between the potentials applied to the first and second electrodes, is inverted for each one frame period.

According to the present invention, there is provided an electro-optical device having a plurality of pixels including a plurality of EL elements characterized in that:

the electro-optical device provides a gray scale display by controlling a sum of lengths of sub-frame periods in which the plurality of the EL elements emit light out of the plurality of the sub-frame periods included in one frame period, the plurality of the EL elements have a first electrode and a second electrode, the first electrode is held at a constant potential, and a potential of a second electrode changes in such a manner that a polarity of an EL driving voltage, which is a difference between the potentials applied to the first and second electrodes, is inverted for each one sub-frame period.

According to the present invention, there is provided an electro-optical device having a plurality of pixels, the device including a plurality of EL elements, a plurality of EL driving TFTs for controlling light emission of the plurality of the EL elements, a plurality of switching TFTs for controlling driving of the plurality of the EL driving TFTs, characterized in that:

the electro-optical device provides a gray scale display by controlling a period of time at which the plurality of the EL elements emit light in one frame period, the plurality of the EL elements have a first electrode and a second EL element, the first electrode is held at a constant potential, and a potential of a second electrode changes in such a manner that a polarity of an EL driving voltage, which is a difference between the potentials applied to the first and second electrodes, is inverted for each one frame period.

According to the present invention, there is provided an electro-optical device having a plurality of pixels, the device including a plurality of EL elements, a plurality of EL driving TFTs for controlling light emission of the plurality of the EL elements, a plurality of switching TFTs for controlling the driving of the plurality of the EL driving TFTs;

characterized in that:

the electro-optical device provides a gray scale display by controlling a sum of lengths of sub-frame periods in which the plurality of the EL elements emit light out of the plurality of the sub-frame periods included in one frame period, the plurality of the EL elements have a first electrode and a second electrode, the first electrode is held at a constant potential, and a potential of a second electrode changes in such a manner that a polarity of an EL driving voltage, which is a difference between the potentials applied to the first and second electrodes, is inverted for each frame period.

According to the present invention, there is provided an electro-optical device having a plurality of pixels including a plurality of EL elements, characterized in that:

the electro-optical device provides a gray scale display by controlling a period of time at which the plurality of the EL elements emit light in one frame period, the plurality of the EL elements have a first electrode and a second EL element, the first electrode is held at a constant potential, a potential of a second electrode changes in such a manner that a polarity of an EL driving voltage, which is a difference between the potentials applied to the first and second electrodes, is inverted for each one frame period, and adjacent pixels out of the plurality of the pixels share a power source supply line for supplying a voltage applied to the second electrode.

According to the present invention, there is provided an electro-optical device having a plurality of pixels including a plurality of EL elements, characterized in that:

the electro-optical device provides a gray scale display by controlling a sum of lengths of sub-frame periods in which the plurality of the EL elements emit light out of the plurality of the sub-frame periods included in one frame period, the plurality of the EL elements have a first electrode and a second electrode, the first electrode is held at a constant potential, a potential of a second electrode changes in such a manner that a polarity of an EL driving voltage, which is a difference between the potentials applied to the first and second electrodes, is inverted for each frame period, and adjacent pixels out of the plurality of the pixels share a power source supply line for supplying a voltage applied to the second electrode.

According to the present invention, there is provided an electro-optical device having a plurality of pixels, the device including a plurality of EL elements, a plurality of EL driving TFTs for controlling light emission of the plurality of the EL elements, a plurality of switching TFTs for controlling driving of the plurality of the EL driving TFTs;

characterized in that:

the electro-optical device provides a gray scale display by controlling a period of time at which the plurality of the EL elements emit light in one frame period, the plurality of the EL elements have a first electrode and a second EL element, the first electrode is held at a constant potential, a potential of a second electrode changes in such a manner that a polarity of an EL driving voltage, which is a difference between the potentials applied to the first and second electrodes, is inverted for each one frame period, and a power source supply line for supplying a voltage applied to the second electrode is shared among adjacent pixels out of the plurality of the pixels.

According to the present invention, there is provided an electro-optical device having a plurality of pixels, the device including a plurality of EL elements, a plurality of EL driving TFTs for controlling light emission of the plurality of the EL elements, a plurality of switching TFTs for controlling driving of the plurality of the EL driving TFTs;

characterized in that:

the electro-optical device provides a gray scale display by controlling a sum of lengths of sub-frame periods in which the plurality of the EL elements emit light out of the plurality of the sub-frame periods included in one frame period, the plurality of the EL elements have a first electrode and a second electrode, the first electrode is held at a constant potential;

a potential of a second electrode changes in such a manner that a polarity of an EL driving voltage, which is a difference between the potentials applied to the first and second electrodes, is inverted for each sub-frame period, and the adjacent pixels out of the plurality of the pixels share a power source supply line for supplying a voltage applied to the second electrode.

The EL driving TFTs and the switching TFTs comprise an n-type channel TFT or a p-type channel TFT.

The light emission of the plurality of the EL elements may be controlled with a digital data signal inputted to the switching TFTs.

One frame period may be $1/120$ s or less.

According to the present invention, there is provided an electro-optical device having a plurality of pixels, the device comprising:

a plurality of EL elements;

a plurality of EL driving TFTs for controlling the light emission of the plurality of EL elements; and a plurality of switching TFTs for controlling driving of the plurality of EL driving TFTs; characterized in that:

the electro-optical device provides a gray scale display by inputting an analog video signal to a source region of the switching TFT, the plurality of EL elements have a first electrode and a second electrode, the first electrode is held at a constant potential, and the second electrode is held at a voltage having an opposite polarity by referencing a voltage applied to the first electrode for each one frame period.

According to the present invention, there is provided an electro-optical device having a plurality of pixels, the device comprising:

a plurality of EL elements;

a plurality of EL driving TFTs for controlling light emission of the plurality of EL elements; and a plurality of switching TFTs for controlling the driving of the plurality of EL driving TFTs; characterized in that:

the electro-optical device provides a gray scale display by inputting an analog video signal to a source region of the switching TFT, the plurality of EL elements have a first electrode and a second electrode, the first electrode is held at a constant potential, the second electrode is held at a voltage having an opposite polarity by referencing a voltage applied to the first electrode for each one frame period, and the adjacent pixels out of the plurality of the pixels share a power source supply line for supplying a voltage applied to the second electrode.

The EL driving TFT and the switching TFT comprise an n-type channel TFT or a p-type channel TFT.

The one frame period may be $1/120$ s or less.

The EL layer which the plurality of EL elements have may include a low molecular organic material or a polymer organic material.

The low molecular organic material may include $Alq_3$ (tris-8-quinonolite-aluminum) or TPD (triphenylamine derivative)

The polymer organic material may include PPV (polyphenyleine vynyleine), PVK (polyvinyl-caracole) or polycarbonate.

There is provided a computer characterized in that the electro-optical device is used.

There is provided a video camera characterized in that the electro-optical device is used.

There is provided a DVD player characterized in that the electro-optical device is used.

BRIEF DESCRIPTION OF THE DRAWINGS

In the accompanying drawings:

FIGS. 10A to 10D are views showing the process of manufacturing the EL display;

FIGS. 14A and 14E are views showing concrete examples of an electric appliance;

FIG. 21 is a view showing a sectional structure of the EL display according to the present invention.

DETAILED DESCRIPTION OF THE PREFERRED EMBODIMENTS

Figure 1:
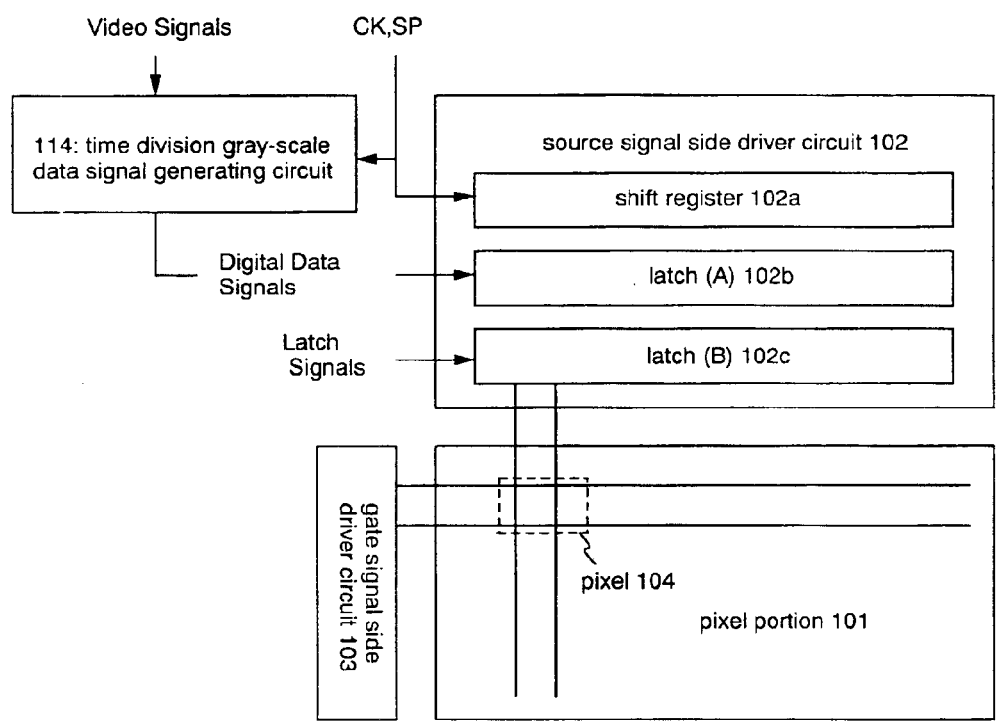
FIG. 1 is a view showing a structure of an EL display according to the present invention.

A structure of the present invention will be explained by using an example of an EL display for providing a digital driving style time division gray-scale display. FIG. 1 shows an example of a circuit structure according to the present invention.

The EL display of FIG. 1 has a pixel portion 101 formed of a TFT on a substrate, a source signal side driver circuit 102 arranged in the periphery of the pixel portion 101, and a gate signal side driver circuit 103. Note that, in the embodiment, the EL display has the source signal side driver circuit and the gate signal side driver circuit, respectively. However, in the present invention, the source signal side driver circuit may be two. Furthermore, the gate signal side driver circuit may be two as well.

The source signal side driver circuit 102 basically includes a shift register 102a, a latch (A) 102b, and a latch (B) 102c. Furthermore, a clock signal (CK) and a start pulse (SP) are inputted to the shift register 102a. Digital data signals are inputted to the latch (A) 102b. Latch signals are inputted to the latch (B) 102c.

Furthermore, though not shown, the gate signal side driver circuit 103 has a shift register and a buffer. A multiplexer may be provided on the output side of the buffer.

The digital data signal inputted to the pixel portion 101 is formed at the time division gray-scale data signal generating circuit 114. In this circuit, a video signal (signal including image information) comprising an analog signal and a digital data signal is converted into a digital data signal for providing a time division gray-scale display, and at the same time, is a circuit for generating a timing pulse or the like required for providing a time division gray-scale display.

Typically, the time division gray-scale data signal generating circuit 114 includes means for dividing one frame period into a plurality of sub-frame periods corresponding to a grayscale of n (n is an integer of 2 or more) bits, means for selecting an address period and a sustain period in a plurality of the sub-frame periods, and means for setting the length of the sustain periods to Ts1: Ts2: Ts3: . . . : Ts(n−1): Ts(n)=$2^0$: $2^{-1}$: $2^{-2}$: . . . : $2^{-(n-2)}$: $2_{-(n-1)}$.

At this time, the time division gray scale data signal generating circuit 114 may be provided on the outside portion of the EL display according to the present invention. In such a case, the circuit is constituted in such a manner that a digital data signal formed there is inputted to the EL display according to the present invention. In this case, an electronic device (an EL display device) having an EL display according to the present invention as a display includes an EL display of the present invention and a time division gray scale data signal generating circuit as a separate component.

Furthermore, the time division gray scale data signal generating circuit 114 may be packaged on the EL display according to the present invention in the form of an IC chip or the like. In such a case, the circuit may be constituted in such a manner that the digital data signal formed on the IC chip is inputted to the EL display according to the present invention. In this case, the electronic device having the EL display as a display in the present invention includes the EL display packaging the IC chip including the time division gray scale data signal generating circuit as a component.

Furthermore, finally, the time division gray scale data signal generating circuit 114 can be formed of TFTs on the same substrate with the pixel portion 101, the source signal side driver circuit 102, and the gate signal side driver circuit 103. In this case, when the video signal including the image information is inputted to the EL display, the video signal can be processed all on the substrate. In this case, the time division gray scale data signal generating circuit may be formed of the TFTs in which a polysilicon film serves as an active layer. Furthermore, in this case, the electronic device having the EL display as a display is such that the time division gray scale data signal generating circuit is incorporated in the EL display itself thereby making it possible to attempt miniaturization of the electronic device.

Figure 2A:
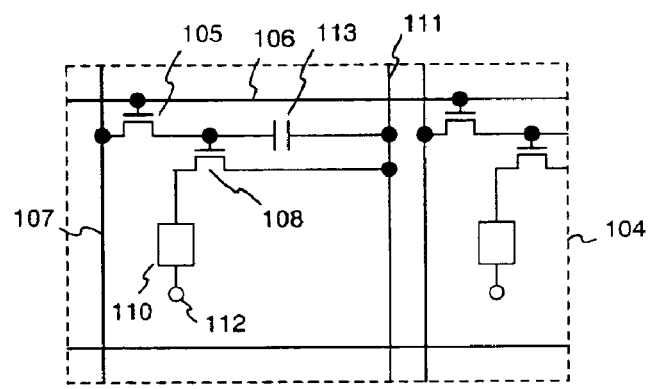
FIGS. 2A and 2B are circuit diagrams showing pixel portions according to the present invention.

On the pixel portion 101, a plurality of pixels 104 are arranged in a matrix-like configuration. FIG. 2A shows an enlarged view of the pixel 104. In FIG. 2A, reference numeral 105 denotes a switching TFT. The gate electrode of the switching TFT 105 is connected to the gate signal line 106 for inputting the gate signal. The source region and the drain region of the switching TFT 105 is constituted in such a manner that one of the source region or the drain region is connected to the source signal lines 107 for inputting the digital data signal while the other is connected to a capacitor 113 which the gate electrode of the EL driving TFT 108 and each of the pixels have respectively.

In addition, one of the source region and the drain region of the EL driving TFTs 108 is connected to the power source supply line 111 while the other is connected to the EL element 110. The power source supply line 111 is connected to the capacitor 113. When the switching TFT 105 is in the non-selection mode (off-state), the capacitor 113 is provided to hold the gate voltage of the EL driving TFT 108.

The EL element 110 comprises an anode and a cathode and an EL layer provided between the anode and the cathode. In the case where the anode is connected to the source region or the drain region of the EL driving TFTs 110, where the anode is a pixel electrode, the cathode is an opposite electrode. On the contrary, in the case where the cathode is connected to the source region or the drain region of the EL driving TFTs 110, namely in the case where the cathode is the pixel electrode, the anode is the opposite electrode.

The power source supply lines 111 are connected to the potential of the power source. In this embodiment, the power source potential is always held at a constant potential.

Note that, a resistor may be provided between the source region or the drain region of the EL driving TFTs 108 and the EL element 110. By providing the resistor, a current quantity supplied from the EL driving TFT to the EL element is controlled thereby preventing the influence of the disparity of the driving TFT 108 characteristic. Since the resistor may be an element showing a sufficiently larger resistance value than the resistance value of the on resistance of the EL driving TFTs, the structure or the like is not restricted in any way. Note that, the resistance of the on resistor is a value obtained by dividing the drain voltage of the TFTs by the drain current flowing at that time when the TFTs are turned on. The resistance value of the resistor may be selected from the scope of 1 k$\Omega$ to 50 M$\Omega$, (preferably, 10 k$\Omega$ to 10 M$\Omega$ and more preferably the scope of 50 k$\Omega$ to 1 M$\Omega$). Using a semiconductor layer having a high resistance value as a resistor facilitates the formation of the resistor, so that the usage of such semiconductor layer is preferable.

Next, there will be explained the driving with the alternate current of the present invention by referring to FIG. 2B and FIG. 3. Here, there will be explained a case in which $2^n$ gray scale full color time division gray scale display is provided by the n-bit digital driving style.

Figure 2B:
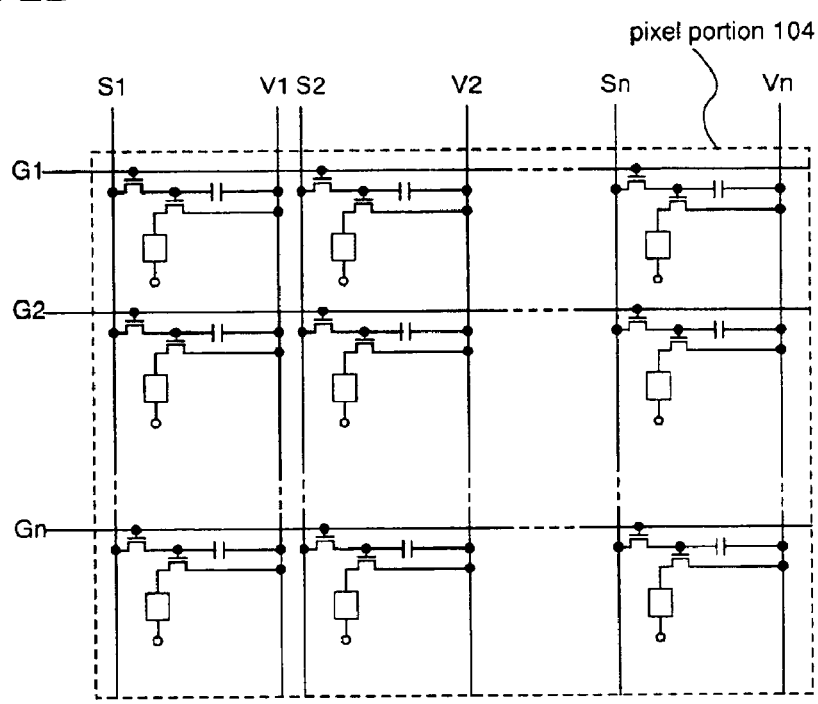

FIG. 2B shows a structure of a pixel portion in an EL display according to the present invention. The gate signal lines (G1 through Gn) are connected to the gate electrode of the switching TFT incorporated in each of the pixels. One of the source region or the drain region of the switching TFTs incorporated in each of the pixels is connected to the source signal lines (S1 through Sn) while the other is connected to the gate electrode of the EL driving TFTs and the capacitor. Furthermore, one of the source region and the drain region of the EL driving TFTs is connected to the power source supply lines (V1 through Vn) while the other is connected to the EL element incorporated in each of the pixels. The power source supply lines (V1 through Vn) are also connected to the capacitor incorporated in each of the pixels.

Figure 3:
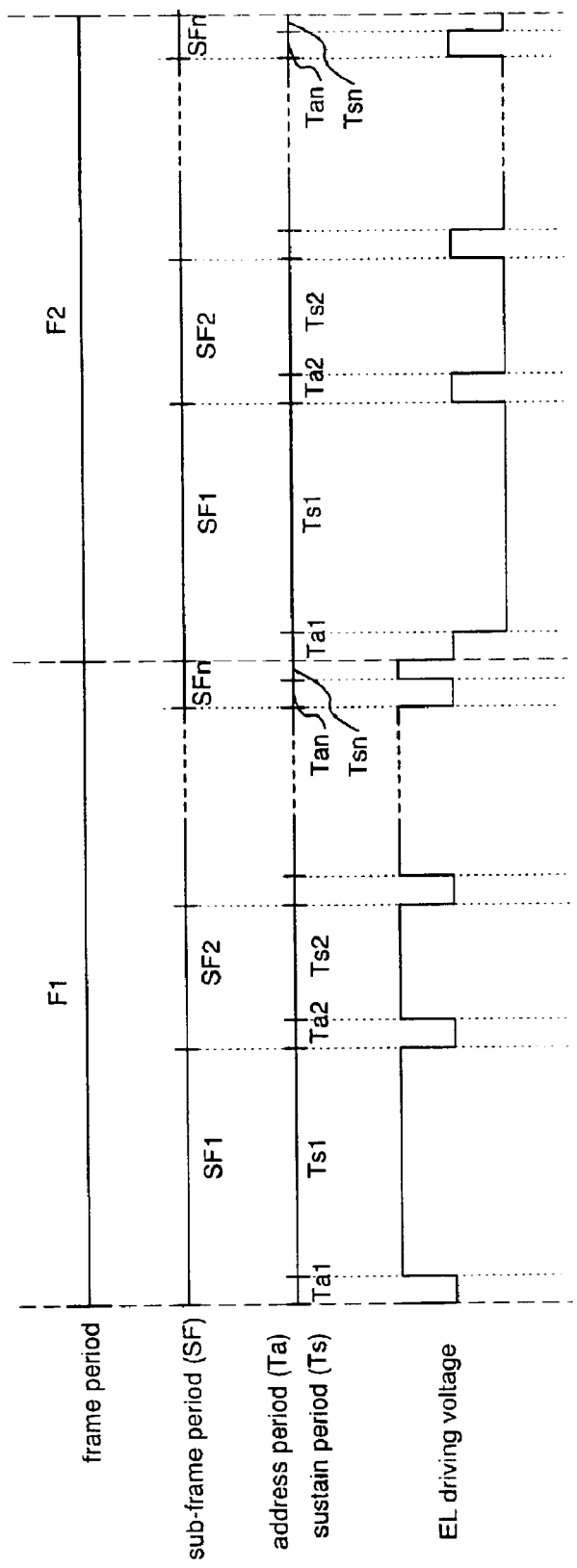
FIG. 3 is a timing chart showing a digital style driving with the alternate current according to the present invention.

FIG. 3 shows a timing chart in the EL display shown in FIG. 2A. In the beginning, one a frame period (F) is divided into n sub-frame periods (SF1 through SFn). Note that, the period in which all the pixels in the pixel portion display one image is referred to as one frame period. In the EL display according to the present invention, it is preferable that 120 or more frame periods are provided in one second, so that 60 or more images are displayed in one second in the end.

When the number of images displayed in one second becomes 120 or less, flickering of images such as a flicker or the like becomes visually conspicuous.

Note that, a plurality of periods into which one frame period is further divided are referred to as sub-frame periods. With an increase in the number of gray scale levels the divided number of one frame period increases, and the driver circuit must be driven at a high frequency.

One sub-frame period is divided into an address period (Ta) and a sustain period (Ts). The address period refers to time required for inputting data to all the pixels while the sustain period (also referred to as lighting period) refers to a period in which a display is provided.

The length of the address periods (Ta1 through Tan) incorporated in n sub-frame periods (SF1 through SFn) respectively are all the same. The sustain period (Ts) incorporated in the sub-frame periods SF1 through SFn respectively are set to Ts1 through Tsn respectively.

The length of the sustain period is set to be Ts1: Ts2: Ts3: . . . : Ts(n-1): Tsn=$2^0$: $2^{-1}$: $2^{-2}$: . . . : $2^{-(n-2)}$: $2^{-(n-1)}$.

However, the order in which SF1 through SFn are allowed to appear may be any. With the combination of these sustain periods, a desired gray scale display can be provided out of $2^n$ gray scale levels.

In the beginning, in the address period, the opposite electrode is held at the stationary potential of the same height as the power source potential. In this specification, the stationary potential in the address period of the digital driving is referred to as an off stationary potential. Note that, the height of the off stationary potential may be the same as the height of the power source potential within the scope in which the EL element does not emit light. Note that, the EL driving voltage at this time is referred to as the off EL driving voltage. Ideally, it is desired that the off EL driving voltage is 0 V, but the voltage may be on the level on which the EL element does not emit light.

Then, the gate signal is inputted to the gate signal line G1, and all the switching TFTs having the gate electrode connected to the gate signal line GI are turned on.

In the state in which the switching TFTs having the gate electrode connected to the gate signal line G1 are turned on, the digital data signals are inputted to all the source signal lines (S1 through Sn) at the same time. The digital data signal has information of either "0" or "1". The digital data signals of "0" and "1" refer to a signal having a voltage of either Hi or Lo. Then, the digital data signal inputted to the source signal lines (S1 through Sn) is inputted to the gate electrode of the EL driving TFT via the switching TFTs in the on state. Furthermore, the digital data signal is inputted to the capacitor as well and is held.

Next, the gate signal is inputted to the gate signal line G2, and there arises a state in which all the switching TFTs having the gate electrode connected to the gate signal line G2 are turned on. Then in the state in which the switching TFTs having the gate electrode connected to the gate signal lines G2 are turned on, the digital data signals are inputted to all the source signal lines (S1 through Sn) at the same time. The digital data signals inputted to the source signal lines (S1 through Sn) are inputted to the gate electrode of the EL driving TFT via the switching TFT. Besides, the digital data signal is also inputted to the capacitor and is held.

The above operation is repeated and the digital data signals are inputted to all the pixels. The period until the digital data signals are inputted to all the pixels is an address period.

At the same time as when the address period is completed, the sustain period begins. When the sustain period begins, the potential of the opposite electrode changes from the off stationary potential to the on stationary potential. In this specification, the stationary potential in the digital driving sustain period is referred to as an on stationary potential. The on stationary potential may have a potential difference with the power source potential to a degree to which the EL element emits light. Note that, this potential difference is referred to as an on EL driving voltage.

Then, the switching TFTs are turned off, and the digital data signal held in the capacitor is inputted to the gate electrode of the EL driving TFTs.

In the form of embodiments, in the case where the digital data signal has information of "0", the EL driving TFTs are turned off, and the pixel electrode of the EL element is held at the off stationary potential. As a consequence, the EL element incorporated in the pixel to which the digital data signal having information of "0" is applied does not emit light.

On the contrary, in the case where the digital data signal has information of "1", the EL driving TFTs are turned on, so that a power source potential is given to the pixel electrode of the EL element. As a consequence, the EL element incorporated in the pixel to which the digital data signal having information of "1" is applied emits light.

The period in which all the switching TFTs are in the off state is a sustain period.

The period in which the EL element is allowed to emit light (the pixel is lit) is any of the periods Ts1 through Tsn. Here, suppose that a predetermined pixel is lit in a period of Tsn.

Next, the address period appears again, and the sustain period appears when the data signal is inputted to all the pixels. At this time, any of the sustain periods Ts1 through Ts(n-1) appears. Here, suppose that a predetermined pixel is allowed to be lit in the period of Ts(n-1).

Hereinbelow, suppose that a similar operation is repeated with respect to the remaining n-2 sub-frames, so that the sustain periods Ts(n-2), Ts(n-3) . . . Ts1 are set, and a predetermined pixel is lit in respective sub-frames.

When n sub-frame periods appear, one frame period is completed. At this time, the sustain period in which the pixel is lit in one frame period, namely the length of the sustain period immediately after the address period in which the digital data signal having, information of "1" is applied to the pixel is summed, so that the gray scale level of the pixel is determined. For example, suppose that the luminance is set to 100% in the case where the pixel emits light in all the sustain period in case of n=8, the luminance of 75% can be represented in the case where the pixel emits light in Ts1 and Ts2. In the case where Ts3, Ts5 and Ts8 are selected, the luminance of 16% can be represented.

When one frame period is completed, the height of the on stationary potential is changed so that the polarity of the on EL driving voltage which is a difference in the power source voltage and the on stationary voltage becomes opposite to each other in the next frame period. Then, in the same manner as the previous frame period, the operation is conducted. However, the on EL driving voltage in the frame period has a polarity opposite to the o'n EL driving voltage in the previous frame period, so that the all the EL elements do not emit light. In this specification, the frame period in which the EL element displays the image is referred to as the display frame period. Besides, on the contrary, the frame period in which all the EL elements do not emit light and the image is not displayed is referred to as the non-display frame period.

When the non-display frame period is completed, another display frame period begins next. Then, the on EL driving voltage changes to a voltage having a polarity opposite to the on EL driving voltage in the non-display frame period.

In this manner, the image is displayed by alternately repeating the display frame period and the non-display frame period. The present invention has the above structure, so that the EL driving voltage having the opposite polarity is applied to the EL layer incorporated in the EL element for each one definite period. Thus, the deterioration of the current-voltage characteristic of the EL element is improved with the result that the life of the EL element can be prolonged as compared with the conventional driving method.

Furthermore, as described above, in the case where the image is displayed for each one frame period in the alternate current driving, flickering is generated as a flicker to the eyes of observers.

Therefore, according to the present invention, the EL display is driven with the alternate current at a frequency which is twice as large as the frequency at which no flickering is generated to the eyes of observers in the driving with the direct current. In other words, 120 or more frame periods are provided in one second. Then, as a consequence, 60 or more images are displayed in one second. With this structure, flickering resulting from the driving with the alternate current is prevented.

Note that, in the method for driving the EL display shown in this embodiment, the power source potential is held at the constant level, and the opposite potential is changed in the address period and in the sustain period with the result that the size of the EL driving voltage is changed, and the light emission of the EL element is controlled. However, the present invention is not restricted to this structure. The EL display of the present invention may be such that the opposite potential is held on a constant level at all times, and the potential of the pixel electrode may be changed. In other words, contrary to the case of the embodiments, the potential of the opposite electrode is held on the same level at all times, and the power source potential is changed in the address period and in the sustain period thereby changing the size of the EL driving voltage, so that the light emission of the EL element may be controlled.

Furthermore, in this embodiment, since the potential of the opposite electrode and the power source potential are held at the same potential in the address period, the EL element does not emit light. However, the present invention is not restricted to this structure. The display can be provided in the address period in the same manner as in the display period by providing at all times between the opposite electrode and the power source potential the potential difference on a degree to which the EL element emits light. However, in this case, since the whole sub-frame periods become a period in which the EL elements emit light, the length of the sub-frame periods is set to be SF1: SF2: SF3: . . . : SF(n−1): Sfn=$2^0$: $2^{-1}$: $2^{-2}$: . . . : $2^{-(n-2)}$: $2^{-(n-1)}$. With the above structure, as compared with the driving method which does not allow light emission in the address period, an image with a high luminance can be obtained.

Next, there will be explained a method for driving the EL display shown in FIGS. 1 to 2B according to the present invention with the alternate current in an analog style. Note that, FIG. 4 will be referred to with respect to the timing chart thereof.

A structure of a pixel portion of the EL display which is driven with the alternate current in the analog style is the same as the EL display which is driven with the alternate current in a digital style, and the gate signal lines (G1 through Gn) are connected to the gate electrode of the switching TFTs incorporated in each of the pixels. One of the source region and the drain region of the switching TFTs incorporated in each of the pixels is connected to the source signal lines (S1 through Sn) while the other is connected to the gate electrode of EL driving TFT and the capacitor. One of the source region and the drain region of the EL driving TFT is connected to the power source supply lines (V1 through Vn) while the; other is connected to the EL element incorporated in each of the pixels. The power source supply lines (V1 through Vn) are also connected to the capacitor incorporated in each of the pixels.

Figure 4:
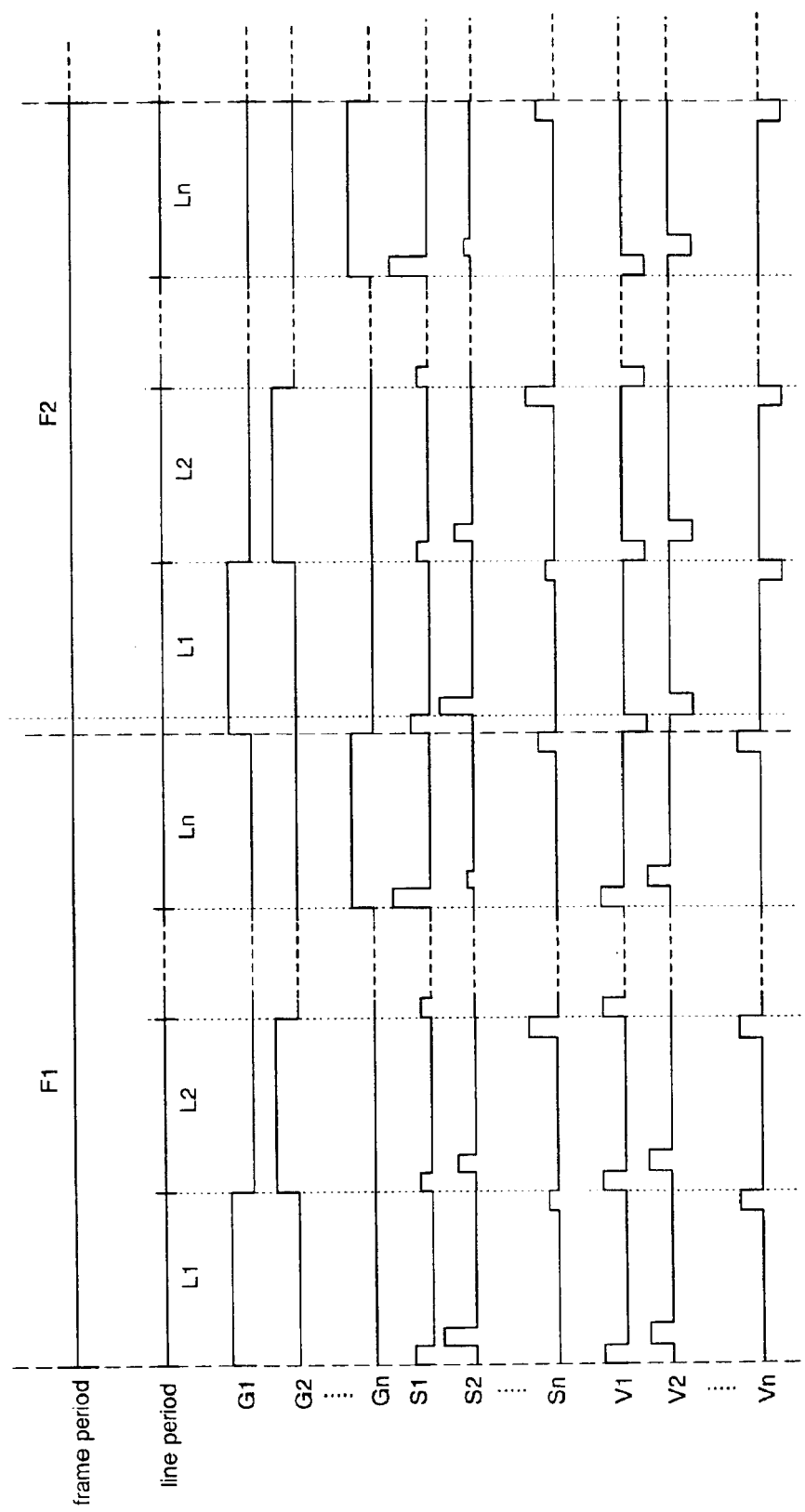
FIG. 4 is a timing chart of an analog style driving with the alternate current according to the present invention.

FIG. 4 shows a timing chart in the case where the EL display is driven with the alternate current in the analog style. The period in which one gate signal line is selected is referred to as one line period. Furthermore, the period until the selection of all the gate signal lines is completed corresponds to one frame period. In the case of this embodiment, n line periods are provided in one frame period because n gate signal lines are present.

Note that, with the EL display of the present invention, it is preferable to provide 120 or more frame period in one second and it is desired that 60 or more images are displayed in one second. When the number of images displayed in one second becomes 60 or less, flickering of images such as a flicker becomes visually conspicuous.

With an increase in the number of gray scale levels, the number of line periods in one frame period also increases, and the driver circuit must be driven at a high frequency.

In the beginning, the power source voltage lines (V1 through Vn) are held at off power source potential. Note that, in the case of the analog style driving with the alternate current, the height of the off power source potential may be the same with as height of the stationary potential within the scope in which the EL element does not emit light. Note that, the EL driving voltage at this time is referred to as off EL driving voltage. Ideally, it is desired that the off EL driving voltage is 0 V, but the voltage may be to such a degree that the EL element 1506 does not emit light.

In the first line period (L1), an analog video signal in inputted in order to the source signal lines (S1 through Sn). The gate signal is inputted to the gate signal line G1 in the first line period (L1). As a consequence, the analog video signal inputted to the source signal line S1 is inputted to the gate electrode of the EL driving TFTs (1, 1) via the switching TFTs (1, 1) because the switching TFTs is in the on state.

Then, the potential of the power source supply line V1 changes from the off power source potential to the saturated power source potential. Note that, in this specification, the saturated power source potential refers to a potential that has a potential difference with the stationary potential to such a degree that the EL element emits light in the analog driving.

The quantity of the current that flows in the EL driving TFT channel formation region is controlled depending on the size of the analog video signal voltage input to the gate electrode. In the case of the analog driving, the analog video signal is inputted to the gate electrode of the EL driving TFT. When one of the source region or the drain region is held at the saturated power source potential, the other potential is set as the on power source potential. The EL driving voltage at this time is referred to as on EL driving voltage.

Depending on the analog video signal applied to the gate electrode of the EL driving TFTs (1, 1), the on EL driving voltage the size of which is controlled is applied to the EL element.

Next, the analog video signal is inputted to the source signal line S2 in the same manner, and the switching TFTs are turned on. Consequently, the analog video signal input to the source signal line S2 is inputted to the gate electrode of the EL driving TFTs (2, 1) via the switching TFTs (2, 1).

Thus, the EL driving TFTs (2, 1) are turned on. Then, the potential of the power source supply line V2 changes from the off power source potential to the saturated power source potential. Consequently, the on EL driving voltage the size of which is controlled with the analog video signal applied to the gate electrode of the EL driving TFTs (2, 1) is applied to the EL element.

When the above operation is repeated, and the input of the analog video signal to the source signal lines (S1 through Sn) is completed, the first line period (L1) is completed. Then, next the second line period (L2) begins, so that the gate signal is inputted to the gate signal line G2. Then, in the same manner as the first line period (L1), the analog video signal is inputted to the source signal lines (S1 through Sn) in order.

The analog video signal is inputted to the source signal line S1. Since the switching TFTs (1, 2) are turned on, the analog video signal input to the source signal line S1 is inputted to the gate electrode of the EL driving TFTs (1, 2) via the switching TFTs (1, 2).

Consequently, the EL driving TFT (1, 2) is turned on. Then, the potential of the power source supply line V1 changes from the off power source potential to the saturated power source potential. Thus, the EL driving voltage the size of which is controlled with the analog video signal applied to the gate electrode of the EL driving TFTs (1, 2) is applied to the EL element.

When the above operation is repeated, and the input of the analog video signal to the source signal lines (S1 through Sn) is completed, the second line period (L2) is completed. Then, next the third line period (L3) begins, and the gate signal is inputted to the gate signal line G3. Then, the gate signal is inputted to the gate signal lines (G1 through Gn) in order with the result that the one frame period is completed.

When this frame period is completed, the saturated power source voltage changes in the next frame period with the result that the on power source potential changes. Then, the on EL driving voltage changes to the voltage having the opposite polarity. Then, in the same manner as the previous frame period, the above operation is conducted. However, the on EL driving voltage in this frame period has a polarity opposite to the polarity of the on EL driving voltage in the previous frame period. Consequently, the on EL driving voltage having the polarity opposite to the polarity of the EL driving voltage in the previous, frame period is applied to all the EL elements with the result that the EL elements do not emit light. In this specification, the frame period in which the EL elements display the image is referred to as a display frame period, while on the contrary the frame period in which all the EL elements do not emit light and no image is displayed is referred to as non-display frame period.

When the non-display frame period is completed, another display frame period begins at the next step. The EL driving voltage changes to a voltage having the polarity opposite to the polarity of the EL driving voltage in the non-display frame period.

In this manner, the image is displayed by alternately repeating the display frame period and the non-display frame period. The present invention has the structure described above so that the on EL driving voltage having the opposite polarity is applied to the EL element in each definite period. Consequently, the deterioration of the current-voltage characteristic of the EL element is improved, and the life of the EL element can be prolonged as compared with the conventional driving method.

Furthermore, in this embodiment, there is explained a case where the display device is driven with the non-interlace scanning, but the device of the invention can also be driven the interlace scanning.

[Embodiments]

Embodiments of the present invention will be explained hereinbelow.

[Embodiment 1]

In Embodiment 1, there will be explained a case in which the polarity of the on EL driving voltage is changed to the opposite polarity for each sub-frame period in the case where the time division gray scale display is provided in the digital-style driving with the alternate current. Here, there will be explained a case in which $2^n$ grays scale full-color time division gray scale display is provided by the n-bit digital device method.

The structure of the pixel portion of the EL display in Embodiment 1 is the same as the structure shown in FIG. 2B. The gate signal lines (G1 through Gn) are connected to the gate electrode of the switching TFT incorporated in each of the pixels. One of the source region and the drain region of the switching TFTs incorporated in each of the pixels is connected to the source signal lines (S1 through Sn) while the other is connected to the gate electrode of the EL driving TFTs and the capacitor. Furthermore, one of the source region and the drain region of the EL driving TFTs is connected to the power source supply lines (V1 through Vn) while the other is connected to the EL element incorporated in each of the pixels. The power source supply lines (V1 through Vn) are also connected to the capacitor incorporated in each of the pixels.

Figure 5:
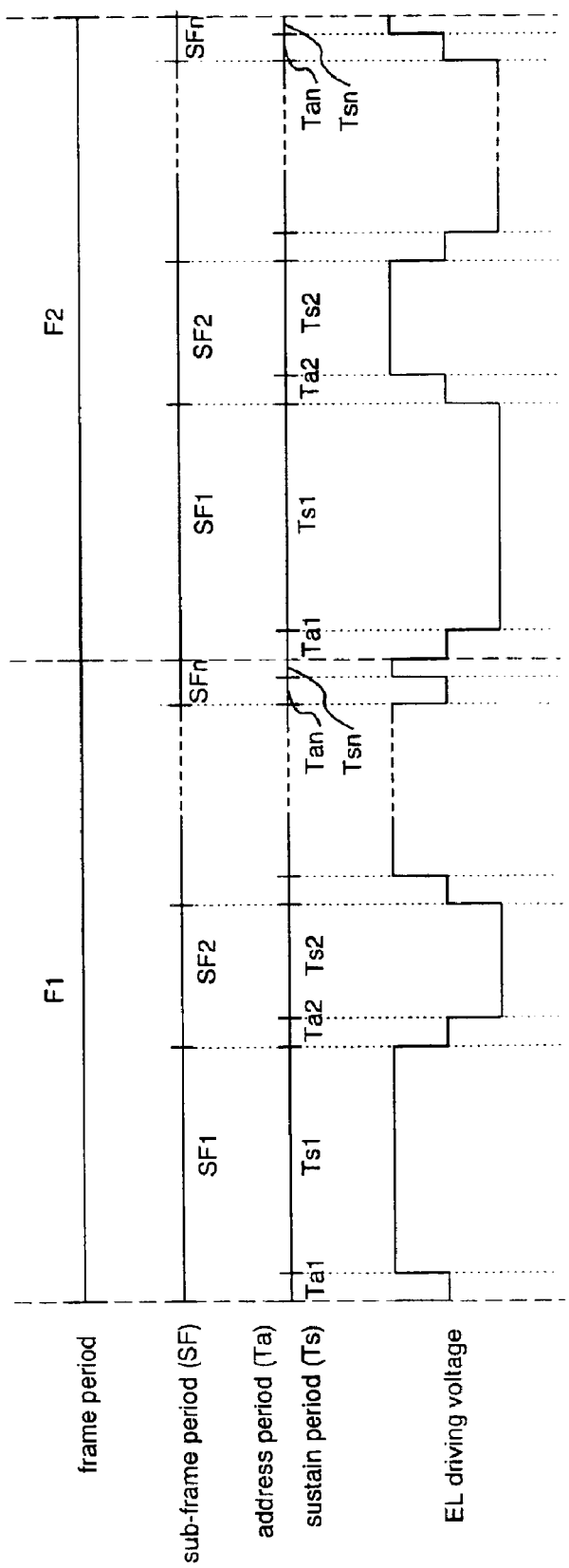
FIG. 5 is a timing chart of a digital style driving with the alternate current according to the present invention.

FIG. 5 shows a timing chart of the driving method in Embodiment 1. In the beginning, one frame period is divided into n sub-frame periods (SF1 through SFn). Note that, the period in which all the pixels in the pixel portion display one image is referred to as one frame period.

Note that, a plurality of periods into which one frame period is divided are referred to as sub-frame periods. With an increase in the number of gray scale levels, the number of the division of one frame period increases, so that the driver circuit must be driven at a high frequency.

One sub-frame period is divided into address periods (Ta) and sustain periods (Ts).

The address period refers to time required for inputting data into all the pixels in one sub-frame period while the sub-frame period (also referred to as lighting period) refers to the period in which EL elements are allowed to emit light. The lengths of the address periods (Ta1 through Tan) incorporated in n sub-frame periods respectively are all the same. The sustain periods (Ts) incorporated in n sub-frame periods SF1 through SFn are set to Ts1 through Tsn respectively.

The lengths of the sustain periods is set to be Ts1: Ts2: Ts3: ... : Ts(n−1): Tsn=$2^0$: $2^{-1}$: $2^{-2}$: ... : $2^{-(n-2)}$: $2^{-(n-1)}$. However, the order in which sub-frame periods SF1 through SFn are allowed to appear may be any. With the combination of these sustain periods, a desired gray scale display can be provided out of $2^n$ gray scale levels.

In the beginning, the opposite electrode is held at a stationary potential. Then, the gate signal is inputted to the gate signal line G1. All the switching TFTs having the gate electrode connected to the gate signal line G1 are turned on.

Then, in the state in which the switching TFTs having the gate electrode connected to the gate signal line G1 are turned on, the digital data signals are inputted to all the source signal lines (S1 through Sn) at the same time. Then, the digital data signals inputted to the source signal lines (S1 through Sn) are inputted to the gate electrode of the EL driving TFTs via the switching TFTs in the on state. Further, the digital data signal is also inputted to the capacitor and held.

The above operation is repeated, and the digital data signals are inputted to all the pixels. The period until the digital data signals are inputted to all the pixels is the address period.

At the same time as when the address period is completed, the sustain period begins. When the sustain period begins, the potential of the opposite electrode changes from the off stationary potential to the on stationary potential. Then, the switching TFTs are turned off, the digital signal held in the capacitor is inputted to the gate electrode of the EL driving TFTs.

In Embodiment 1, the polarity of the on EL driving voltage which is a difference between the on stationary potential and the power source potential becomes opposite to each other for each of the sub-frame periods by changing the height of on the stationary potential. Consequently, the EL display repeats the display and the non-display by setting the polarity of the on EL driving voltage for each of the sub-frame periods to the opposite. The sub-frame periods in which the display is provided is referred to as the display sub-frame period while the sub-frame period in which no display is provided is referred to as the non-display sub-frame period.

For example, in the first frame period, supposing that the first sub-frame period is a display period, the second sub-frame period is a non-display period, and the third frame period becomes again the display period. Then, when all the sub-frame period appears, and the first frame period is completed, the second frame period begins. In the first sub-frame period in the second frame period, since the EL driving voltage having, the polarity opposite to the EL driving voltage applied to the EL element in the first sub-frame period in the first frame period is applied to the EL layer of the EL element, the non-display period begins. Then, the next second sub-frame period becomes a display period, and the display period and the non-display period alternately are provided for each of the sub-frame periods.

Note that, in this specification, when the display and the non-display is changed over by the setting of the polarity of the EL driving voltage to the opposite, the period when the display is provided is referred to as a display period. In addition, the period when the display is not provided on the contrary, is referred to as a non-display period. Consequently, in this specification, the display frame period and the display sub-frame period are generally referred to as a display period. Furthermore, on the contrary, the non-display frame period and the non-display sub-frame period are generally referred to as a non-display period.

In the case where the digital data signal has information of "0" in Embodiment 1, the EL driving TFTs are turned off, and the pixel electrode of the EL element is held at the off stationary potential. As a consequence, the EL element incorporated in the pixel to which the digital data signal having information of "0" is applied does not emit light.

On the contrary, in the case where the digital data signal has information of "1", the EL driving TFTs are turned on, so that the power source potential is given to the pixel electrode of the EL element. As a consequence, the EL element incorporated in the pixel to which the digital signal having information of "1" is inputted emits light.

The period in which all the switching TFTs are turned off is the sustain period.

The period in which the EL element is allowed to emit light (the pixel is allowed to be lit) is any of the periods Ts1 through Tsn. Here, suppose that a predetermined pixel is allowed to light during the period of Tsn.

Next, the address period begins again, and then the sustain period begins upon the input of the digital data signals to all the pixels. At this time, any of the periods Ts1 through Ts(n−1) becomes the sustain period. Here, suppose that the predetermined pixel is allowed to be lit in a period of Ts(n−1).

A similar operation is repeated with respect to the remaining n−2 sub-frame hereinbelow, so that the Ts(n−2), Ts(n−3) . . . Ts1 and the sustain period is set in order and a predetermined pixel is allowed to be lit in respective sub-frames.

In this manner, in the case where the EL driving voltage having an opposite polarity with respect to each of the sub-frames is applied to the EL element in the time division gray scale display at the time of driving with the alternate current, one gray scale display is provided in two frame periods. The gray scale level of the pixel can be determined by summing the length of the sustain period in which the pixel is lit in two adjacent frame periods, namely the length of the sustain period immediately after the address period in which the digital data signal having information of "1" is input to the pixel. For example, in case of n=8, when the luminance is set to 100% in the case where the pixel emits light in all the sustain periods, the luminance of 75% can be represented in the case where the pixel emits light in Ts1 and Ts2. In the case where Ts3, Ts5 and Ts8 are selected, the luminance of about 16% can be represented.

The present invention has the above structure, so that the EL driving voltage having the opposite voltage is applied to the EL layer incorporated in the EL element in each of the sub-frame periods. Consequently, the deterioration of the current-voltage characteristic of the EL element can be improved, and the life of the EL element can be prolonged as compared with the conventional driving method.

In Embodiment 1, there is obtained an effect that flickering will occur with difficulty as compared with the digital style EL display which is driven with the alternate current for each of the frame periods shown in the embodiment.

[Embodiment 2]

In Embodiment 2, an example is shown which is different from the pixel portion of the EL display according to the present invention shown in FIG. 2A.

Figure 6A:
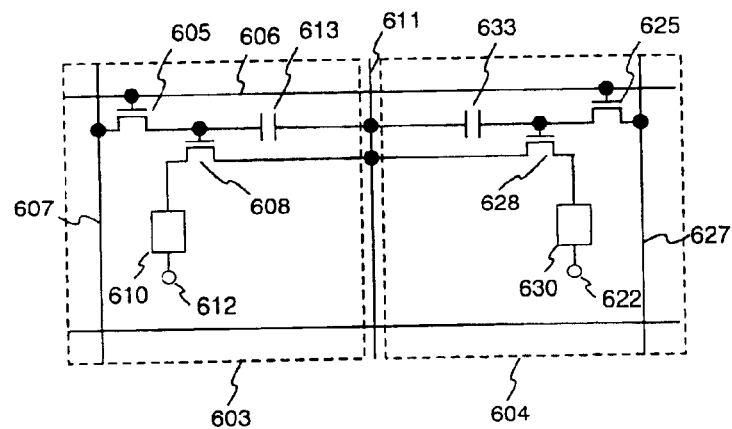
FIGS. 6A and 6B are a circuit diagram and a top view of an EL display according to the present invention.

FIG. 6A shows a circuit diagram showing an example of an enlarged view of the pixel portion of the EL display according to Embodiment 2. In the pixel portion, a plurality of pixels are arranged in a matrix-like configuration. The pixel 603 and the pixel 604 are provided adjacent to each other. In FIG. 6A, reference numerals 605 and 625 denote switching TFTs. The gate electrode of the switching TFTs 605 and the 625 are connected to the gate signal line 606 to which the gate signal is inputted. One of the source region and the drain region of switching TFTs 605 and 625 is connected to the data signal lines (also referred to as source signal lines) 607 and 627 to which the digital data signal is inputted while the other is connected to the gate electrode of the EL driving TFTs and the capacitors 613 and 633, respectively.

Then, the source region of the EL driving TFTs 608 and 628 is connected to the common power source supply line 611, while the drain region is connected to the pixel electrode incorporated in the EL elements 610 and 630, respectively. In this manner, in Embodiment 2 two adjacent pixels share the power source supply line.

The EL elements 610 and 630 comprise an anode(a pixel electrode in Embodiment 2), a cathode (an opposite electrode in Embodiment 2) and an EL layer provided between the anode and the cathode respectively. In Embodiment 2, the drain region of the EL driving TFTs 608 and 628 is connected to the anode while the cathode is connected to the stationary sources 612 and 622 and is held at the stationary potential. The present invention is not limited to this structure. The drain region of the EL driving TFTs 608 and 628 may be connected to the cathode.

Note that, a resistor may be respectively provided between the drain region of the EL driving TFTs 608 and 628, and the anode (pixel electrode) incorporated in the EL elements 610 and 630, respectively. By providing the resistor, a current quantity supplied from the EL driving TFTs to the EL element is controlled, so that the influence of disparity of the EL driving TFTs can be prevented. The resistor may be an element which shows a sufficiently large resistance value than the on resistance of the EL driving TFTs 608 and 628, so that there is no restriction on the structure or the like. Note that, the on resistance is a value obtained by dividing the drain voltage of the TFTs by the drain current which flows at that time. As the resistance value of the resistor, the value may be selected from the scope of 1 kΩ through 50 MΩ (preferably, 10 kΩ through 10 MΩ, and more preferably 50 kΩ through 1 MΩ). When a semiconductor layer having a high resistance value is used as the resistor, the formation is easy and preferable.

Furthermore, when the switching TFTs 605 and the 625 are set in the non-selection state (off state), the capacitors 613 and 633 are provided for holding the gate voltage of the EL driving TFTs 608 and 628. One of two electrodes incorporated in these capacitors 613 and 633 is connected to the drain region of the switching TFTs 605 and 625 while the other electrode is connected to the power source supply line 611. Note that, the capacitors 613 and 633 may not necessarily be provided.

Figure 6B:
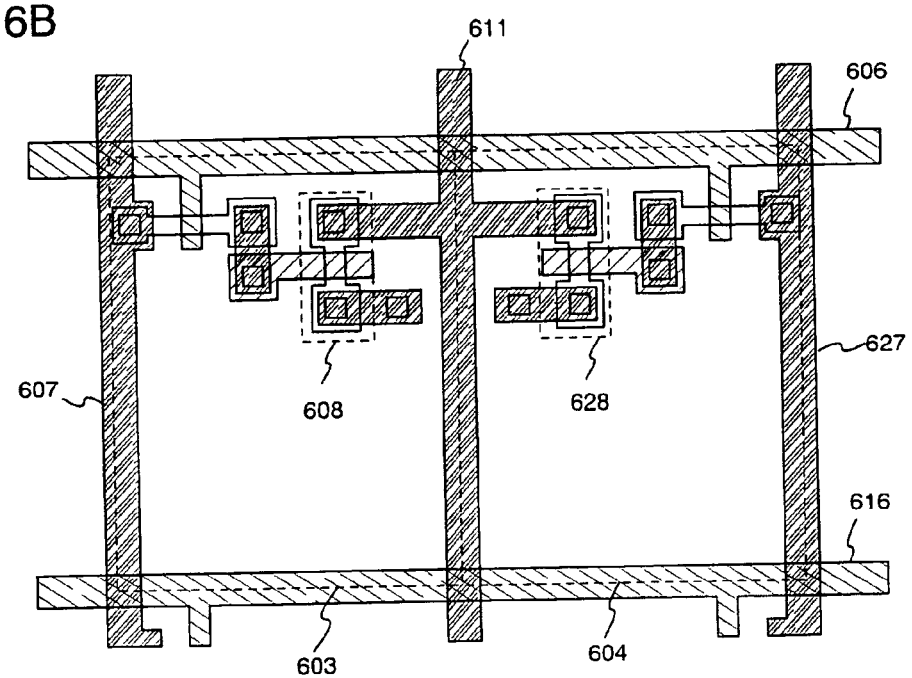

FIG. 6B shows a structural view of the circuit diagram shown in FIG. 6A. In a region surrounded by the source signal lines 607 and 627, the gate signal lines 606 and 616, and the power source supply lines 611, pixels 603 and 604 are provided. The source regions of the EL driving TFTs 608 and 628 incorporated in the pixels 603 and 604 respectively are both connected to the power source supply line 611. In this embodiment, the two adjacent pixels share the power source supply line. As a consequence, as compared with the structure shown in FIG. 2A, the ratio of the wiring in the whole pixel portion may be made small. When the ratio of the wiring with respect to the whole pixel portion is small, a wiring is provided in a direction in which the EL layer emits light, light shielding by the wiring can be suppressed.

The structure shown in Embodiment 2 may be made in a free combination with Embodiment 1.

[Embodiment 3]

Figure 7:
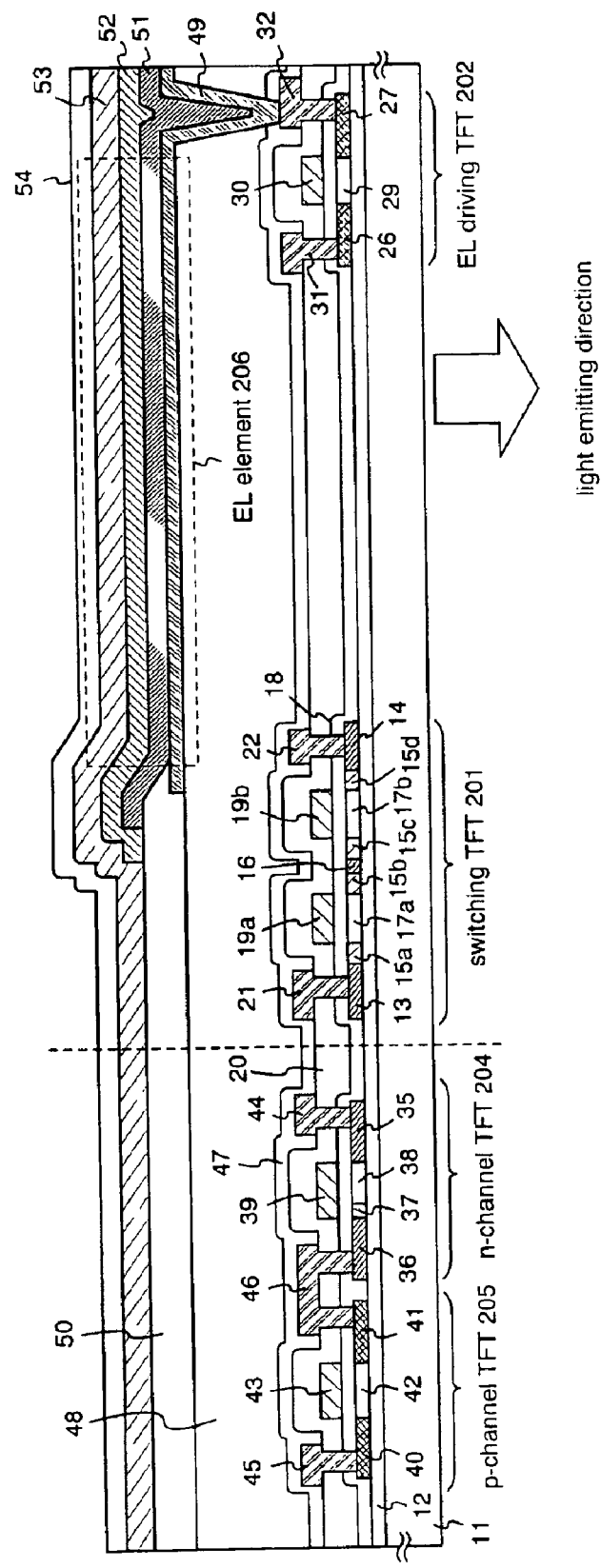
FIG. 7 is a view showing a sectional structure of the EL display according to the present invention.

Next, reference is made to FIG. 7 schematically showing the sectional structure of the EL display device of the present invention.

In FIG. 7, reference numeral 11 is a substrate, and 12 is an insulating film that is a base (hereinafter, this film is designated as base film). For the substrate 11, use can be made of a light transmissible substrate, representatively, a glass substrate, a quartz substrate, a glass ceramic substrate, or a crystallized glass substrate. However, it must be resistible to the highest processing temperature in a manufacturing process.

The base film 12 is effective especially in using a substrate that has a movable ion or a substrate that has conductivity, but it is not necessarily disposed on the quartz substrate. An insulating film that contains silicon can be used as the base film 12. It should be noted that, in this specification, "insulating film that contains silicon" signifies an insulating film in which oxygen or nitrogen is added to silicon at a predetermined ratio (SiOxNy: x and y are arbitrary integers), such as a silicon oxide film, a silicon nitride film or a silicon nitride oxide film.

Reference numeral 201 is a switching TFT, and 202 is a EL driving TFT. The switching TFT is formed by an n-channel type TFT and the EL driving TFT is formed by a p-channel type TFT. When the EL luminous direction is toward the under surface of a substrate (the under surface is not provided TFT or EL layer), above mentioned structure is preferable. However, in the present invention, there is no need to limit this structure. The switching TFT and the EL driving TFT are possible to use the p-channel type TFT or n-channel TFT for both of them or any one thereof.

The switching TFT 201 is made up of an active layer that includes a source region 13, a drain region 14, LDD (Lightly-Doped Drain) regions 15a–15d, an isolation region 16, and channel formation regions 17a, 17b, a gate insulating film 18, gate electrodes 19a, 19b, a first interlayer insulating film 20, a source signal line 21, and a drain wiring line 22. The gate insulating film 18 or the first interlayer insulating film 20 can be common to all TFTs on the substrate, or can be varied according to circuits or elements.

In the switching TFT 201 shown in FIG. 7, the gate electrodes 19a, 19b are connected electrically, in other words, a so-called double-gate structure is established. Not only the double-gate structure but also a so-called multi-gate structure, such as a triple-gate structure, can be established, of course. The multi-gate structure signifies a structure including an active layer that has two channel formation regions or more connected in series.

The multi-gate structure is very effective to decrease an off current, and if the off current of the switching TFT is decreased sufficiently, the minimum capacity necessary for the capacitor can be reduced, which is connected to the gate electrode of the driver TFT 202. That is, since the possession area of the capacitor can be reduced, the multi-gate structure is also effective to widen the effective luminescence area of the EL element.

In the switching TFT 201, the LDD regions 15a–15d are disposed not to overlap with the gate electrodes 19a and 19b, with the gate insulating film 18 therebetween. The thus built structure is very effective to decrease the off current. The length (width) of the LDD regions 15a–15d is 0.5–3.5 μm, representatively, 2.0–2.5 μm.

It is more desirable to form an offset region (i.e., region formed with a semiconductor layer whose composition is the same as the channel formation region, and in which a gate voltage is not applied) between the channel formation region and the LDD region, in order to decrease the off current. In the multi-gate structure that has two gate electrodes or more, the isolation region 16 (i.e., region whose concentration is the same and to which the same impurity element is added as the source region or the drain region) formed between the channel formation regions is effective to decrease the off current.

The EL driving TFT 202 is made up of an active layer that includes a source region 26, a drain region 27, and a channel formation region 29, a gate insulating film 18, a gate electrode 30, the first interlayer insulating film 20, a source signal line 31, and a drain wiring line 32. In this embodiment, EL driving TFT 202 is a p-channel type TFT.

The drain region 14 of the switching TFT 201 is connected to the gate electrode 30 of the EL driving TFT 202. In more detail, the gate electrode 30 of the EL driving TFT 202 is connected electrically to the drain region 14 of the switching TFT 201 through the drain wiring line 22(also called connection wiring line), which is not shown. While the gate electrode 30 is a single gate structure in this embodiment, multi-gate structure is also applicable. The source signal line 31 of the EL driving TFT is connected to the current-supply line.

The EL driving TFT 202 is an element to control the amount of current supplied to the EL element, and a comparatively large amount of current can flow therethrough. Therefore, preferably, the channel-width (W) is designed to be greater than the channel-width of the switching TFT. Additionally, preferably, the channel-length (L) is designed to be long so that an excessive current does not flow through the EL driving TFT 202. A desirable value is 0.5–2 mA (1–1.5 mA preferably) per pixel.

From the viewpoint of restraining the deterioration of TFT, it is effective to thicken the film thickness of the active layer (specifically, the channel formation region) of the EL driving TFT 202 (50–100 nm preferably, and 60–80 nm further preferably). On the other hand, from the viewpoint of decreasing the off current in the switching TFT 201, it is also effective to thin the film thickness of the active layer (specifically, the channel formation region)(20–50 nm preferably, and 25–40 nm further preferably).

The structure of the TFT formed in the pixel was described above. In this formation, a driver circuit is also formed at the same time. A CMOS circuit that is a base unit to form the driver circuit is shown in FIG. 7.

In FIG. 7, a TFT that has a structure to decrease the hot carrier injection without reducing the operation speed to the utmost is used as the n-channel type TFT 204 of the CMOS circuit. The driver circuit described herein is the source signal side driver circuit and the gate signal side driver circuit. It is also possible to form other logic circuits (level shifter, A/D converter, signal division circuit, etc.), of course.

The active layer of the n-channel type TFT 204 of the CMOS circuit includes a source region 35, a drain region 36, an LDD region 37, and a channel formation region 38. The LDD region 37 overlaps with the gate electrode 39, with the gate insulating film 18 therebetween.

The reason for forming the LDD region 37 only on the drain region 36 side is not to reduce the operation speed. There is no need to worry about the off current value in the n-channel type TFT 204. Instead, the operation speed should be rated above it. Therefore, preferably, the LDD region 37 is completely laid on the gate electrode, thus reducing a resistance component as much as possible. That is, a so-called offset should be omitted.

In the p-channel type TFT 205 of the CMOS circuit, there is no need to provide the LDD region especially because the deterioration caused by the hot carrier injection is quite negligible. Therefore, the active layer includes a source region 40, a drain region 41, and a channel formation region 42. The gate insulating film 18 and the gate electrode 43 are disposed thereon. It is also possible to dispose the LDD region as well as the n-channel type TFT 204 in order to take countermeasures against the hot carrier, of course.

The n-channel type TFT 204 and the p-channel type TFT 205 are covered with the first interlayer insulating film 20, and the source wiring lines 44, 45 are formed. The two are connected electrically by the drain wiring line 46.

Reference numeral 47 is a first passivation film. The film thickness thereof is 10 nm-1 μm (200–500 nm preferably). An insulating film including silicon (especially, a silicon nitride oxide film or a silicon nitride film is desirable) can be used as its material. The passivation film 47 serves to protect a formed TFT from alkali metal and water. The EL layer finally disposed above the TFT includes alkali metal such as sodium. In other words, the first passivation film 47 serves also as a protective layer by which the alkali metal (movable ions) is not allowed to enter the TFT side.

Reference numeral 48 is a second interlayer insulating film, and serves as a flattening film to flatten level differences formed by the TFT. Preferably, an organic resin film, such as polyimide, polyamide, acrylic resin, or BCB (benzocyclobutene) is used as the second interlayer insulating film 48. These organic resin films have an advantage in that a good smooth plane can be easily formed, and the dielectric constant is low. It is preferable to entirely absorb the level difference caused by the TFT by means of the second interlayer insulating film 48 because the EL layer is very sensitive to ruggedness. Additionally, it is preferable to form a low-dielectric constant material thick, in order to decrease the parasitic capacitance formed between the gate signal line or the data signal line and the cathode of the EL element. Therefore, preferably, the film thickness thereof is 0.5–5 μm (1.5–2.5 μm preferably).

Reference numeral 49 is a pixel electrode (anode of the EL element) that is made of a transparent conductive film. After a contact hole (opening) is made in the second interlayer insulating film 48 and the first passivation film 47, the electrode is connected to the drain wiring line 32 of the EL driving TFT 202 through the opening. When the pixel electrode 49 and the drain region 27 are arranged not to be connected directly, as in FIGS. 2A and 2B, the alkali metal of the EL layer can be prevented from entering the active layer via the pixel electrode.

A third interlayer insulating film 50 whose thickness is 0.3–1 μm is disposed on the pixel electrode 49. The film 50 is made of a silicon oxide film, a silicon nitride oxide film, or an organic resin film. The third interlayer insulating film 50 is provided with an opening on the pixel electrode 49 by etching, and the edge of the opening is etched to have a taper shape. Preferably, the angle of the taper is 10–60° (30–50° preferably).

An EL layer 51 is formed on the third interlayer insulating film 50. The EL layer 51 is used in the form of a single-layer structure or a laminate structure. The laminate structure is superior in luminous efficiency. Generally, a positive hole injection layer/a positive hole transporting layer/a luminescent layer/an electronic transporting layer are formed on the pixel electrode in this order. Instead, a structure may be used which has the order of positive hole transporting layer/luminescent layer/electronic transporting layer or the order of positive hole injection layer/positive hole transporting layer/luminescent layer/electronic transporting layer/electronic injection layer. In the present invention, any one of the known structures can be used, and fluorescent coloring matter, etc., can be doped to the EL layer.

For example, materials indicated in the following U.S. Patents or publications can be used as the organic EL material; U.S. Pat. Nos. 4,356,429: 4,539,507: 4,726,432: 4,769,292: 4,885,211: 4,950,950: 5,059,861: 5,047,687: 5,073,446: 5,059,862: 5,061,617: 5,151,629: 5,294,869: 5,294,870, and Japanese Laid-Open Patent Publication Nos. 10-189525: 8-241048: 8-78159.

The EL display device mainly has four color display methods; method of forming three kinds of EL elements that correspond to R(red), G(green), and B(blue), respectively: method of combining an EL element of white luminescence and a color filter (coloring layer): method of combining an EL element of blue or blue-green luminescence and a fluorescent body (fluorescent color conversion layer: CCM): and method of stacking the EL elements that correspond to RGB while using a transparent electrode for a cathode (opposite electrode).

The structure of FIGS. 2A and 2B is an example in which the method of forming three kinds of EL elements that correspond to RGB is used. Only one pixel is shown in FIG. 7. In fact, pixels, each having the same structure, are formed to correspond to each color of red, green, and blue, and thereby color display can be performed.

The present invention can be performed regardless of the luminescence method, and can use all the four methods. However, since the speed of response of the fluorescent body is slower than that of the EL, and the problem of afterglow occurs, the method in which the fluorescent body is not used is preferable. Additionally, it can be said that a color filter that causes the fall of luminescence brightness should not be used if possible.

A cathode 52 of the EL element is disposed on the EL layer 51. A material that includes magnesium (Mg), lithium (Li) or calcium (Ca) that is small in work function is used as the cathode 52. Preferably, use is made of an electrode made of MgAg (material in which Mg and Ag are mixed in the ratio of Mg: Ag=10:1). Instead, a MgAgAl electrode, a LiAl electrode, or LiFAl electrode can be used.

EL element 206 is formed by pixel electrode (anode) 49, EL layer 51 and cathode 52.

It is necessary to form a layered body comprised of the EL layer 51 and the cathode 52 by each pixel individually. However, the EL layer 51 is quite weak to water, and a normal photolithography technique cannot be used. Therefore, it is preferable to use a physical mask material, such as metal mask, and selectively form it according to a vapor phase method, such as a vacuum deposition method, a sputtering method, or a plasma CVD method.

It is also possible to use an ink jet method, a screen printing method, a spin coating method, and the like, as the method of selectively forming the EL layer. However, these methods cannot continuously form the cathode in the current state of the art, and it can be said that the method described above, not the ink jet method, etc., is desirable.

Reference numeral 53 is a protective electrode. This is to protect the cathode 52, from outside water, etc., and, at the same time, connect the cathode 52 of each pixel. For the protective electrode 53, it is preferable to use a low-resistance material including aluminum (Al), copper (Cu), or silver (Ag). A cooling effect to lower the heat of the EL layer can be expected from the protective electrode 53.

Reference numeral 54 is a second passivation film, and, preferably, the film thickness thereof is 10 nm–1 $\mu$m (200–500 nm preferably). A main purpose to dispose the second passivation film 54 is to protect the EL layer 51 from water. It is also effective to give it a cooling effect. However, the EL layer is weak to heat as mentioned above, and film formation should be performed at a low temperature (ranging from a room temperature to 120° C. preferably). Therefore, it can be said that a desirable film formation method is the plasma CVD method, sputtering method, vacuum deposition method, ion plating method, or solution application method (spin coating method).

Needless to say, all the TFTs shown in FIG. 7 have the polysilicon films used in the present invention as active layers.

The present invention is not limited to the structure of the EL display device of FIG. 7. The structure of FIG. 7 is only one of the preferable form for operating the present invention.

The structure shown in this embodiment can be freely to combine and operate with Embodiment 1 or Embodiment 2.

[Embodiment 4]

In this embodiment, reference is made to FIG. 21 schematically showing the sectional structure of the EL display device of the present invention using another example than FIG. 7. An example of TFT can be used as the thin film transistor of bottom gate type TFT is explained in this embodiment.

In FIG. 21, reference numeral 811 is a substrate, and 812 is an insulating film that is a base (hereinafter, this film is designated as base film). For the substrate 811, use can be made of a light transmissible substrate, representatively, a glass substrate, a quartz substrate, a glass ceramic substrate, or a crystallized glass substrate. However, it must be resistible to the highest processing temperature in a manufacturing process.

The base film 812 is effective especially in using a substrate that has a movable ion or a substrate that has conductivity, but it is not necessarily disposed on the quartz substrate. An insulating film that contains silicon can be used as the base film 812. It should be noted that, in this specification, "insulating film that contains silicon" signifies an insulating film in which oxygen or nitrogen is added to silicon at a predetermined ratio (SiOxNy: x and y are arbitrary integers), such as a silicon oxide film, a silicon nitride film or a silicon nitride oxide film.

Reference numeral 8201 is a switching TFT, and 8202 is an EL driving TFT. The switching TFT is formed by an n-channel type TFT and the EL driving TFT is formed by a p-channel type TFT. When the EL luminous direction is toward the under surface of a substrate (the under surface is not provided TFT or EL layer), above mentioned structure is preferable. However, in the present invention, there is no need to limit this structure. The switching TFT and the EL driving TFT are possible to use the p-channel type TFT or n-channel type TFT for both of them or any one thereof.

The switching TFT 8201 is made up of an active layer that includes a source region 813, a drain region 814, LDD regions 815a–815d, an isolation region 816, and channel formation regions 863, 864, a gate insulating film 818, gate electrodes 819a, 819b, a first interlayer insulating film 820, a source signal line 821, and a drain wiring line 822. The gate insulating film 818 or the first interlayer insulating film 820 can be common to all TFTs on the substrate, or can be varied according to circuits or elements.

In the switching TFT 8201 shown in FIG. 21, the gate electrodes 819a, 819b are connected electrically, in other words, a so-called double-gate structure is established. Not only the double-gate structure but also a so-called multi-gate structure, such as a triple-gate structure, can be established, of course. The multi-gate structure signifies a structure including an active layer that has two channel formation regions or more connected in series.

The multi-gate structure is very effective to decrease an off current, and if the off current of the switching TFT is decreased sufficiently, the capacity necessary for the capacitor can be reduced, which is connected to the gate electrode of EL driving TFT 8202. That is, since the possession area of the capacitor can be reduced, the multi-gate structure is also effective to widen the effective luminescence area of the EL element.

In the switching TFT 8201, the LDD regions 815a–815d are disposed not to overlap with the gate electrodes 819a and 819b, with the gate insulating film 818 therebetween. The thus built structure is very effective to decrease the off current. The length (width) of the LDD regions 815a–815d is 0.5–3.5 $\mu$m, representatively, 2.0–2.5 cm.

It is more desirable to form an offset region (i.e., region formed with a semiconductor layer whose composition is the same as the channel formation region, and in which a gate voltage is not applied) between the channel formation region and the LDD region, in order to decrease the off current. In the multi-gate structure that has two gate electrodes or more, the isolation region 816 (i.e., region whose concentration is the same and to which the same impurity element is added as the source region or the drain region) formed between the channel formation regions is effective to decrease the off current.

The current controlling TFT 8202 is made up of an active layer that includes a source region 826, a drain region 827, and a channel formation region 805, a gate insulating film 818, a gate electrode 830, the first interlayer insulating film 820, a source signal line 831, and a drain wiring line 832. In this embodiment, the EL driving TFT 8202 is a p-channel type TFT.

The drain region 814 of the switching TFT 8201 is connected to the gate electrode 830 of the EL driving TFT 8202. In more detail, the gate electrode 830 of the EL driving TFT 8202 is connected electrically to the drain region 814 of the switching TFT 8201 through the drain wiring line 822(also called connection wiring line). While the gate electrode 830 is a single gate structure, the multi-gate structure is also applicable. The source signal line 831 of the EL driving TFT 8202 is connected to the current-supply line.

The EL driving TFT 8202 is an element to control the amount of current supplied to the EL element, and a comparatively large amount of current can flow therethrough. Therefore, preferably, the channel-width (W) is designed to be greater than the channel-width of the switching TFT. Additionally, preferably, the channel-length (L) is designed to be long so that an excessive current does not flow through the EL driving TFT 202. A desirable value is 0.5–2 mA (1–1.5 mA preferably) per pixel.

From the viewpoint of restraining the deterioration of TFT, it is also effective to thicken the film thickness of the active layer (specifically, the channel formation region) of the EL driving TFT 8202 (50–100 nm preferably, and 60–80 nm further preferably). On the other hand, from the viewpoint of decreasing the off current in the switching TFT 8201, it is also effective to thin the film thickness of the active layer (specifically, the channel formation region) (20–50 nm preferably, and 25–40 nm further preferably).

The structure of the TFT formed in the pixel was described above. In this formation, a driver circuit is also formed at the same time. A CMOS circuit that is a base unit to form the driver circuit is shown in FIG. 21.

In FIG. 21, a TFT that has a structure to decrease the hot carrier injection without reducing the operation speed to the utmost is used as the n-channel type TFT 8204 of the CMOS circuit. The driver circuit described herein is the source signal side driver circuit and the gate signal side driver circuit. It is also possible to form other logic circuits (level shifter, A/D converter, signal division circuit, etc.), of course.

The active layer of the n-channel type TFT 8204 includes a source region 835, a drain region 836, an LDD region 837, and a channel formation region 862. The LDD region 837 overlaps with the gate electrode 839, with the gate insulating film 818 therebetween.

The reason for forming the LDD region 837 only on the drain region side 836 is not to reduce the operation speed. There is no need to worry about the off current value in the n-channel type TFT 8204. Instead, the operation speed should be rated above it. Therefore, preferably, the LDD region 837 is completely laid on the gate electrode, thus reducing a resistance component as much as possible. That is, a so-called offset should be omitted.

In the p-channel type TFT 8205 of the CMOS circuit, there is no need to provide the LDD region especially because the deterioration caused by the hot carrier injection is quite negligible. Therefore, the active layer includes a source region 840, a drain region 841, and a channel formation region 861. The gate insulating film 818 and the gate electrode 843 are disposed thereon. It is also possible to dispose the LDD region as well as the n-channel type TFT 8204 in order to take countermeasures against the hot carrier, of course.

It should be noted that the numeral 817a, 817b, 829, 838, and 842 are mask to form channel forming regions 861, 862; 863, 864, and 805.

The n-channel type TFT 8204 and the p-channel type TFT 8205, respectively, have the source signal line 844 and 845 with the first interlayer film 820 therebetween. The each drain region of the n-channel type TFT 8204 and the p-channel type TFT 8205 are connected electrically by the drain wiring line 846.

Reference numeral 847 is a first passivation film. The film thickness thereof is 10 nm–1 $\mu$m (200–500 nm preferably). An insulating film including silicon (especially, a silicon nitride oxide film or a silicon nitride film is desirable) can be used as its material. The passivation film 847 serves to protect a formed TFT from alkali metal and water. The EL layer finally disposed above the TFT includes alkali metal such as sodium. In other words, the first passivation film 847 serves also as a protective layer by which the alkali metal (movable ions) is not allowed to enter the TFT side.

Reference numeral 848 is a second interlayer insulating film, and serves as a flattening film to flatten level differences formed by the TFT. Preferably, an organic resin film, such as polyimide, polyamide, acrylic resin, or BCB (benzocyclobutene) is used as the second interlayer insulating film 848. These films have an advantage in that a good smooth plane can be easily formed, and the dielectric constant is low. It is preferable to entirely absorb the level difference caused by the TFT by means of the second interlayer insulating film 848 because the EL layer is very sensitive to ruggedness. Additionally, it is preferable to form a low-dielectric constant material thick, in order to decrease the parasitic capacitance formed between the gate wiring line or the data wiring line and the cathode of the EL element. Therefore, preferably, the film thickness thereof is 0.5–5 $\mu$m (1.5–2.5 $\mu$m preferably).

Reference numeral 849 is a pixel electrode (anode of the EL element) that is made of a transparent conductive film. After a contact hole (opening) is made in the second interlayer insulating film 848 and the first passivation film 847, the electrode is connected to the drain wiring line 832 of the current controlling TFT 8202 through the opening. When the pixel electrode 849 and the drain region 827 are arranged not to be connected directly, as in FIG. 21, the alkali metal of the EL layer can be prevented from entering the active layer via the pixel electrode.

A third interlayer insulating film 850 whose thickness is 0.3–1 $\mu$m is disposed on the pixel electrode 849. The film 850 is made of a silicon oxide film, a silicon nitride oxide film, or an organic resin film. The third interlayer insulating film 850 is provided with an opening on the pixel electrode 849 by etching, and the edge of the opening is etched to have a taper shape. Preferably, the angle of the taper is 10–60° (30–50° preferably).

An EL layer 851 is formed on the third interlayer insulating film 850. The EL layer 851 is used in the form of a single-layer structure or a layered structure. The layered structure is superior in luminous efficiency. Generally, a positive hole injection layer/a positive hole transporting layer/a luminescent layer/an electronic transporting layer are formed on the pixel electrode in this order. Instead, a structure may be used which has the order of positive hole transporting layer/luminescent layer/electronic transporting layer or the order of positive hole injection layer/positive hole transporting layer/luminescent layer/electronic transporting layer/electronic injection layer. In the present invention, any one of the known structures can be used, and fluorescent coloring matter, etc., can be doped to the EL layer.

The structure of FIG. 21 is an example in which the method of forming three kinds of EL elements that correspond to RGB is used. Only one pixel is shown in FIG. 21.

In fact, pixels, each having the same structure, are formed to correspond to each color of red, green, and blue, and thereby color display can be performed. The present invention can be performed regardless of the luminescence method.

A cathode 852 of the EL element is disposed on the EL layer 851. A material that includes magnesium (Mg), lithium (Li) or calcium (Ca) that is small in work function is used as the cathode 852. Preferably, use is made of an electrode made of MgAg (material in which Mg and Ag are mixed in the ratio of Mg:Ag=10:1). Instead, a MgAgAl electrode, a LiAl electrode, or LiFAl electrode can be used.

The EL element 8206 is formed by the pixel electrode (anode) 849, the EL layer 851 and the cathode 852.

It is necessary to form a laminate structure comprised of the EL layer 851 and the cathode 852 by each pixel individually. However, the EL layer 851 is quite weak to water, and a normal photolithography technique cannot be used. Therefore, it is preferable to use a physical mask material, such as metal mask, and selectively form it according to a vapor phase method, such as a vacuum deposition method, a sputtering method, or a plasma CVD method.

It is also possible to use an ink jet method, a screen printing method, spin coating method, and the like, as the method of selectively forming the EL layer. However, these methods cannot continuously form the cathode in the current state of the art, and it can be said that the method described above, not the ink jet method, etc., is desirable.

Reference numeral 853 is a protective electrode. This is to protect the cathode 852 from outside water, etc., and, at the same time, connect the cathode 852 of each pixel. For the protective electrode 853, it is preferable to use a low-resistance material including aluminum (Al), copper (Cu), or silver (Ag). A cooling effect to lower the heat of the EL layer can be expected from the protective electrode 853.

Reference numeral 854 is a second passivation film, and, preferably, the film thickness thereof is 10 nm-1 $\mu$m (200–500 nm preferably). A main purpose to dispose the second passivation film 854 is to protect the EL layer 851 from water. It is also effective to give it a cooling effect. However, the EL layer is weak to heat as mentioned above, and film formation should be performed at a low temperature (ranging from a room temperature to 120° C. preferably). Therefore, it can be said that a desirable film formation method: is the plasma CVD method, sputtering method, vacuum deposition method, ion plating method, or solution application method (spin coating method).

Needless to say, all the TFTs shown in FIG. 21 have the poly-silicon films used in the present invention as active layers.

The present invention is not limited to the structure of the EL display device of FIG. 21. The structure of FIG. 21 is only one of the preferable form for operating the present invention.

The structure which is shown in this embodiment can be freely combined with Embodiment 1 or Embodiment 2.

[Embodiment 5]

An embodiment of the present invention will be described a method of simultaneously manufacturing TFTs of a pixel portion and a driver circuit portion around the pixel portion. Concerning the driver circuit, a CMOS circuit that is a base unit is shown in the figure, for a brief description.

Figure 8A:
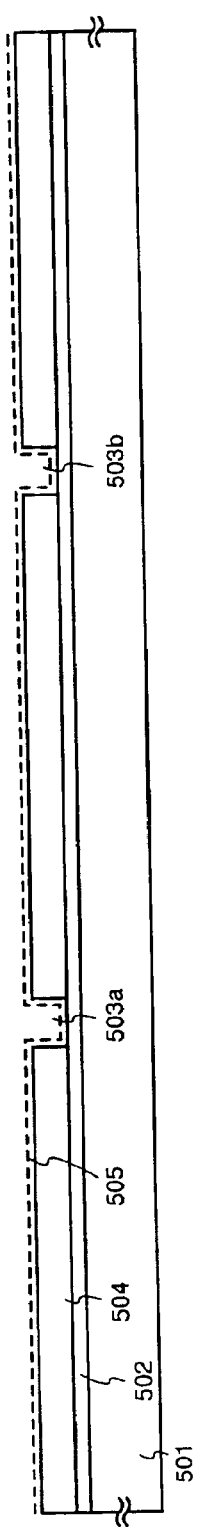
FIGS. 8A to 8E are views showing a process of manufacturing the EL display.

First, a substrate 501 in which a base film (not shown) is disposed on the surface thereof is prepared as shown in FIG. 8A. In this embodiment, a silicon nitride oxide film whose thickness is 200 nm and another silicon nitride oxide film whose thickness is 100 nm are laminated and are used as a base film on a crystallized glass. At this time, preferably, the concentration of nitrogen of the film contacting the crystallized glass substrate is kept to 10–25 wt %. It is possible to form an element directly on the quartz substrate without any base film, of course.

Thereafter, an amorphous silicon film 502 whose thickness is 45 nm is formed on the substrate 501 by a well-known film formation method. There is no need to limit it to the amorphous silicon film. Instead, a semiconductor film (including a micro-crystal semiconductor film) that has an amorphous structure can be used in this embodiment. A compound semiconductor film that has an amorphous structure, such as an amorphous silicon germanium film, also can be used herein.

Figure 8B:
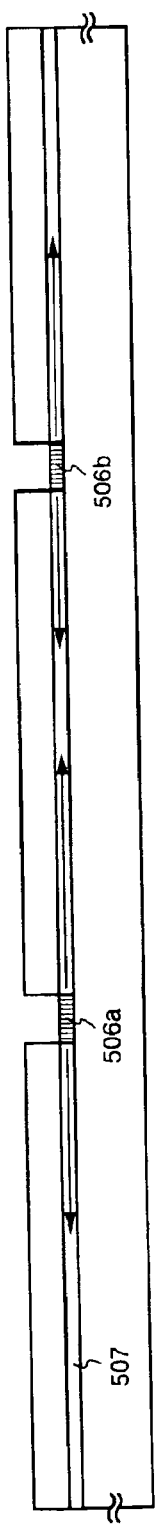
Figure 8C:
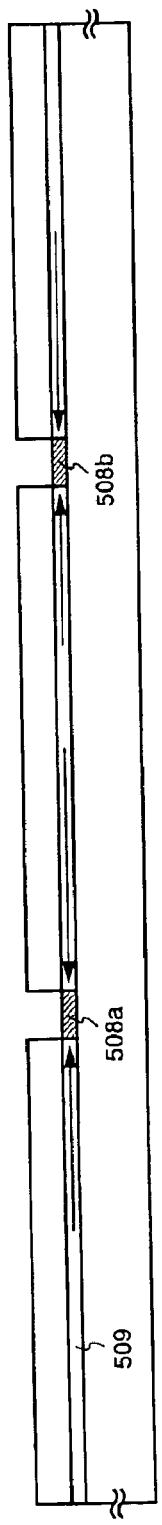

Concerning the steps from here to FIG. 8C, it is possible to completely cite Japanese Laid-open Patent Publication No. 10-247735 filed by the present applicant. This publication discloses a technique concerning a method of crystallizing a semiconductor film, which uses an element, such as Ni, as a catalyst.

First, a protective film 504 that has openings 503a and 503b is formed. A silicon oxide film 150 nm thick is used in this embodiment. A layer 505 that contains nickel (Ni) is formed on the protective film 504 by a spin coating method. Concerning the formation of the Ni containing layer, reference can be made to the above publication.

Thereafter, as shown in FIG. 8B, heating processing at 570° C. for 14 hours is performed in an inert atmosphere, and the amorphous silicon film 502 is crystallized. At this time, crystallization progresses schematically in parallel with the substrate, starting from regions 506a and 506b (hereinafter, designated as Ni addition region) with which Ni is in contact. As a result, a polysilicon film 507 is formed that has a crystal structure in which rod-like crystals gather and form lines.

Thereafter, as shown in FIG. 8C, an element (phosphorus preferably) that belongs to 15-group is added to the Ni addition regions 506a and 506b, while leaving the protective film 504 as a mask. Regions 508a and 508b (hereinafter, designated as phosphorus addition region) to which phosphorus was added at high concentration are thus formed.

Thereafter, heat processing at 600° C. for 12 hours is performed in an inert atmosphere as shown in FIG. 8C. Ni existing in the polysilicon film 507 is moved by this heat processing, and almost all of them are finally captured by the phosphorus addition regions 508a and 508b as shown by the arrow. It is thought that this is a phenomenon caused by the gettering effect of a metallic element (Ni in this embodiment) by phosphorus.

By this process, the concentration of Ni remaining in the polysilicon film 509 is reduced to at least $2 \times 10^{17}$ atoms/cm$^3$ according to the measurement value by SIMS (secondary ion-mass spectrography). Although Ni is a lifetime killer for a semiconductor, no adverse influence is given to the TFT characteristic when it is decreased to this extent. Additionally, since this concentration is the measurement limit of the SIMS analysis in the current state of the art, it will show an even lower concentration (less than $2 \times 10^{17}$ atoms/cm$^3$) in practice.

Figure 8D:
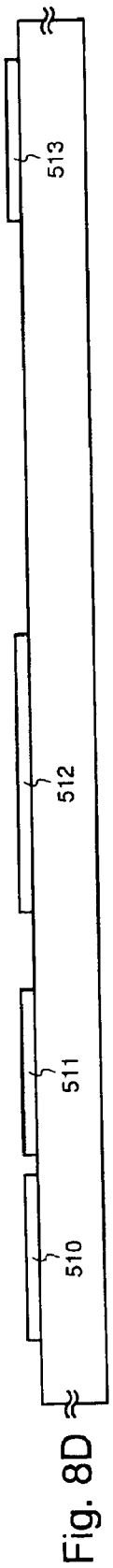
Figure 8E:
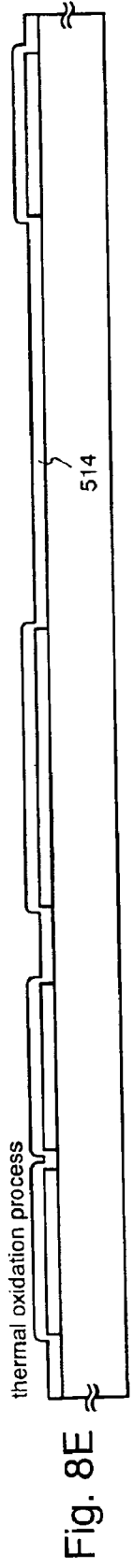

The polysilicon film 509 can be thus obtained that is crystallized by a catalyst and is decreased to the level in which the catalyst does not obstruct the operation of a TFT. Thereafter, active layers 510–513 that use the polysilicon film 509 only are formed by a patterning process. At this time, a marker to conduct mask alignment in the following patterning should be formed by using the above polysilicon film. (FIG. 8D) Thereafter, a silicon nitride oxide film 50 nm thick is formed by the plasma CVD method as shown in FIG.

8E, heating processing at 950° C. for 1 hour is then performed in an oxidation atmosphere, and a thermal oxidation process is performed. The oxidation atmosphere can be an oxygen atmosphere or another oxygen atmosphere in which halogen is added.

In this thermal oxidation process, the oxidation progresses in the interface between the active layer and the silicon nitride oxide film, and a polysilicon film whose thickness is about 15 nm is oxidized, so that a silicon oxide film whose thickness is about 30 nm is formed. That is, a gate insulating film 514 of a thickness of 80 nm is formed in which the silicon oxide film 30 nm thick and the silicon nitride oxide film 50 nm thick are laminated. The film thickness of the active layers 510–513 is made 30 nm by the thermal oxidation process.

Figure 9A:
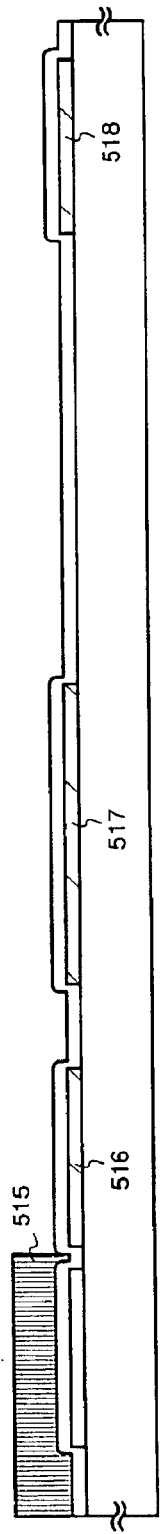
FIGS. 9A to 9D are views showing the process of manufacturing the EL display.

Thereafter, as shown in FIG. 9A, a resist mask 515 is formed, and an impurity element thereinafter, designated as p-type impurity element) that gives the p-type through the medium of the gate insulating film 514 is added to active layers 511 to 513. As the p-type impurity element, an element that belongs to 13-group representatively, boron or gallium typically, can be used. This (called a channel dope process) is a process for controlling the threshold voltage of a TFT.

In this embodiment, boron is added by the ion dope method in which plasma excitation is performed without the mass separation of diborane ($B_2H_6$). The ion implantation method that performs the mass separation can be used, of course. According to this process, impurity regions 516 to 518 are formed that include boron at the concentration of $1\times10^{15}$ to $1\times10^{18}$ atoms/cm$^3$ ($5\times10^{16}$ to $5\times10^{17}$ atoms/cm$^3$ representatively).

Figure 9B:
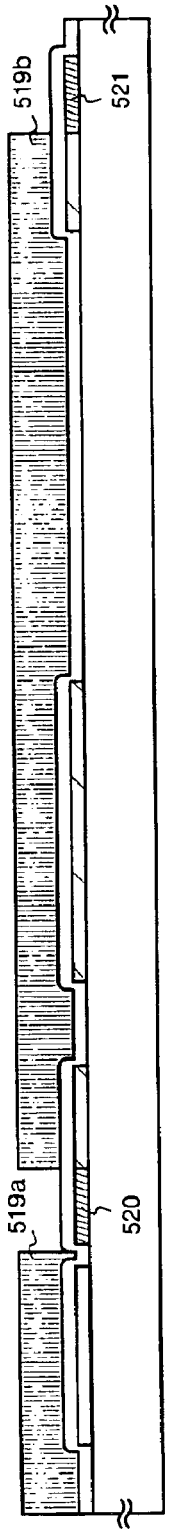

Thereafter, resist masks 519a and 519b are formed as shown in FIG. 9B, and an impurity element (hereinafter, designated as n-type impurity element) that gives the n-type through the medium of the gate insulating film 514 is added. As the n-type impurity element, an element that belongs to 15-group representatively, phosphorus or arsenic typically, can be used. In this embodiment, a plasma doping method in which plasma excitation is performed without the mass separation of phosphine ($PH_3$) is used. Phosphorus is added in the concentration of $1\times10^{18}$ atoms/cm$^3$. The ion implantation method that performs mass separation can be used, of course.

A dose amount is adjusted so that the n-type impurity element is included in the n-type impurity regions 520, 521 formed by this process at the concentration of $2\times10^{16}$–$5\times10^{19}$ atoms/cm$^3$ ($5\times10^{17}$–$5\times10^{18}$ atoms/cm$^3$ representatively).

Figure 9C:
Figure 9D:
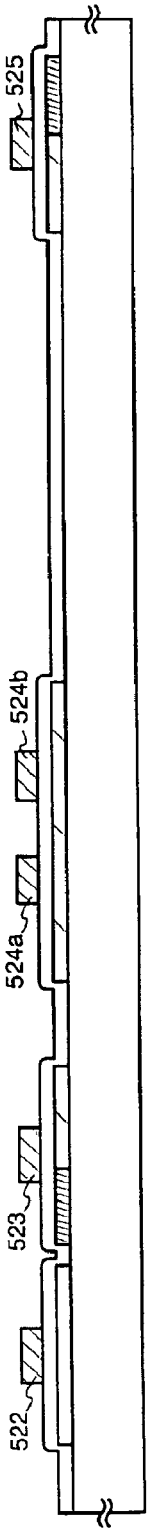

Thereafter, a process is performed for activating the added n-type impurity element and the added p-type impurity element as shown in FIG. 9C. There is no need to limit the activation means, but, since the gate insulating film 514 is disposed, the furnace annealing process that uses an electrothermal furnace is desirable. Additionally, it is preferable to perform heat processing at a temperature as high as possible because there is a possibility of having damaged the interface between the active layer and the gate insulating film of a part that is a channel formation region in the process of FIG. 9A.

Since the crystallized glass with high heat resistance is used in this embodiment, the activating process is performed by the furnace annealing processing at 800° C. for 1 hour. The thermal oxidation can be performed keeping a processing atmosphere in an oxidizing atmosphere, or the heat processing can be performed in an inert atmosphere.

This process clarifies the edge of the n-type impurity regions 520, 521, namely, the boundary Junction) between the n-type impurity regions 520, 521 and the region (p-type impurity region formed by the process of FIG. 9A) around the n-type impurity regions 520, 521, where the n-type impurity element is not added. This means that the LDD region and the channel formation region can form an excellent junction when a TFT is later completed.

Thereafter, a conductive film 200–400 nm thick is formed, and patterning is performed, so that gate electrodes 522-525 are formed. According to the width of gate electrodes 522 to 525, the channel length of each TFTs are decided.

The gate electrode can be made of a conductive film of a single-layer preferably, a lamination film, such as two-layer or three-layer film, is used when necessary. Specifically, use can be made of a film of an element selected from the group of consisting of aluminum (Al), tantalum (Ta), titanium (Ti), molybdenum (Mo), tungsten (W), chrome (Cr), and silicon (Si); a film of a nitride of the aforementioned elements (tantalum nitride film, tungsten nitride film, or titanium nitride film representatively); an alloy film of a combination of the aforementioned elements (Mo—W alloy or Mo—Ta alloy representatively); or, a silicide film of the aforementioned elements (tungsten silicide film or titanium silicide film representatively). They can have a single-layer structure or a lamination-layer structure, of course.

In this embodiment, a lamination film is used that is made of a tungsten nitride (WN) film 50 nm thick and a tungsten (W) film 350 nm thick. This can be formed by the sputtering method. By adding an inert gas, such as Xe or Ne, as a spattering gas, the film can be prevented from peeling off because of stress.

At this time, the gate electrodes 523, 525 are formed to overlap with part of the n-type impurity regions 520, 521, respectively, with the gate insulating film 514 therebetween. The overlapping part is later made an LDD region overlapping with the gate electrode. According to the sectional view of the figure, the gate electrodes 524a and 524b are seen as separate, in fact, they are connected electrically to each other.

Thereafter, with the gate electrodes 522–525 as masks, an n-type impurity element (phosphorus in this embodiment) is added self-adjustably, as shown in FIG. 1A. At this time, an adjustment is performed so that phosphorus is added to the thus formed impurity regions 527–533 at the concentration of ½–¹⁄₁₀(⅓–¼ representatively) of that of the n-type impurity regions 520, 521. Preferably, the concentration is $1\times10^{16}$–$5\times10^{18}$ atoms/cm$^3$ ($3\times10^{17}$–$3\times10^{18}$ atoms/cm$^3$ typically).

Thereafter, as shown in FIG. 10B, resist masks 534a–534d are formed to cover the gate electrode, an r-type impurity element (phosphorus in this embodiment) is then added, and impurity regions 535-541 including a high concentration of phosphorus are formed. The ion dope method using phosphine ($PH_3$) is applied also herein, and an adjustment is performed in order that the concentration of phosphorus in these regions is $1\times10^{20}$–$1\times10^{21}$ atoms/cm$^3$ ($2\times10^{20}$–$5\times10^{20}$ atoms/cm$^3$ representatively).

A source region or a drain region of the n-channel type TFT is formed through this process, and the switching TFT leaves a part of the n-type impurity regions 530–532 formed in the process of FIG. 10A. The left region corresponds to the LDD regions of the switching Thereafter, as shown in FIG. 10C, the resist masks 534a–534d are removed, and a resist mask 543 is newly formed. A p-type impurity element (boron in this embodiment) is then added, and impurity regions 544, 545 including a high concentration of boron are formed. Herein, according to the ion dope method using diborane ($B_2H_6$), boron is added to obtain a concentration of $3 \times 10^{20}$–$3 \times 10^{21}$ atoms/cm$^3$ ($5 \times 10^{20}$14 $1 \times 10^{21}$ atoms/cm$^3$ representatively).

Phosphorus has been already added to the impurity regions 544,545 at a concentration of $1 \times 10^{20}$–$1 \times 10^{21}$ atoms/cm$^3$. Boron added herein has at least three times as high concentration as the added phosphorus. Therefore, the impurity region of the n-type formed beforehand is completely changed into that of the p-type, and functions as an impurity region of the p-type.

Thereafter, as shown in FIG. 10D, the resist mask 543 is removed, and then a first interlayer insulating film 546 is formed. As the first interlayer insulating film 546, an insulating film that includes silicon is used in the form of a single-layer structure or a laminate structure as a combination thereof. The film thickness thereof can be 400 nm–1.5 $\mu$m. In this embodiment, a structure is created in which an 800 nm-thick silicon oxide film is stacked on a 200 nm-thick silicon nitride oxide film.

Thereafter, the n-type or p-type impurity element added at each concentration is activated. The furnace annealing method is desirable as an activation means. In this embodiment, heat treatment is performed at 550° C. for 4 hours in a nitrogen atmosphere in an electro-thermal furnace.

Heat treatment is further performed at 300–450° C. for 1–12 hours in an atmosphere that includes hydrogen of 3–100% for hydrogenation. This is a process to hydrogen-terminate an unpaired connector of a semiconductor film by thermally excited hydrogen. As another means for hydrogenation, plasma hydrogenation (hydrogen excited by plasma is used) can be performed.

Hydrogenation can be performed during the formation of the first interlayer insulating film 546. In more detail, the 200 nm-thick silicon nitride oxide film is formed, and hydrogenation is performed as mentioned above, and thereafter the remaining 800 nm-thick silicon oxide film can be formed.

Figure 11A:
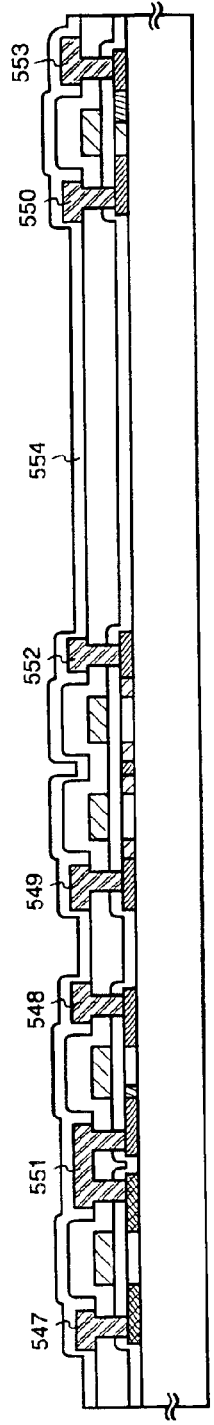
FIGS. 11A to 11C are views showing the process of manufacturing the EL display.

Thereafter, as shown in FIG. 11A, contact holes are made in the first interlayer insulating film 546, and source wiring lines 547–550 and drain wiring lines 551–553 are formed. In this embodiment, this electrode is formed with a lamination film of a three-layer structure in which a 100 nm-thick Ti film, a 300 nm-thick aluminum film that includes Ti, and a 150 nm-thick Ti film are continuously formed according to the sputtering method. Other conductive films can be used, of course.

Thereafter, a first passivation film 554 is formed to be 50–500 nm thick (200–300 nm thick representatively). In this embodiment, a 300 nm-thick silicon nitride oxide film is used as the first passivation film 554. A silicon nitride film can be substituted for this.

At this time, it is effective to perform plasma treatment by the use of gas that includes hydrogen, such as $H_2$ or $NH_3$, prior to the formation of the silicon nitride oxide film. Hydrogen excited by this pre-process is supplied to the first interlayer insulating film 546, and, through heat treatment, the film quality of the first passivation film 554 is improved. At the same time, since hydrogen that is added to the first interlayer insulating film 546 diffuses onto the lower side, the active layer can be effectively hydrogenated.

Figure 11B:
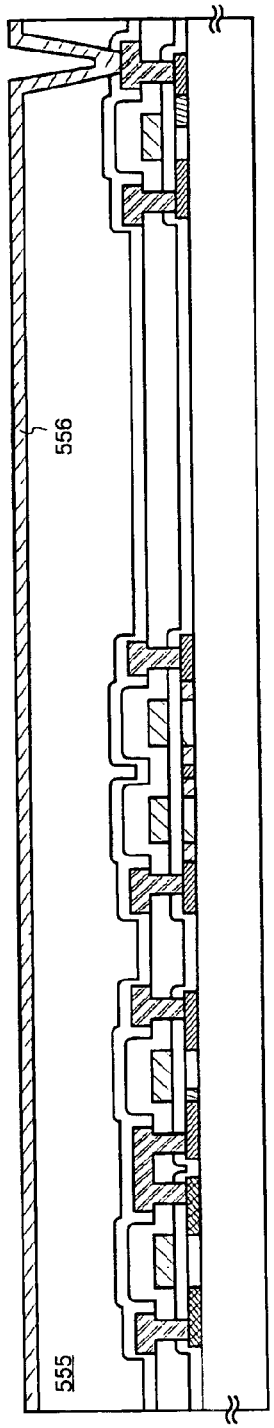

Thereafter, as shown in FIG. 11B, a second interlayer insulating film 555 made of organic resin is formed. Polyimide, acrylic fiber, or BCB (benzocyclobutene) can be used as the organic resin. Especially, since the second interlayer insulating film 555 is required to flatten the level differences formed by TFTs, an acrylic film excellent in smoothness is desirable. An acrylic film is formed to be 2.5 $\mu$m thick in this embodiment.

Thereafter, contact holes that reach the drain wiring line 553 are made in the second interlayer insulating film 555 and the first passivation film 553, and a protective electrode 556 is formed. A conductive film which is made of almost aluminum can be used as protective electrode 556. A protective electrode 556 can be made by vacuum deposition method.

Thereafter, an insulating film (a silicon oxide film in this embodiment) that includes silicon is formed to be 500 nm thick, an opening is then formed at the position corresponding to the pixel electrode, and a third interlayer insulating film 557 is formed. It is possible to easily form a tapered sidewall by using the wet etching method when the opening is formed. If the sidewall of the opening does not have a sufficiently gentle slope, deterioration of the EL layer caused by level differences will lead to an important problem.

Thereafter, a cathode (MgAg electrode) 558 is continuously formed by the vacuum deposition method. Preferably, the thickness of the cathode 558 is 180–300 nm (200–250 nm typically).

Next, an EL layer 559 is made without air exposure by the vacuum deposition method. The film thickness of the EL layer 559 is 800–200 nm (100–120 nm typically), and that of the pixel electrode (anode) 560 can be 110 nm.

In this process, an EL layer and a pixel electrode (anode) are sequentially formed for a pixel corresponding to red, a pixel corresponding to green, and a pixel corresponding to blue. However, since the EL layer is poor in tolerance to solutions, they must be independently formed for each color without using the photolithography technique. Thus, it is preferable to conceal pixels except a desired one by the use of the metal mask, and selectively form an EL layer and a pixel electrode (anode) for the desired pixel.

In detail, a mask is first set for concealing all pixels except a pixel corresponding to red, and an EL layer and a pixel electrode (anode) of red luminescence are selectively formed by the mask. Thereafter, a mask is set for concealing all pixels except a pixel corresponding to green, and an EL layer and pixel electrode (anode) of green luminescence are selectively formed by the mask. Thereafter, as above, a mask is set for concealing all pixels except a pixel corresponding to blue, and an EL layer and a pixel electrode (anode) of blue luminescence are selectively formed by the mask. In this case, the different masks are used for the respective colors. Instead, the same mask may be used for them. Preferably, processing is performed without breaking the vacuum until the EL layer and the pixel electrode (anode) are formed for all the pixels. Preferably, it is continuously formed without air exposure after the EL layer and the pixel electrode (anode) are formed.

A known material can be used for the EL layer 559. Preferably, as a known materials, that is an organic material in consideration of driving voltage. For example, the EL layer can be formed with a four-layer structure consisting of a positive hole injection layer, a positive hole transporting layer, a luminescent layer, and an electronic injection layer. Further, as the EL element of pixel electrode (cathode) 560, indium oxide and tin oxide (ITO) film is formed. A transparent conductive layer which is mixed zinc oxide (ZnO) of 2–20% can be used to indium oxide. Other known material can be used.

Lastly, the second passivation film 561 made of silicon nitride film is formed 300 nm thick.

Figure 11C:
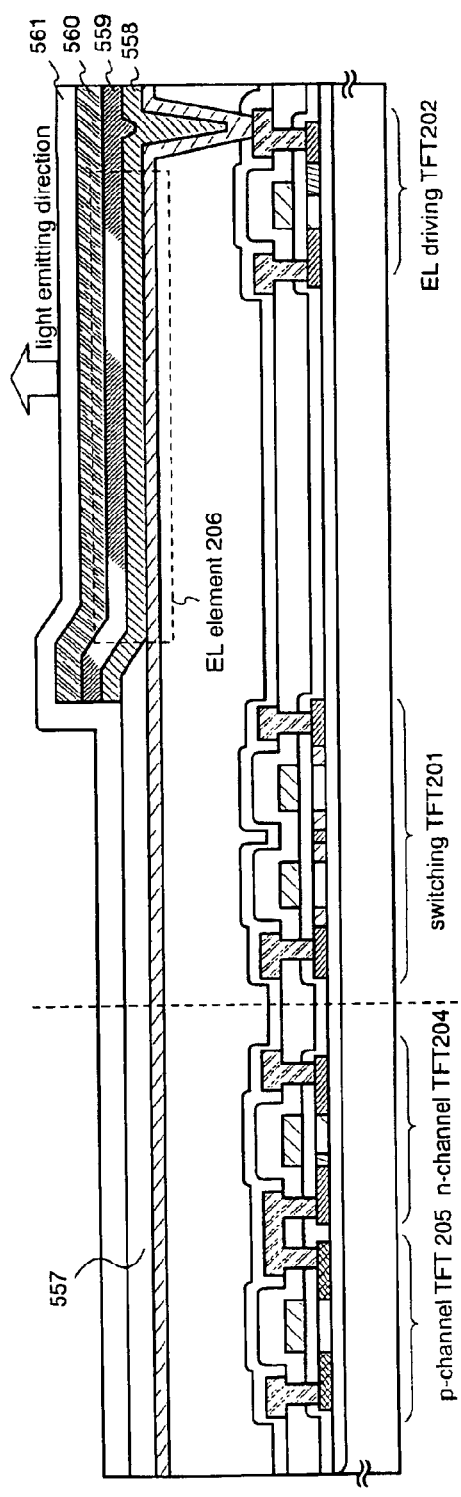

An EL display device constructed as shown in FIG. 11C is completed. In practice, preferably, the device is packaged (sealed) by a highly airtight protective film (laminate film, ultraviolet cured resin film, etc.) or a housing material such as a ceramic sealing can, in order not to be exposed to the air when completed as shown in FIG. 11C. In that situation, the reliability (life) of the EL layer is improved by making the inside of the housing material an inert atmosphere or by placing a hygroscopic material (for example, barium oxide) therein.

After airtightness is improved by, for example, packaging, a connector (flexible print circuit: FPC) for connecting a terminal drawn from the element or circuit formed on the substrate to an external signal terminal is attached, and a product is completed. In this specification, the EL display device, thus wholly prepared for market, is called EL module.

The structure shown in this embodiment can be freely combined with embodiment 1 or embodiment 2.

[Embodiment 6]

Figure 12:
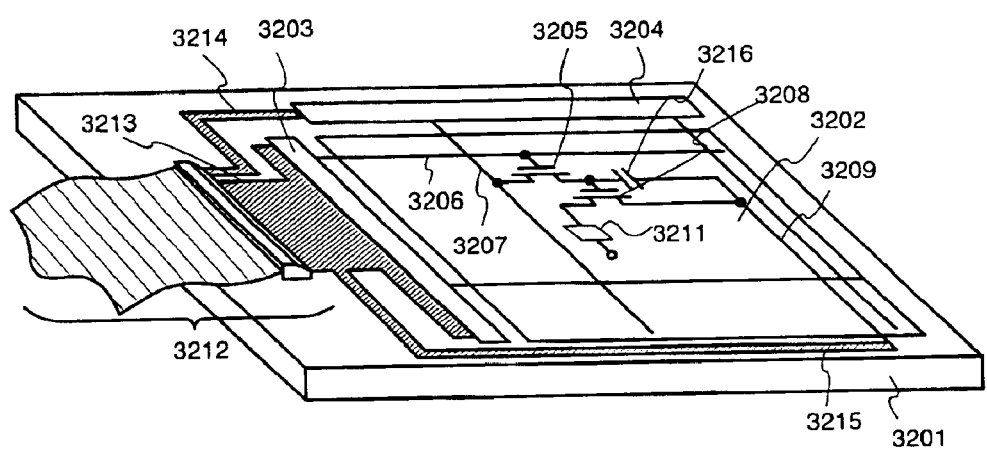
FIG. 12 is a view showing an external appearance of an EL module.

In Embodiment 6, a structure of the EL display will be explained by using a perspective view of FIG. 12.

The EL display according to Embodiment 6 formed on a glass substrate 3201 comprises a pixel portion 3202, a gate signal side driver circuit 3203, a source signal side driver circuit 3204. The switching TFT 3205 of the pixel portion 3202 is an n-channel type TFT and is arranged on a cross point of the gate signal line 3206 connected to the gate signal side driver circuit 3203 and of the source signal line 3207 connected to the source signal side driver circuit 3204. Furthermore, the drain region of the switching TFT 3205 is connected to the gate of the EL driving TFT 3208.

Furthermore, the source region of the EL driving TFT 3208 is connected to the power source supply line 3209. Furthermore, a capacitor 3216 connected to the gate region of the EL driving TFT 3208 and the power source supply line 3209 is provided. In Embodiment 6, the power source potential is applied to the power source supply line 3209. In addition, the opposite electrode (the cathode in Embodiment 6) of the EL element 3211 is held at this stationary potential (0 V in Embodiment 6).

Then, on an FPC 3212 which serves as an external input and output terminal, input and output wirings (connection wirings) 3213, 3214 for transmitting a signal to a driver circuit and an input and output wiring 3215 connected to the power source supply line 3209, are provided.

Figure 13A:
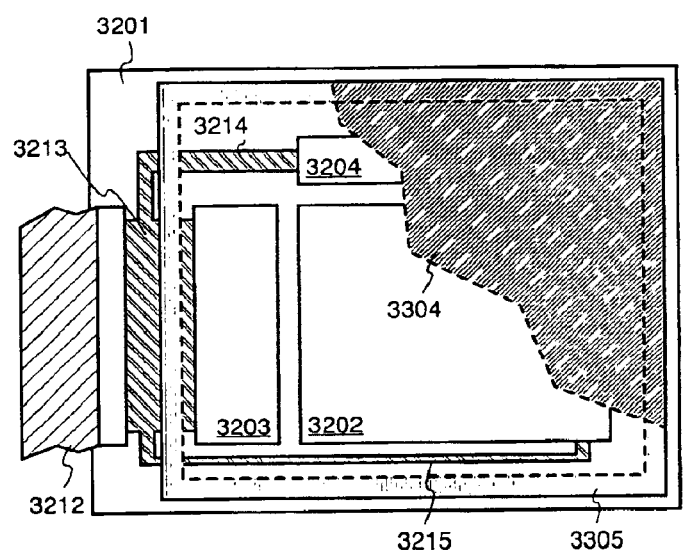
FIGS. 13A and 13B are views showing the external appearances of the EL module.

Furthermore, the EL module according to Embodiment 6 including a housing material will be explained by using FIGS. 13A and 13B. Note that, depending upon the need, reference numeral used in FIG. 12 will be cited.

On the glass substrate 3201, a pixel portion 3202, a gate signal side driver circuit 3203 and a source signal side driver circuit 3204 are formed. Each kind of wiring from respective driver circuits is extended to the FPC 3212 via the input and output wirings 3213 to 3215 and is connected to the external device.

At this time, the housing material 3304 is provided in such a manner at least that the pixel portion 3202, preferably the driver circuits 3203 and 3204 and the pixel portion 3302 are surrounded by the housing material 3304. Note that, the housing material 3304 has a configuration having a recessed portion with an inner diameter larger than the external diameter of the EL element or a sheet configuration, so that the housing material is fixed on the glass substrate 3201 by an adhesive 3305, in such a manner that a closed space is formed in cooperation with the glass substrate 3201. At this time, the EL element is being closed in the closed space to be completely shielded from the external atmosphere. Note that, the housing materials 3304 may be provided in plurality.

Furthermore, the material quality of the housing material 3304 is preferably an insulation material such as glass, polymer or the like. For example, non-crystal glass (borosilicate glass, quartz or the like), crystalline glass, ceramic glass, organic resin (acrylic resin, styrene resin, polycarbonate resin, epoxy resin or the like) and silicone resin can be given. Furthermore, ceramics may be used. Furthermore, when the adhesive 3305 is an insulation material, a metal material such as stainless alloy or the like can be used as well.

Furthermore, bonding agents epoxy resin, acrylate resin or the like can be used as the material quality of the adhesive 3305. Furthermore, it is possible to use thermosetting resin, and light-setting resin as the bonding agent. However, it is required that the material is of quality which does not permeate oxygen or water as much as possible.

Furthermore, it is desired that a gap 3306 between the housing material 3304 and the glass substrate 3201 is filled with inert gas (argon, helium, nitrogen or the like). Besides, it is also possible to use inert liquid (liquid carbon fluoride or the like represented by perfluoroalkane) in addition to gas. With respect to inert liquid, the material used in Japanese Patent Application Laid-open No. 8-78519 may be used.

Furthermore, it is also effective to provide a dry agent in the gap 3306. As the dry agent, a material described in Japanese Patent Application Laid-open No. 9-148006 can be used. Generally, barium oxide is used.

Figure 13B:
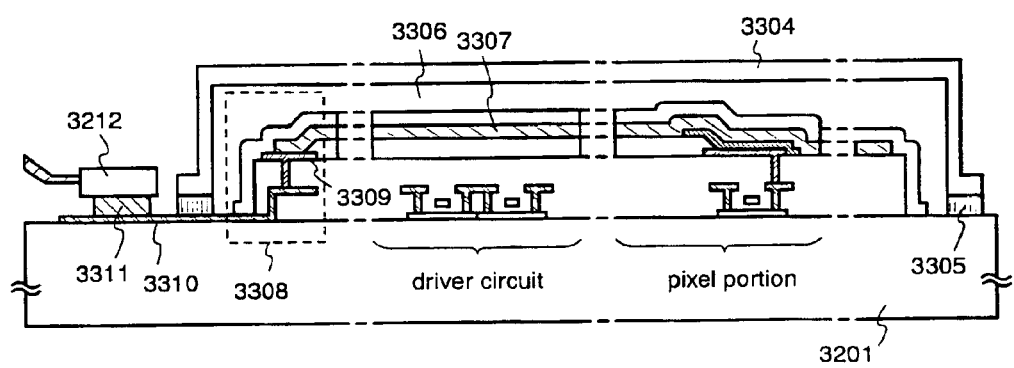
Figure 15:
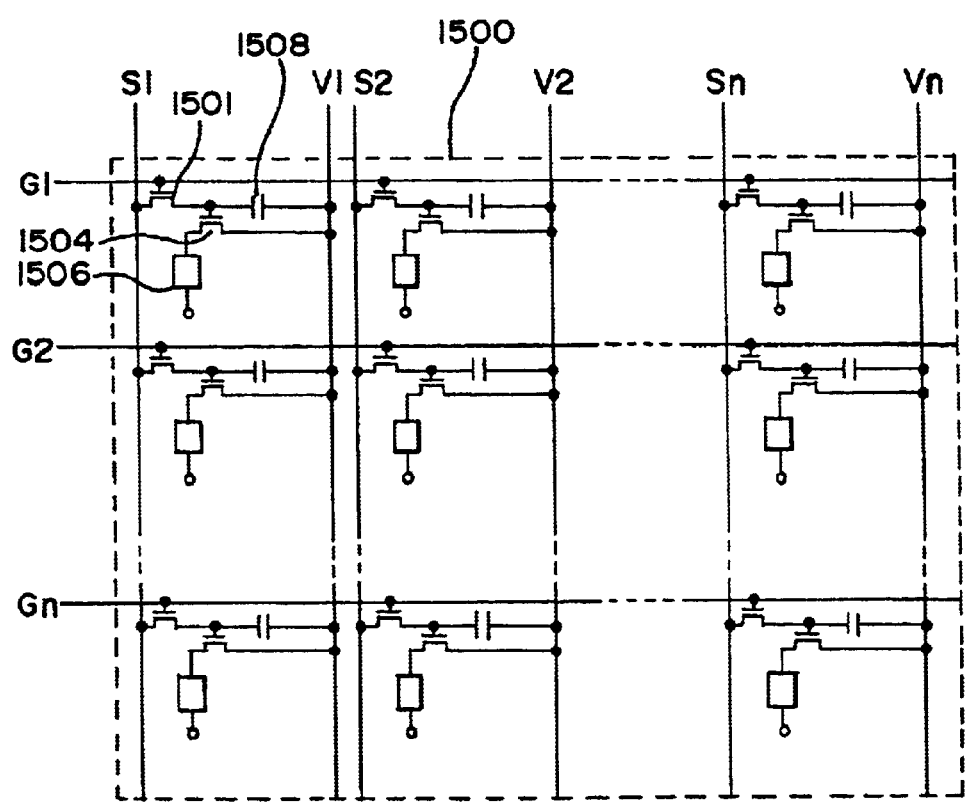
FIG. 15 is a circuit diagram of the pixel portion of an EL display.
Figure 16:
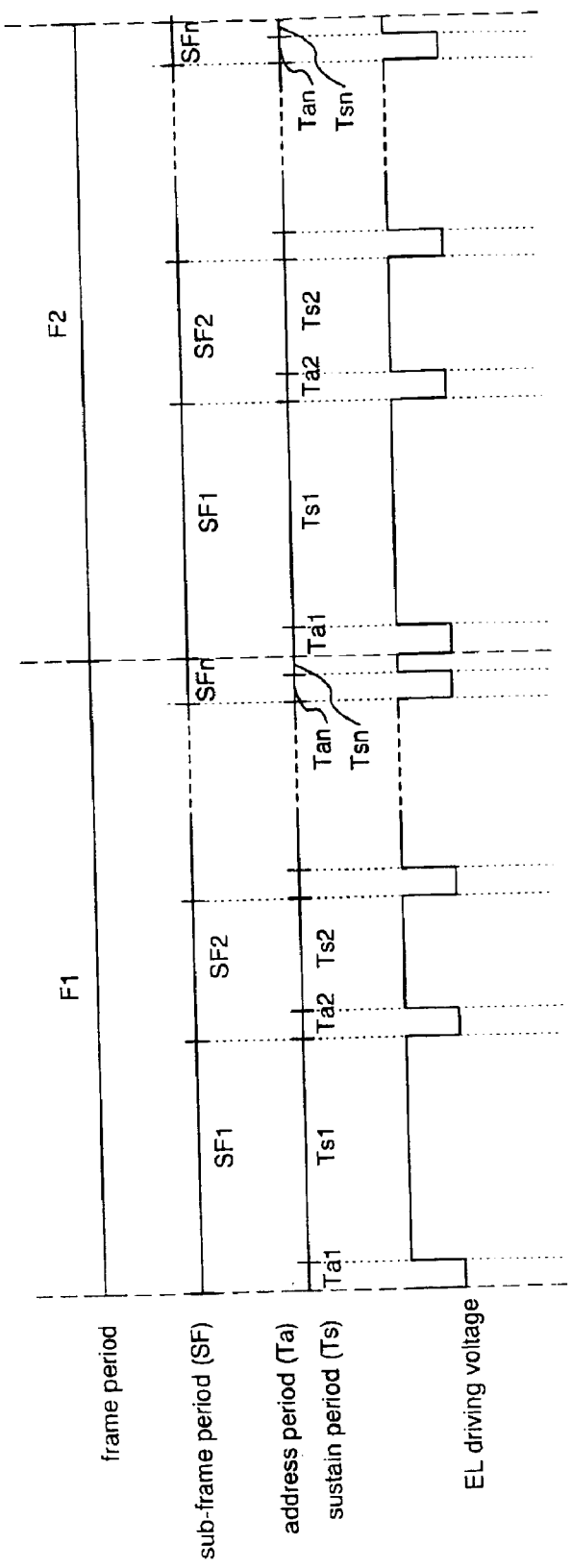
FIG. 16 is a conventional timing chart showing driving with the alternate current.

Note that, as shown in FIG. 13B, on the pixel portion, a plurality of pixels are provided which have individually isolated EL element. These pixels have all protection electrodes 3307 as common electrodes. In Embodiment 6, it is described that preferably the EL layer, the cathode (an MgAg electrode) and the protection electrode are continuously formed without air release. Though the EL layer and the cathode are formed of the same mask material, only the protection electrode may be formed of a different mask material.

At this time, the EL layer and the cathode needs to be provided only on the pixel portion. It is not required that the EL layer and the cathode are provided on the driver circuit. Needless to say, no problem arises when the EL layer and the cathode are provided on the driver circuit. When it is considered that the EL layer includes alkaline metal, preferably the EL layer and the cathode are not provided on the driver circuit.

Note that, the protection electrode 3307 is connected to the input and output wiring 3310 via a connection wiring 3309 formed of the same material as the pixel electrode in the region shown by reference numeral 3308. The input and output wiring 3310 is a power source supply line for applying a power source potential to the protection electrode 3307, and is connected to the FPC 3212 via the conductive paste material 3311.

The structure shown in Embodiment 6 can be put into effect in a free combination with Embodiment 1.

[Embodiment 7]

In Embodiment 7, there will be explained a structure of a pixel of an EL display according to the present invention.

Figure 17A:
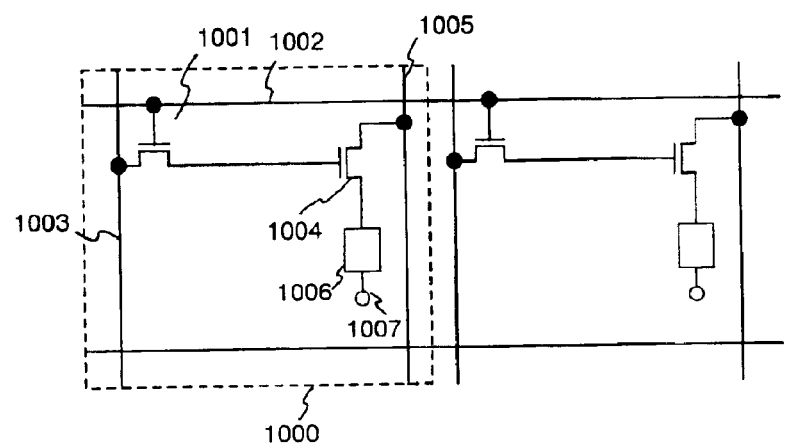
FIGS. 17A and 17B are circuit diagrams showing a pixel portion of the EL display according to the present invention.

On the pixel portion of the EL display according to the present invention, a plurality of pixels are arranged in a matrix-like configuration. FIG. 17A shows an example of a circuit diagram of the pixel. In the pixel 1000, a switching TFT 1001 is provided in FIG. 17A. Note that, in the present invention, as a switching TFT 1001, either an n-channel type TFT or a p-channel type TFT may be used. In FIG. 17A, the n-channel type TFT is used as the switching TFT 1001. The gate electrode of the switching TFT 1001 is connected to the gate signal line 1002 for inputting a gate signal. One of the source region and the drain region of the switching TFT 1001 is connected to the data signal line (also referred to as source signal line) 1003 for inputting either an analog or a digital video signal while the other is connected to the gate electrode of the EL driving TFT 1004.

One of the source region and the drain region of the EL driving TFT 1004 is connected to the power source supply line 1005 while the other is connected to the EL element 1006.

The EL element 1006 comprises an anode, a cathode an EL layer provided between the anode and the cathode. Note that, according to the present invention, in the case where the anode is a pixel electrode and the cathode is an opposite electrode, either the source region or the drain region of the EL driving TFT 1004 is connected to the anode of the EL element 1006. On the contrary, in the case where the anode is the opposite electrode and the is the pixel electrode, either the source region or the drain region of the EL driving TFT is connected to the cathode of the EL element 1006. Note that, as the EL driving TFT 1004, either n-channel type TFT or p-channel type TFT may be used. However, in the case where the anode of the EL element 1006 is the pixel electrode and the cathode is the opposite electrode, it is preferable that the EL driving TFT 1004 is the p-channel type. TFT. Furthermore, on the contrary, in the case where the anode of the EL element 1006 is the opposite electrode, and the cathode is the pixel electrode, it is preferable that the EL driving TFT 1004 is an n-channel type TFT. In FIG. 17A, the p-channel type TFT is used as the EL driving TFT 1004. The cathode of the EL element 1006 is connected to the stationary power source 1007.

Furthermore, an LDD region may be provided in the active layer of the EL driving TFT 1004, and a region (an Lov region) may be formed wherein the LDD region and the gate electrode are overlapped via the gate insulating film. In the case where the EL driving TFT 1004 is particularly the n-channel type TFT, the Lov region is formed on the side of the drain region of the active layer, with the result that the on current can be increased, and a capacity can be further formed between the gate electrode of the EL driving TFT 1004 and the Lov region.

Furthermore, in the case where the switching TFT 1001 is set in the non-selection state (off state), a capacitor may be provided to hold the gate voltage of the EL driving TFT 1004. In the case where the capacitor is provided, the capacitor is connected between the side of the source region or the drain region of the switching TFT 1001 which is not connected to the source signal line, and the power supply line 1005. In a circuit diagram shown in FIG. 17A, the power source supply line 1005 is arranged in parallel with the source signal line 1003.

In order to use the Lov region of the EL driving TFT as a capacitor for holding the gate voltage of the EL driving TFT 1004, a capacity value of about 19.8 fF is required in the case where the pixel size is 22 $\mu m \times 22$ $\mu m$, the thickness of the gate insulating film is 800 Å and the relative dielectric constant of the gate insulating film is 4.1. Consequently, as the area of the Lov region (an area in which the LDD region and the gate electrode are overlapped via the gate insulating film), an area of about 66 $\mu m^2$ is required.

Figure 18A:
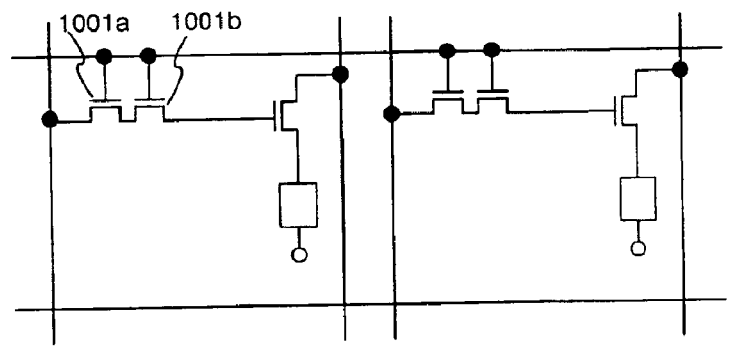
FIGS. 18A and 18B are circuit diagrams showing the pixel portion of the EL display according to the present invention.

Note that, in the circuit diagram shown in FIG. 17A, either the switching TFT 1001 or the EL driving TFT 1004 may be formed into a multi-gate structure (a structure including an active layer having two or more channel formation regions connected in series). FIG. 18A shows a circuit diagram of a pixel in which the switching TFT 1001 of the pixel shown in FIG. 17A is formed into a multi-gate structure.

The switching TFT 1001a and the switching TFT 1001b are connected in series to be provided in FIG. 18A. Except for the switching TFT 1001a and the switching TFT 1001b, the structure is the same as the circuit diagram shown in FIG. 17A. By forming the switching TFT into a multi-gate structure (a structure including an active layer having two or more channel formation regions connected in series), the off current can be decreased. Note that, in FIG. 18A a double-gate structure is adopted. However, Embodiment 7 is not restricted to the double-gate. Any multi-gate structure may be used.

Besides, though not shown, in the case where the EL driving TFT is formed into a multi-gate structure, the deterioration of the EL driving TFT by heat can be suppressed.

Figure 17B:
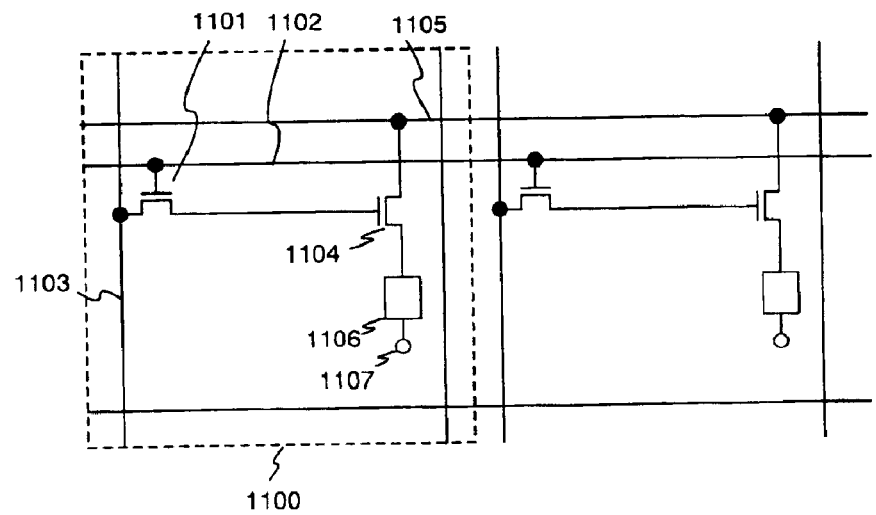

Next, FIG. 17B shows another example of the circuit diagram of the pixel according to the present invention. In FIG. 17B, the switching TFT 1101 is provided in the pixel 1100. Note that, in the present invention, either the n-channel type TFT or the p-channel type TFT may be used as the switching TFT 1101. In FIG. 17B, the n-channel type TFT is used as the switching TFT 1101. The gate electrode of the switching TFT 1101 is connected to the gate signal line 1102 for inputting the gate signal. One of the source region and the drain region of the switching TFT 1101 is connected to the digital data signal line (also referred to as a source signal line) 1103 for inputting either an analog or a digital video signal while the other is connected to the gate electrode of the EL driving TFT 1104.

Then, one of the source region and the drain region of the EL driving TFT 1104 is connected to the power source supply line 1105 while the other is connected to the EL element 1106.

The EL element 1106 comprises an anode, a cathode and an EL layer provided between the positive layer and the negative layer. Note that, in the present invention, in the case where the anode is the pixel electrode and the cathode is the opposite electrode, either the source region or the drain region of the EL driving TFT 1104 is connected to the anode of the EL element 1106. On the contrary, in the case where the anode is the opposite electrode and the cathode is the pixel electrode, either the source region or the drain region of the EL driving TFT 1104 is connected to the cathode of the EL element 1106. Note that, as the EL driving TFT 1104, either the n-channel type TFT or the p-channel type TFT may be used. However, in the case where the anode of the EL element 1106 is the pixel electrode and the cathode thereof is the opposite electrode, it is preferable that the EL driving TFT 1104 is the p-channel type TFT. Furthermore, on the contrary, in the case where the anode of the EL element 1106 is the opposite electrode and the cathode thereof is the pixel electrode, it is preferable that the EL driving TFT 1104 is the n-channel type TFT. In FIG. 17B, the p-channel type TFT is used in the EL driving TFT 1104. The cathode of the EL element 1106 is connected to the stationary power source 1107.

Besides, the LDD region is provided in the active layer of the EL driving TFT 1104 so that a region (Lov region) may be formed wherein the LDD region and the gate electrode are overlapped via the gate insulating film. In the case where the EL driving TFT 1104 is particularly the n-channel type TFT, the on current can be increased by forming the Lov region on the side of the drain region in the active layer. Furthermore, a capacity may be formed between the gate electrode of the EL driving TFT 1104 and the Lov region.

Furthermore, when the switching TFT 1101 is set in the non-selection state (off state), a capacitor may be provided to hold the gate voltage of the EL driving TFT 1104. In the case where the capacitor is provided, the capacitor is connected between the side of the source region or the drain region of the switching TFT 1101 which is not connected to the source signal line, and the power source supply line 1105. In the circuit diagram shown in FIG. 17B, the power source supply line 1105 and the gate signal line 1102 are arranged in parallel.

Figure 18B:
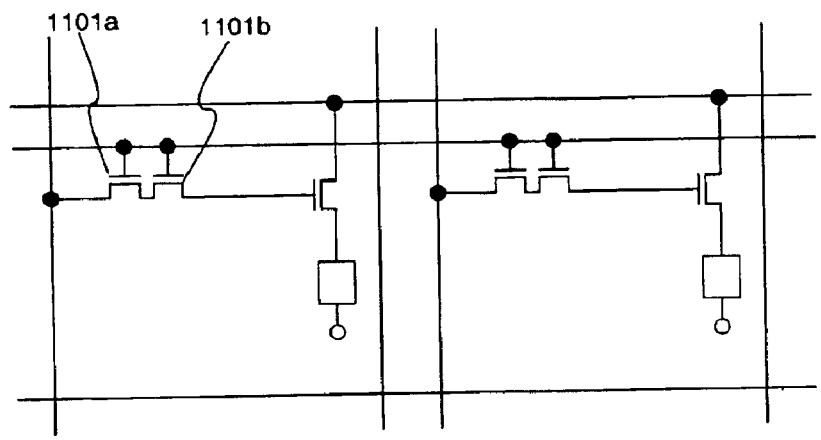

Note that, in the circuit diagram shown in FIG. 17B, either the switching TFT 1101 or the EL driving TFT 1104 may be formed into a multi-gate structure. FIG. 18B shows a circuit diagram of a pixel in which the switching TFT 1101 of the pixel shown in FIG. 17B is formed into a multi-gate structure.

The switching TFT 1101a and the switching TFT 1101b are connected in series and provided. Except for the switching TFTs 1101a and 1101b, the structure is the same as the circuit diagram shown in FIG. 17B. The off current can be lowered by forming the switching TFT into the multi-gate structure. Note that, a double-gate structure is provided in FIGS. 18A and 18B. However, the embodiment is not restricted to the double-gate structure. Any multi-gate structure may be used.

Besides, though not shown, in the case where the EL driving TFT is formed in a multi-gate structure, the deterioration of the EL driving TFT by heat can be suppressed.

Figure 19A:
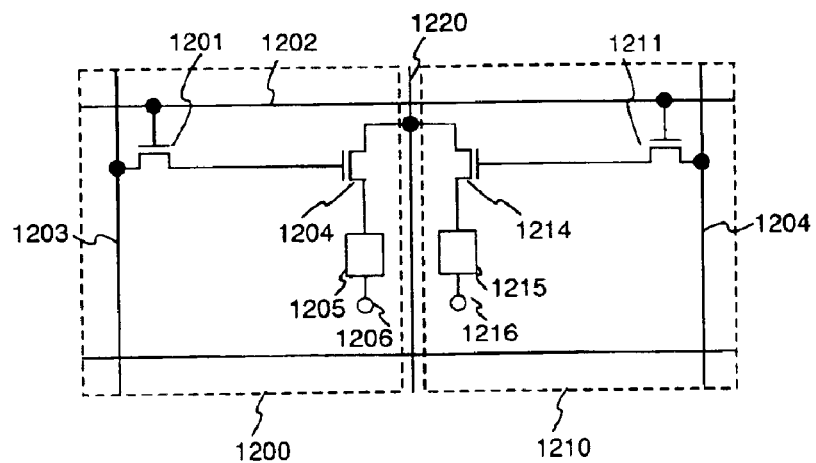
FIGS. 19A and 19B are circuit diagrams showing the pixel portion of the EL display according to the present invention.

Next, FIG. 19A shows another example of a circuit diagram of a pixel according to the present invention. In FIG. 19A, the pixel 1200 and the pixel 1210 are provided adjacent to each other. In FIG. 19A, reference numerals 1201 and 1211 denote switching TFTs Note that, in the present invention, as switching TFTs 1201 and 1211 either the n-channel type TFT or the p-channel type TFT may be used. In FIG. 19A, the n-channel type TFT is used in the switching TFT 1201 and the switching TFT 1211. The gate electrodes of the switching TFTs 1201 and 1211 are connected to the gate signal line 1202 for inputting the gate signal. One of the source region and the drain region of the switching TFTs is connected to the data signal line (hereinafter referred to as a source signal line) for inputting an analog 1203 or a digital video signal 1204 while the other is connected to the gate electrodes of the EL driving TFTs 1204 and 1214, respectively.

Then, one of the source region and the drain region of the EL driving TFTs 1204 and 1214 is connected to the power source supply line 1220 while the other is connected to the EL elements 1205 and 1215, respectively. In this manner, in Embodiment 7, two adjacent pixels share one power source supply line 1220. As a consequence, as compared with the structure shown in FIG. 17A to FIG. 18B, the number of the power source supply lines can be decreased. When the ratio of the wiring with respect to the whole pixel portion is small, the light shielding by the wiring can be suppressed in the case where the wiring is provided in a direction of the light emission of the EL layer.

The EL elements 1205 and 1215 comprise an anode, a cathode, and an EL layer provided between the anode and the cathode respectively. Note that, according to the present invention, in the case where the anode is the pixel electrode and the cathode is the opposite electrode, either the source region or the drain region of the EL driving TFTs 1204 and the 1214 is connected to the anodes of the EL elements 1205 and 1215. On the contrary, in the case where the anode is the opposite electrode and the cathode is the pixel electrode, either the source region or the drain region of the EL driving TFTs 1204 and 1214 is connected to the cathodes of the EL elements 1205 and 1215. Note that, as the EL driving TFTs 1204 and 1214, either the n-channel type TFT or the p-channel type TFT may be used. However, in the case where the anodes of the EL elements 1205 and 1215 are pixel electrodes while the cathodes thereof are opposite electrodes, it is preferable that the EL driving TFTs 1204 and is 1214 are the p-channel type TFTs. Besides, on the contrary, in the case where the anodes of the EL elements 1205 and 1215 are the opposite electrodes and the cathodes thereof are the pixel electrodes, preferably the EL driving TFTs 1204 and 1214 are n-channel type TFTs. In FIG. 19A, as the EL driving TFTs 1204 and 1214, the p-channel type TFTs are used. The cathodes of the EL elements 1205 and 1215 are connected to the stationary power sources 1206 and 1216.

Furthermore, an LDD region is provided in the active layers of the EL driving TFTs 1204 and 1214 with the result that a region (a Lov region) may be formed wherein the LDD region and the gate electrode overlaps via the gate insulating film. In the case where the EL driving TFT 1204 is particularly the n-channel type TFT, the on current can be increased by forming the Lov region on the side of the drain region of the active layer with the result that the capacity can be formed between the gate electrode of the EL driving TFT 1204 and the Lov region.

Furthermore, when the switching TFT 1201 and 1211 are set in the non-selection state (off state), a capacitor may be provided for holding the gate voltage of the EL driving TFTs 1204 and 1214. In the case where the capacitor is provided, the capacitor may be connected between the side of the drain region or the source region which is not connected to the source signal line and the power source supply line 1220.

Figure 20A:
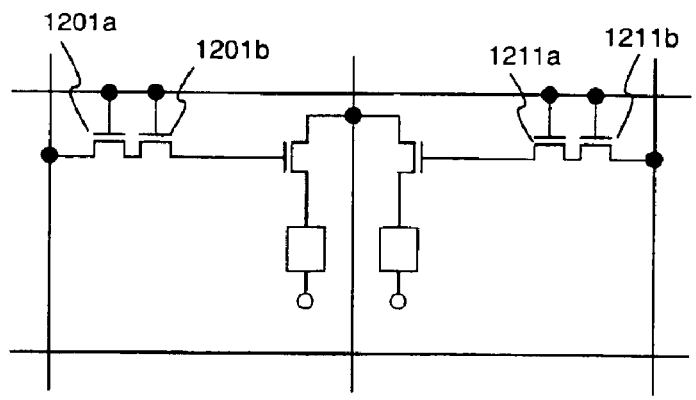
FIGS. 20A and 20B are circuit diagrams showing the pixel portion of the EL display according to the present invention.

Note that, in a circuit diagram shown in FIG. 19A, the switching TFT 1201 and 1211, or the EL driving TFT 1204 and 1214 may be formed into a multi-gate structure. FIG. 20A shows a circuit diagram of a pixel in which the switching TFTs 1201 and 1211 are formed into the multigate structure of a pixel shown in FIG. 19A.

The switching TFT 1201a and the switching TFT 1201b are connected in series to be provided. Furthermore, the switching TFT 1211a and the switching TFT 1211b are connected in series to be provided. Except for the switching TFTs 1201a and 1201b, and the switching TFTs 1211a and 1211b, the structure is the same as the circuit diagram shown in FIG. 19A. The off current can be lowered by forming the switching TFT into a multi-gate structure. Note that, in FIG. 20A, a double-gate structure is adopted, but Embodiment 7 is not limited to the double-gate structure. Any multi-gate structure may be used.

Besides, though not shown, in the case where the EL driving TFT is formed into a multi-gate structure, the deterioration of the EL driving TFT by heat can be suppressed.

Figure 19B:
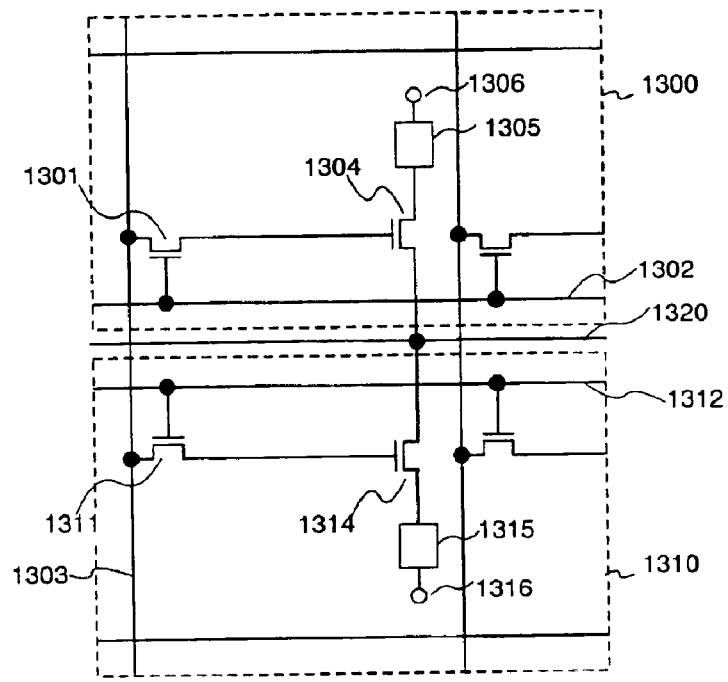

Next, FIG. 19B shows another example of a circuit diagram of a pixel according to the present invention. In FIG. 19B, the pixel 1300 and the pixel 1310 are provided adjacent to each other. In FIG. 19B, reference numerals 1301 and 1311 denote the switching TFTs. Note that, in the present invention, as the switching TFT 1301 and 1311, either the n-channel type TFT or the p-channel type TFT can be used. In FIG. 19B, the n-channel type TFT is used as the switching TFT 1301 and 1311. The gate electrodes of the switching TFTs 1301 and the 1311 are connected to the gate signal lines 1302 and 1312 for inputting the gate signal respectively. One of the source region and the drain region of the switching TFT 1301 and 1311 is connected to the data signal line 1303 (also referred to as a source signal line) for inputting an analog or digital video signal, while the other is connected to the gate electrode of the EL driving TFTs 1304 and 1314 respectively.

Then, one of the source region and the drain region of the EL driving TFTs 1304 and 1314 is connected to the power source supply line 1320, while the other is connected to the EL elements 1305 and 1315 respectively. In this manner, in Embodiment 7, two adjacent pixels share one power source supply line 1320. As a consequence, as compared with the structure shown in FIGS. 17A to 18B, the number of power supply lines can be decreased. When the ratio of the wiring with respect to the whole pixel portion is small, the light shielding by the wiring can be suppressed in the case where the wiring is provided in a direction of light emission of the EL layer. Then, in a circuit diagram shown in FIG. 20B, the power supply line 1320 is provided in parallel with the gate signal lines 1302 and 1312.

The EL elements 1305 and 1315 comprise an anode, a cathode, and an EL layer provided between the anode and the cathode respectively. Note that, according to the present invention, in the case where the anode is the pixel electrode and the cathode is an opposite electrode, either the source region or the drain region of the EL driving TFTs 1304 and 1314 is connected to the anodes of the EL elements 1305 and 1315. On the contrary, in the case where the anode is the opposite electrode and the cathode is the pixel electrode, either the source region or the drain region of the EL driving TFTs 1304 and 1314 is connected to the cathodes of the EL elements 1305 and 1315. Note that, as the EL driving TFTs 1304 and 1314, either the n-channel type TFT or the p-channel type TFT may be used. However, in the case where the anodes of the EL elements 1305 and 1315 are pixel electrodes and the cathodes thereof are opposite electrodes, it is preferable that the EL driving TFT 1304 and 1314 are p-channel type TFTs. Besides, on the contrary, in the case where the anodes of the EL elements 1305 and 1315 are opposite electrodes and the cathodes thereof are pixel electrodes, it is preferable that the EL driving TFTs 1304 and 1314 are n-channel type TFTs. In FIG. 19B, the p-channel type TFTs are used as the EL driving TFTs 1304 and 1314, so that the cathodes of the EL elements 1305 and 1315 are connected to the stationary power sources 1306 and 1316.

Furthermore, an LDD region is provided in the active layers of the EL driving TFTs 1304 and 1314, so that a region (the Lov region) may be formed wherein the LDD region and the gate electrode are overlapped via the gate insulating film. In the case where the EL driving TFTs 1304 and 1314 are particularly the n-channel type TFTs, the on current can be increased by forming a Lov region on the side of the drain region of the active layers. Besides, a capacity can be formed between the gate electrodes of the EL driving TFT 1304 and 1314 and the Lov region.

Furthermore, when the switching TFT 1301 and 1311 are set in the non-selection state (off-state), a capacitor may be provided for holding the gate voltage of the EL driving, TFTs 1304 and 1314. In the case where the capacitor is provided, the capacitor is connected between the side of the source region and the drain region which is connected to the source signal line, and the power source supply line 1320.

Figure 20B:
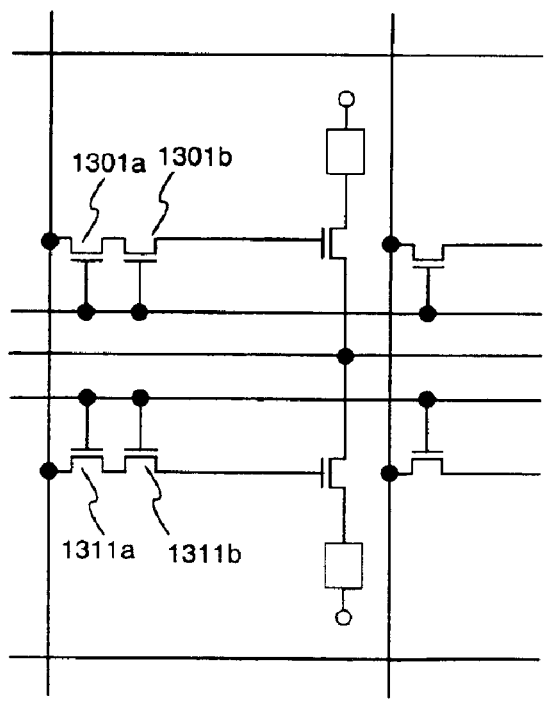

Note that, in a circuit diagram shown in FIG. 19B, the switching TFTs 1301 and 1311 or the EL driving TFTs 1304 and 1314 may be formed into a multi-gate structure. FIG. 20B shows a circuit diagram of a pixel in which the switching TFTs 1301 and 1311 of a pixel shown in FIG. 19B are formed into a multi-gate structure.

The switching TFT 1301a and the switching TFTs 1301b are connected in series to be provided. Furthermore, the switching TFTs 1311a and 1311b are connected in series to be provided. Except for the switching TFTs 1301a and 1311b and the switching TFTs 1311a and 1311b, the structure is the same as the circuit diagram shown in FIG. 19B. The off current can be decreased by forming the switching TFTs in the multi-gate structure. Note that, in FIG. 20B, the double-gate structure is adopted. But Embodiment 7 is not restricted to the double-gate structure. Any multi-gate structure may be used.

Besides, though not shown, in the case where the EL driving TFT is formed into the multi-gate structure, the deterioration of the EL driving TFTs by heat can be suppressed.

Note that, in Embodiment 7, a resistor may be provided between the pixel electrodes the drain region of the EL driving TFT and the EL element have. By providing the resistor, the quantity of current supplied from the EL driving TFT to the EL element is controlled so that the influence of the characteristic of the EL driving TFT on the disparity may be prevented. The resistor may be an element showing a resistance value sufficiently larger than the on resistance of the EL driving TFT. Therefore, the structure or the like is not restricted. Note that, the on resistance is a value obtained by dividing the drain voltage of the TFT with the drain current which flows at that time when the TFT is turned on. As a resistance value of the resistor, any in the scope of 1 k$\Omega$ through 50 M$\Omega$ (preferably, 10 k$\Omega$ through 10 M$\Omega$, or more preferably 50 k$\Omega$ through 1 M$\Omega$) may be selected When a semiconductor layer having a high resistance value as a resistor is used, the formation is easy and preferable.

The structure shown in Embodiment 7 can be put into practice in a free combination with Embodiments 1, 3, 4, 5 or 6.

[Embodiment 8]

This invention can be operated not limited to organic EL material, but using inorganic EL materials. Since the inorganic EL material of the present time is of a very high driving voltage, TFTs to be used must have resisting-pressure characteristics resistible to such a driving voltage.

If an inorganic EL material of an even lower driving voltage is developed in the future, it will be applicable to the present invention.

The structure of this embodiment can be freely combined with any one of the structures of Embodiments 1 through 7.

[Embodiment 9]

In the present invention, an organic material used as an EL layer may be either a low molecular organic material or a polymer (high molecular) organic material. As the low molecular organic material, materials are known centering on Alq$_3$ (tris-8-quinolylite-aluminum), TPD (triphenylamine derivative) or the like. As polymer organic material, O-cooperative polymer materials can be given. Typically, PPV (polyphenylenevynilene), PVK(polyvynilcarbazole), polycarbonate or the like can be given.

The polymer (high molecular) organic material can be formed with a simple thin film formation method such as the spin coating method (which is referred to also as solution application method), the dispense method, the printing method, the ink jet method or the like. The polymer organic material has a high heat endurance compared with the low molecular organic material.

Furthermore, in the case where the EL layer incorporated in the EL element incorporated in the EL display according to the present invention has an electron transport layer and a positive hole transport layer, the electron transport layer and the positive hole transport layer may be formed of inorganic material such as, for example, a non-crystal semiconductor formed of non-crystal Si or non-crystal Si$_{1-x}$C$_x$ or the like.

In the non-crystal semiconductor, a large quantity of trap level is present, and at the same time, the non-crystal semiconductor forms a large quantity of interface levels at an interface at which the non-crystal semiconductor contacts other layers. As a consequence, the EL element can emit light at a low voltage, and at the same time, an attempt can be made to provide a high luminance.

Besides, a dopant (impurity) is added to the organic EL layer, and the color of light emission of the organic EL layer may be changed. These dopant includes DCM1, nile red, lubren, coumarin 6, TPB and quinaquelidon.

Besides, the structure of Embodiment 9 may be combined freely with any of the structures in Embodiments 1 through 7.

[Embodiment 10]

Next, there will be explained another method for driving the EL display according to the present invention shown in FIGS. 1 to 2B. Here, there will be explained a case in which $2^n$ gray scale full color display is provided with the n-bit digital driving method. Note that, the timing chart is the same as the case shown in the embodiments. FIG. 3 will be referred to.

In the pixel portion 101, a plurality of pixels 104 are arranged in a matrix-like configuration. FIG. 2A is an enlarged view of the pixels 104. In FIG. 2A, reference numeral 105 denotes a switching TFT. The gate electrode of the switching TFT is connected to the gate signal line 106 for inputting the gate signal. One of the source region and the drain region of the switching TFT 105 is connected to the source signal line 107 for inputting the digital data signal while the other is connected to the gate electrode of the EL driving TFT 108 and a capacitor 113 incorporated in each pixel respectively.

Besides, one of the source region and the drain region of the EL driving TFT 108 is connected to the power source supply line 111 while the other is connected to the EL element 110. The power source supply line 111 is connected to the capacitor 113. When the switching TFT 105 is set in the non-selection state (off state), the capacitor 113 is provided for holding the gate voltage of the EL driving TFT 108.

The EL element 110 comprises an anode, a cathode, and an EL layer provided between the anode and the cathode. In the case where the anode is connected to the source region or the drain region of the EL driving TFT 110, in other words, in the case where the anode is a pixel electrode, the cathode, which is an opposite electrode is held at a constant potential. On the contrary, in the case where the cathode is connected to the source region or the drain region of the EL driving TFT 110, in other words, in the case where the cathode is a, pixel electrode, the anode, which is the opposite electrode 112 is held at a constant potential.

The power source supply line 111 is held at a power source potential.

Note that, a resistor may be provided between the drain region or the source region of the EL driving TFT 108 and the EL element 110. By providing the resistor, the quantity of current which is supplied from the EL driving TFT to the EL element is controlled with the result that the influence of the disparity of the characteristic of the EL driving TFT can be prevented. No restriction is placed on the structure or the like because an element may be used that which shows a resistance value which is sufficiently larger than the on resistance of the EL driving TFT 108. Note that, the on resistance refers to a value obtained by dividing the drain voltage of the TFT with the drain current which flows at that time when the TFT is in an on state. A resistance value of the resistor may be selected from the scope of 1 kΩ through 50 MΩ (preferably 10 kΩ through 10 MΩ, and more preferably 50 kΩ through 1 MΩ). When a semiconductor layer having a high resistance value as a resistor, the formation is easy and preferable.

FIG. 2B shows a structure of a pixel portion of the EL display according to the present invention. The gate signal lines (G1 through Gn) are connected to the gate electrode of the switching TFT incorporated in each pixel. One of the source region and the drain region of switching TFT incorporated in each pixel is connected to the source signal lines (S1 through Sn) while the other is connected to the gate electrode of the EL driving TFT and the capacitor. Besides, one of the drain region and the source region of the EL driving TFT is connected to the power source supply lines (V1 through Vn) while the other is connected to the EL element incorporated in each pixel. The power source supply lines (V1 through Vn) are also connected to the capacitor incorporated in each pixel.

FIG. 3 shows a timing chart in the EL display shown in FIG. 2A. In the beginning, one frame period (F) is divided into n sub-frame periods (SF1 through SFn). Note that, the period in which all the pixels in a pixel portion display one image is referred to as one frame period. In the EL display according to the present invention, 120 or more frame periods are provided in one second. As a consequence, 60 or more images are displayed in one second.

When the number of images displayed in one second becomes 120 or smaller, flickering of images, such as a flicker or the like begins to become visually conspicuous.

Note that, a plurality of periods into which one frame period is further divided are referred to as sub-frame periods. With an increase in the number of gray scale levels the divided number of one frame period increases and the driver circuit must be driven at a high frequency.

One sub-frame period is divided into an address period (Ta) and a sustain period (Ts). The address period refers to time required for inputting data to all the pixels while the sustain period (referred to also as lighting period) refers to a period in which a display is provided in one sub-frame period.

The lengths of the address periods (Ta1 through Tan) incorporated in n sub-frame periods (SF1 through SFn) have are all the same. The sustain periods (Ts) which is incorporated in SF1 through SFn respectively are set to Ts1 through Tsn respectively.

The lengths of the sustain periods are set to be Ts1: Ts2: Ts3: . . . : Ts(n-1): Tsn=$2^0$: $2^{-1}$: $2^{-2}$: $2^{-(n-2)}$: $2^{-(n-1)}$. However, the order in which SF1 through SFn are allowed to appear may be any. A desired gray scale display can be given out of $2^n$ gray scale levels with a combination of these sustain periods.

In the beginning, in an address period, the power source supply lines (V1 through Vn) are held at the power source potential having the same height as the stationary potential. In this specification, the power source potential in the digital driving address period is referred to as off power source potential. Note that, the height of the off power source potential may be set to the same height of the stationary potential within the scope in which the EL element does not emit light. Note that, the EL driving voltage at this time is referred to as off EL driving voltage. Ideally, it is desired that the off EL driving voltage is 0 V, but may be set to a level at which the EL element does not emit light.

Then, the gate signal is input to the gate signal line G1, so that all the switching TFT having the gate electrode connected to the gate signal line G1 are all turned on.

In the state in which the switching TFT having the gate electrode connected to the gate signal line G1 is turned on, the digital data signal is input to the source signal lines (S1 through Sn) in order. The digital data signal has information of "0" or "1". This means that the digital data signal of "0" or "1" has a voltage of either Hi or Lo respectively. Then the digital data signals inputted to the source signal lines (S1 through Sn) are inputted to the gate electrode of the EL driving TFT via the switching TFT in the on state. Besides, the digital data signal is inputted to the capacitor and is held.

Next, the gate signal is inputted to the gate signal line G2, so that all the switching TFTs having the gate electrode connected to the gate signal line G2 are turned on. Then, in the state in which the switching TFTs having the gate electrode connected to the gate signal line G2 are turned on, the digital signal is inputted in order to the source signal lines (S1 through Sn). The digital data signal inputted to the source signal lines (S1 through Sn) is inputted to the gate electrode of the EL driving TFTs via the switching TFTs. Furthermore, the digital data signal is also inputted to the capacitor and is held.

The above operation is repeated, so that the digital data signal is inputted to all the pixels. The period until the digital signal is inputted to all the pixels is referred to as the address period.

At the same time as when the address period is completed, the sustain period begins. When the sustain period begins, the potential of the power supply lines (V1 through Vn) changes from the off power source potential to the on power source potential. In this specification, the power source potential in the digital driving sustain period is referred to as on power source potential. The on power source potential may be such that a potential difference is present with the stationary potential to such a degree that the EL element emits light. Note that, this potential difference is referred to as on EL driving voltage.

Then, the switching TFT is turned off, and the digital data signal held in the capacitor is inputted to the gate electrode of the EL driving TFT.

In Embodiment 10, in the case where the digital data signal has information of "0", the EL driving TFT is turned off, so that the pixel electrode of the EL element is held at the off power source potential. As a consequence, the EL element does not emit light, the element being incorporated in the pixel to which the digital data signal having information of "0" is applied.

On the contrary, when the EL element has information of "1", the EL driving TFT is turned on, and the pixel electrode of the EL element becomes on power source potential. As a consequence, the EL element emits light, the element being incorporated in the pixel to which the digital data signal having information of "1" is applied.

The period in which all the switching TFTs are turned off is a sustain period.

The period in which the EL element is allowed to emit light (the pixel is allowed to be lit) is any of the periods of Ts1 through Tsn. Here, a predetermined pixel is lit in the period of Tsn.

Next, the address period begins again, and the sustain period begins when the data signal is inputted to all the pixels. At this time, any of the periods Ts1 through Ts(n−1) becomes a sustain period. Here, a predetermined pixel is allowed to be lit in the period of Ts(n−1).

Hereinbelow, a similar operation is repeated with respect to the remaining n−2 sub-frames, so that the sustain periods are subsequently set to Ts(n−2), Ts(n−3). . . Ts1 and a predetermined pixel is lit in respective sub-frames.

When n sub-frame periods appear, it can be considered that one frame period is completed. At this time, the gray scale level of the pixel can be determined by summing the sustain period in which the pixel is lit, in other words, the length of the sustain period immediately after the address period in which the digital data signal having information of "1" is applied to the pixel. For example, in case of n=8, when the luminance is set to 100% in the case where the pixel emits light in all the sustain periods, the luminance of 75% can be represented in the case where the pixel emits light in Ts1 and Ts2. In the case where Ts3, Ts5 and Ts8 are selected, the luminance of 16% can be represented.

When one frame period is completed, the height of the on power source potential is changed so that the polarity of the on EL driving voltage becomes opposite which voltage is a difference between the stationary potential and the on power source potential during the next frame period. Then, the above operation is conducted which is the same as the previous frame period. However, the on EL driving voltage in this frame period has a polarity opposite to the polarity of the on EL driving voltage in the previous frame period, therefore all the EL elements do not emit light. In this specification, the frame period in which the EL element displays an image is referred to as a display frame period. Besides, on the contrary, the frame period in which no EL elements emit light and display images is referred to as non-display frame periods.

When the non-display frame period is completed, next another display frame period begins. The on EL driving voltage changes to a voltage having a polarity opposite to the on EL driving voltage in the non-display frame period.

The image is displayed by alternately repeating the display frame period and the non-display frame period. The present invention has the above structure with the result that the EL driving voltage having an opposite polarity is applied for each definite period to the EL layer incorporated in the EL element. Consequently, the deterioration of the voltage-current characteristic of the EL element is improved so that the life of the EL element can be prolonged as compared to the conventional driving method.

Furthermore, as has been described above, in the driving with the alternate current, in the case where the image is displayed for each of the frame periods, flickering is generated as a flicker to the eyes of observers.

Consequently, according to the present invention, the EL display is driven with alternate current at a frequency two or more times higher than the frequency at which no flicker is generated to the eyes of observers in the driving with the direct current. In other words, 120 or more frame periods are provided in one second, so that 60 or more images are displayed in one second. With the above structure, flickering in the driving with the alternate current is prevented.

The structure shown in Embodiment 10 can be put into practice in a free combination with Embodiments 2 through 9.

[Embodiment 11]

In the case where a time division gray scale display is provided in a digital style driving with the alternate current, the polarity of the on EL driving voltage changes to the opposite for each sub-frame period. In Embodiment 11, an example different from Embodiment 1 will be explained. Here, the case of $2^n$ gray scale full color time division gray scale display in the n-bit digital driving method will be explained. Since the timing chart is the same as the case shown in Embodiment 1, FIG. 5 will be referred to.

The structure of the pixel portion of the EL display in Embodiment 11 is the same as the structure shown in FIG.

2B. The gate signal lines (G1 through Gn) are connected to the gate electrode of the switching TFT incorporated in each pixel. One of the drain region and the source region of the switching TFT incorporated in each pixel is connected to the source signal lines (S1 through Sn) while the other is connected to the gate electrode of the EL driving TFT and the capacitor. Besides, one of the source region and the drain region of the EL driving TFT is connected to the power source supply lines (V1 through Vn) while the other is connected to the EL element incorporated in each pixel. The power supply lines (V1 through Vn) are also connected to the capacitor incorporated in each pixel.

FIG. 5 shows a timing chart of a driving method according to Embodiment 11. In the beginning, one frame period is divided into n sub-frame periods (SF1 through SFn). Note that, the period in which all the pixels in the pixel portion display one image is referred to as one frame period.

One sub-frame period is divided into an address period (Ta) and a sustain period (Ts). The address period refers to time required for inputting data into all the pixels, and the sustain period (also referred to as lighting period) refers to a period in which EL element emits light in one sub-frame period.

The length of the address periods (Ta1 through Tan) incorporated in n sub-frame periods (SF1 through SFn) respectively are all the same. The sustain periods (Ts) incorporated in the sub-frame periods SF1 through SFn respectively are set to Ts1 through Tsn respectively.

The lengths of the sustain periods are set to be Ts1: Ts2: Ts3: . . . : Ts(n−1): Tsn=$2^0$: $2^{-1}$: $2^{-2}$: . . . : $2^{-(n-2)}$: $2^{-(n-1)}$. However, the order in which SF1 through SFn are allowed to appear may be any. With the combination of this sustain period, a desired gray scale display can be provided out of $2^n$ gray scale levels.

In the beginning, the power source supply lines (V1 through Vn) can be held at the off power source potential. Then, the gate signal is input to the gate signal line G1, so that all the switching TFTs having the gate electrode connected to the gate signal line G1 are turned on.

Then, in the state in which the switching TFTs having the gate electrode connected to the gate signal line G1 are turned on, the digital data signal is inputted to the source signal lines (S1 through Sn) in order. Then, the digital data signals input to the source signal lines (S1 through Sn) are inputted to the gate electrode of the EL driving TFT via the switching TFT in the on state. Furthermore, the digital data signal is input to the capacitor and held.

The above operation is repeated so that the digital data signal is inputted to all the pixels. The period until the digital data signal is inputted to all the pixels is an address period.

At the same time when the address period is completed, the sustain period begins. When the sustain period begins, the potential of the power source supply lines (V1 through Vn) changes from the off power source potential to the on power source potential. Then, the switching TFT is turned off, so that the digital data signal held in the capacitor is input to the gate electrode of the EL driving TFT.

In Embodiment 11, the polarity of the on EL driving voltage which is a difference between the on power source potential and the stationary potential becomes opposite to each other for each sub-frame period when the height of the power source potential is changed. Consequently, the EL display repeats the display and the non-display by setting the polarity of the on EL driving voltage to the opposite for each of the sub-frame periods. The sub-frame period in which the display is provided is referred to as a display sub-frame period while the sub-frame period in which no display is provided is referred to as non-display sub-frame period.

For example, in the first frame period, when the first sub-frame period is a display period, the second sub-frame period is a non-display period. The third display period again becomes the display period. Then all the sub-frame periods appear again and the first frame period is completed, and the second frame period begins. In the first sub-frame period in the second frame period, the EL driving voltage having a polarity opposite to the polarity of the EL driving voltage applied to the EL element in the first sub-frame period of the first frame period is applied to the EL layer of the EL element so that the non-display period begins. Then, next the second sub-frame period becomes a display period with the result that the display period and the non-display period come alternately for each of the sub-frame periods.

Note that, in this specification, when the display period and the non-display period are changed over by setting the polarity of the EL driving voltage opposite, the period in which display is provided is referred to as a display period. Furthermore, on the contrary, the period in which no display is provided is referred to as a non-display period. Consequently, in this specification, the display frame period and the display sub-frame period are generally referred to as display periods. Besides, on the contrary, the non-display frame period and the non-display sub-frame period are generally referred to as non-display periods.

In Embodiment 11, in the case where the digital data signal has information of "0", the EL driving TFT is turned off, and the pixel electrode of the EL element is held at the off power source potential. As a consequence, the EL element does not emit light, the element being incorporated in the pixel to which the digital data signal having information of "0" is applied.

On the contrary, in the case where the digital data signal has information of "1", the EL driving TFT is turned on, so that the pixel electrode of the EL element becomes on power source potential. As a consequence, the EL element emits light, the element being incorporated in the pixel to which the digital data signal having information of. "1" is applied.

The period in which all the switching TFTs are turned off is the sustain period.

The period in which the EL element is allowed to emit light is any of the periods Ts1 through Tsn. Here, a predetermined pixel is lit in the period of Tsn.

Next, the address period begins again, and then the sustain period begins upon the input of the data signal to all the pixels. At this time, any of the periods Ts1 through Ts(n−1) becomes the sustain period. Here, a predetermined pixel is lit in the period of Ts(n−1).

Hereinafter, the similar operation is repeated with respect to the remaining n−2 sub-frames. Subsequently, the sustain periods are set as Ts(n−2), Ts(n−3) . . . Ts1 and a predetermined pixel is lit in respective sub-frames.

In this manner, in the case where the EL driving voltage having the opposite polarity for each of the sub-frames is applied to the EL element in the time division gray scale display in the driving with the alternate current, one gray scale display is provided in two frame periods. In two adjacent frame periods, the gray scale level of the pixel can be determined by summing the sustain period in which the pixel is lit, namely the length of the sustain periods immediately after the address period in which the digital data signal having information of "1" is inputted to the pixel. For example, in case of n=8, when the luminance is set to 100% in the case where the pixel emits light in all the sustain periods, the luminance of 75% can be represented in the case where the pixel emits light in Ts1 and Ts2. In the case where Ts3, Ts5 and Ts8 are selected, the luminance of 16% can be represented.

The present invention has the structure described above, so that the EL driving voltage having the opposite polarity for each of the sub-frame periods is applied to the EL layer incorporated in the EL element. Consequently, the deterioration of the current-voltage characteristic of the EL element is improved with the result that the life of the EL element can be prolonged as compared with the conventional driving method.

In Embodiment 11, there is obtained an effect in that a flicker occurs with difficulty as compared with the digital style EL display which is driven with the alternate current for each of the frame periods shown in the embodiment.

The structure shown in Embodiment 11 can be put into practice in a free combination with Embodiments 2 through 9.

[Embodiment 12]

The EL display device (EL module) formed by performing the present invention is superior to a liquid crystal display device in visibility in bright places because of its self-luminous properties. Therefore, the present invention can be used as a display portion of a direct-view type EL display (indicating a display equipped with an EL module). As the EL display, there are a personal computer monitor, a TV receiving monitor, an advertisement display monitor, and so on.

The present invention can be operated to all electronic equipment that includes displays as constituent parts, including the aforementioned EL display.

As the electronic equipment, there are an EL display, video camera, digital camera, head mounted type display, car-navigator, personal computer, portable information terminal (mobile computer, mobile phone, electronic book, etc.), and picture reproducer provided with recording media (specifically, device which can reproduce a recording medium and equip a display capable of displaying the image such as compact disk (CD), laser disc (LD), or digital video disc (DVD)). Examples of the electronic equipment are shown in FIGS. 14A to 14E.

FIG. 14A depicts a personal computer, which includes a main body 2001, case 2002, EL display portion 2003, and keyboard 2004. The EL display 2003 of the present invention can be used for the display portion of personal computer.

FIG. 14B depicts a video camera, which includes a main body 2101, EL display device 2102, voice inputting portion 2103, operation switch 2104, battery 2105, and image reception portion 2106. The present invention can be used as the display device 2102.

FIG. 14C depicts a part of a head mounted type EL display (right side), which includes a main body 2301, signal cable 2302, head fixation band 2303, display monitor 2304, optical system 2305, and EL display 2306. The EL display 2306 of the present invention can be used as a display potion of EL display device.

FIG. 14D depicts a picture reproducer (specifically, DVD reproducing player) provided with recording media, which includes a main body 2401, recording medium 2402 (CD, LD, DVD, etc.), operation switch 2403, EL display device (a) 2404, and EL display panel (b) 2405. The EL display device (a) chiefly displays image information, and the EL display device (b) chiefly displays character information. The EL display device (a) and (b) of the present invention can be used as a display portion of provided with a picture reproducer provided with recording media. The present invention is applicable to a CD player or a game machine as a picture reproducer provided with recording media.

FIG. 14E depicts a portable (mobile) computer, which includes a main body 2501, camera 2502, image reception part 2503, operation switch 2504, and EL display 2505. The EL display 2505 of the present invention can be used as a display portion of the mobile computer.

If the luminescence brightness of the EL material is enhanced in the future, the present invention will be applicable to a front or rear type projector.

The present invention has a quite wide scope of application, as mentioned above, and is applicable to electronic equipment in all fields. The electronic equipment of this embodiment can be realized by the using any structure resulting from the free combination of embodiments 1 to 11.

The structure described above allows the EL driving voltage having an opposite polarity to be applied to the EL element for each of the definite periods. Accordingly, the deterioration of the current-voltage characteristic of the EL element is improved, and the life of the EL element may be prolonged as compared with the conventional driving method.

Furthermore, as described above, in the case where the image is displayed for each one of the frame periods in the driving with the alternate current, flickering is generated as a flicker to the eyes of observers.

Consequently, in the present invention, it is preferable that the EL display is driven with the alternate current at a frequency two times or more than the frequency at which no flicker is generated to the eyes of observers in the driving with the direct current. In other words, it is preferable that images are displayed at a frequency of 120 Hz or more. With the above structure, a flicker resulting from the driving with the alternate current can be prevented.

What is claimed is:

1. An active matrix-type display device comprising a plurality of pixels, said device including a plurality of EL elements, a plurality of EL driving TFTs for controlling light emission of said plurality of EL elements, a plurality of switching TFTs for controlling a driving of said plurality of EL driving TFTs, wherein:

said active matrix-type display device comprises a driver circuit comprising a plurality of first thin film transistors over a substrate for the switching TFT;

said active matrix-type display device comprises a time division gray-scale data signal generating circuit comprising a plurality of second thin film transistors over the substrate for dividing one frame period into a plurality of sub-frame periods;

said active matrix-type display device provides a gray scale display by controlling a period of time at which said plurality of EL elements emit light in one frame period;

said plurality of EL elements comprise a first electrode and a second electrode; and a potential of said first or said second electrode changes in such a manner that a polarity of an EL driving voltage is inverted for each one frame period, wherein said EL driving voltage is a difference between said potentials applied to said first and said second electrodes.

2. An active matrix-type display device according to claim 1, wherein said EL driving TFT and said switching TFT comprise an n-channel type TFT or a p-channel type TFT.

3. An active matrix-type display device according to claim 1, wherein said light emission of said plurality of EL elements is controlled with said digital data signal input to said switching TFT.

4. An active matrix-type display device according to claim 1, wherein said one frame period is $1/120$ s or less.

5. An active matrix-type display device according to claim 1, wherein said active matrix-type display device is incorporated in one selected from the group consisting of a video camera, a digital camera, a head-mount display, a car navigation system, a personal computer, and a DVD player.

6. An active matrix-type display device comprising a plurality of pixels, said device including a plurality of EL elements, a plurality of EL driving TFTs for controlling light emission of said plurality of EL elements, a plurality of switching TFT for controlling driving of said plurality of EL driving TFT, wherein:
said active matrix-type display device comprises a driver circuit comprising a plurality of first thin film transistors over a substrate for the switching TFT;
said active matrix-type display device comprises a time division gray-scale data signal generating circuit comprising a plurality of second thin film transistors over the substrate for dividing one frame period into a plurality of sub-frame periods;
said active matrix-type display device provides a gray scale display by controlling a period of time at which said plurality of EL elements emit light in one frame period;
said plurality of EL elements comprise a first electrode and a second electrode; and
a potential of said first or said second electrode changes in such a manner that a polarity of an EL driving voltage is inverted for each one frame period; and
a power source supply line for supplying a voltage applied to said second electrode is shared among adjacent pixels of said plurality of pixels,
wherein said EL driving voltage is a difference between said potentials applied to said first and said second electrodes.

7. An active matrix-type display device according to claim 6, wherein said light emission of said plurality of EL elements is controlled with said digital data signal input to said switching TFT.

8. An active matrix-type display device according to claim 6, wherein said one frame period is $1/120$ s or less.

9. An active matrix-type display device according to claim 6, wherein said active matrix-type display device is incorporated in one selected from the group consisting of a video camera, a digital camera, a head-mount display, a car navigation system, a personal computer, and a DVD player.

10. An active matrix-type display device comprising:
an EL driving thin film transistor over a substrate;
a switching thin film transistor over the substrate;
an EL element comprising a first electrode, an organic EL material over the first electrode, and a second electrode over the organic EL material, wherein the EL element is electrically connected to the EL driving thin film transistor;
a driver circuit comprising a plurality of first thin film transistors over the substrate for driving the switching thin film transistor; and
a time division gray-scale data signal generating circuit comprising a plurality of second thin film transistors over the substrate for dividing one frame period into a plurality of sub-frame periods,
wherein a gray scale display is provided by controlling a period of time at which the EL element emits light in the one frame period,
wherein a potential of the first or the second electrode changes in such a manner that a polarity of an EL driving voltage is inverted for each one frame period, and
wherein the EL driving voltage is a difference between the potentials applied to the first and the second electrodes.

11. An active matrix-type display device according to claim 10, wherein the one frame period is $1/120$ s or less.

12. An active matrix-type display device according to claim 10, wherein the organic EL material comprises a low molecular organic material selected from the group consisting of $Alq_3$ (tris-8-quinolylite-aluminum), and TPD (triphenylamine derivative).

13. An active matrix-type display device according to claim 10, wherein the organic EL material comprises a polymer organic material selected from the group consisting of PPV (polyphenylenevynilene), PVK (polyvynilcaracole), and polycarbonate.

14. An active matrix-type display device according to claim 10, wherein the first electrode is an anode and the second electrode is a cathode.

15. An active matrix-type display device according to claim 10, wherein the first electrode is a cathode and the second electrode is an anode.

16. An active matrix-type display device according to claim 10, wherein the active matrix type display device is incorporated in at least one selected from the group consisting of a personal computer, a video camera, a head mount display, a DVD player, a mobile computer, a digital camera, a mobile phone, and an electronic book.

17. An active matrix-type display device comprising:
an EL driving thin film transistor over a substrate;
a switching thin film transistor over the substrate;
an EL element comprising a first electrode, an organic EL material over the first electrode, and a second electrode over the organic EL material, wherein the EL element is electrically connected to the EL driving thin film transistor;
a driver circuit comprising a plurality of first thin film transistors over the substrate for the switching thin film transistor, and
a time division gray-scale data signal generating circuit comprising a plurality of second thin film transistors over the substrate for dividing one frame period into a plurality of sub-frame periods,
wherein a gray scale display is provided by controlling a period of time at which the EL element emits light in the one frame period,
wherein a potential of the second electrode is held constant and a potential of the first electrode changes in such a manner that a polarity of an EL driving voltage is inverted for each one frame period, and
wherein the EL driving voltage is a difference between the potentials applied to the first and the second electrodes.

18. An active matrix-type display device according to claim 17, wherein the one frame period is $1/120$ s or less.

19. An active matrix-type display device according to claim 17, wherein the organic EL material comprises a low molecular organic material selected from the group consisting of $Alq_3$ (tris-8-quinolylite-aluminum), and TPD (triphenylamine derivative).

20. An active matrix-type display device according to claim 17, wherein the organic EL material comprises a polymer organic material selected from the group consisting of PPV (polyphenylenevynilene), PVK (polyvynilcaracole), and polycarbonate.

21. An active matrix-type display device according to claim 17, wherein the first electrode is an anode and the second electrode is a cathode.

22. An active matrix-type display device according to claim 17, wherein the first electrode is a cathode and the second electrode is an anode.

23. An active matrix-type display device according to claim 17, wherein the active matrix type display device is incorporated in at least one selected from the group consisting of a personal computer, a video camera, a head mount display, a DVD player, a mobile computer, a digital camera, a mobile phone, and an electronic book.

24. An active matrix-type display device comprising:
an EL driving thin film transistor over a substrate;
a switching thin film transistor over the substrate;
a first insulating film comprising a resin material over the EL driving thin film transistor and the switching thin film transistor;
a second insulating film on a portion of the first insulating film;
an EL element comprising a first electrode formed on the first insulating film, an organic EL material over the first electrode, and a second electrode over the organic EL material, wherein the EL element is electrically connected to the EL driving thin film transistor;
a driver circuit comprising a plurality of first thin film transistors over the substrate for the switching thin film transistor; and
a time division gray-scale data signal generating circuit comprising a plurality of second thin film transistors over the substrate for dividing one frame period into a plurality of sub-frame periods,
wherein a gray scale display is provided by controlling a period of time at which the EL element emits light in the one frame period,
wherein a potential of the first or the second electrode changes in such a manner that a polarity of an EL driving voltage is inverted for each one frame period, and
wherein the EL driving voltage is a difference between the potentials applied to the first and the second electrodes.

25. An active matrix-type display device according to claim 24, wherein the one frame period is $1/120$ s or less.

26. An active matrix-type display device according to claim 24, wherein the organic EL material comprises a low molecular organic material selected from the group consisting of $Alq_3$ (tris-8-quinolylite-aluminum), and TPD (triphenylamine derivative).

27. An active matrix-type display device according to claim 24, wherein the organic EL material comprises a polymer organic material selected from the group consisting of PPV (polyphenylenevynilene), PVK (polyvynil caracole), and polycarbonate.

28. An active matrix-type display device according to claim 24, wherein the first insulating film comprises one selected from the group consisting of polyimide, polyamide, acrylic resin, and BCB (benzocyclobutene).

29. An active matrix-type display device according to claim 24, wherein the second insulating film comprises one selected from the group consisting of silicon oxide, silicon nitride oxide, and an organic resin.

30. An active matrix-type display device according to claim 24, wherein the first electrode is an anode and the second electrode is a cathode.

31. An active matrix-type display device according to claim 24, wherein the first electrode is a cathode and the second electrode is an anode.

32. An active matrix-type display device according to claim 24, wherein the active matrix type display device is incorporated in at least one selected from the group consisting of a personal computer, a video camera, a head mount display, a DVD player, a mobile computer, a digital camera, a mobile phone, and an electronic book.

* * * * *